(12) United States Patent
Nagaosa et al.

(10) Patent No.: US 10,003,010 B2
(45) Date of Patent: Jun. 19, 2018

(54) MAGNETIC ELEMENT, SKYRMION MEMORY, SKYRMION MEMORY DEVICE, SKYRMION-MEMORY EMBEDDED SOLID-STATE ELECTRONIC DEVICE, DATA STORAGE APPARATUS, DATA PROCESSING AND COMMUNICATION APPARATUS

(71) Applicant: RIKEN, Saitama (JP)

(72) Inventors: Naoto Nagaosa, Tokyo (JP); Wataru Koshibae, Saitama (JP); Junichi Iwasaki, Tokyo (JP); Masashi Kawasaki, Tokyo (JP); Yoshinori Tokura, Tokyo (JP); Yoshio Kaneko, Chiba (JP)

(73) Assignee: RIKEN, Saitama (JP)

( * ) Notice: Subject to any disclaimer, the term of this patent is extended or adjusted under 35 U.S.C. 154(b) by 0 days. days.

(21) Appl. No.: 15/448,612

(22) Filed: Mar. 3, 2017

(65) Prior Publication Data
US 2017/0179375 A1 Jun. 22, 2017

Related U.S. Application Data

(63) Continuation of application No. PCT/JP2015/074735, filed on Aug. 31, 2015.

(30) Foreign Application Priority Data

Sep. 4, 2014 (JP) .................. 2014-180686

(51) Int. Cl.
*G11C 11/14* (2006.01)
*H01L 43/02* (2006.01)
(Continued)

(52) U.S. Cl.
CPC .............. *H01L 43/02* (2013.01); *G11C 11/14* (2013.01); *G11C 11/1673* (2013.01);
(Continued)

(58) Field of Classification Search
CPC ... G11C 19/08; G11C 19/085; G11C 19/0866; G11C 19/0808; G11C 11/14
See application file for complete search history.

(56) References Cited

U.S. PATENT DOCUMENTS 6,834,005 B1 12/2004 Parkin

FOREIGN PATENT DOCUMENTS

JP 2014-86470 A 5/2014

OTHER PUBLICATIONS

Fert, Albert, et al. "Skyrmions on the Track." Nature Nanotechnology, vol. 8, No. 3, Mar. 2013, pp. 152-156.*
(Continued)

*Primary Examiner* — Huan Hoang
*Assistant Examiner* — Jay Radke

(57) ABSTRACT

Provided is a magnetic element capable of generating one skyrmion and erasing the one skyrmion. The magnetic element includes a magnet shaped like a substantially rectangular flat plate, an upstream electrode connected to the magnet in a width Wm direction of the magnet and made of a non-magnetic metal, a downstream electrode connected to the magnet in the width Wm direction to oppose the upstream electrode and made of a non-magnetic metal, and a skyrmion sensor configured to detect the skyrmion. Here, a width Wm of the substantially rectangular magnet is such that 3·λ>Wm≥λ, where λ denotes a diameter of the skyrmion, a length Hm of the substantially rectangular magnet is such that 2·λ>Hm≥λ, and the magnet has a notch structure at the edge between the upstream electrode and the downstream electrode.

20 Claims, 50 Drawing Sheets

(51) Int. Cl.
*H01F 7/20* (2006.01)
*H01F 10/32* (2006.01)
*H01L 43/08* (2006.01)
*H01L 27/22* (2006.01)
*G11C 11/16* (2006.01)
*G11C 19/08* (2006.01)

(52) U.S. Cl.
CPC .......... *G11C 11/1675* (2013.01); *G11C 19/08* (2013.01); *G11C 19/085* (2013.01); *G11C 19/0808* (2013.01); *G11C 19/0866* (2013.01); *H01F 7/20* (2013.01); *H01F 10/3254* (2013.01); *H01L 27/222* (2013.01); *H01L 43/08* (2013.01)

(56) References Cited

OTHER PUBLICATIONS

Naoto Nagaosa et al, "Topological properties and dynamics of magnetic skyrmions", Nature Nanotechnology, vol. 8, Dec. 2013, pp. 899-911.
Junichi Iwasaki et al, "Current-induced skyrmion dynamics in constricted geometries", Nature Nanotechnology, vol. 8, Sep. 2013, pp. 742-747.

\* cited by examiner

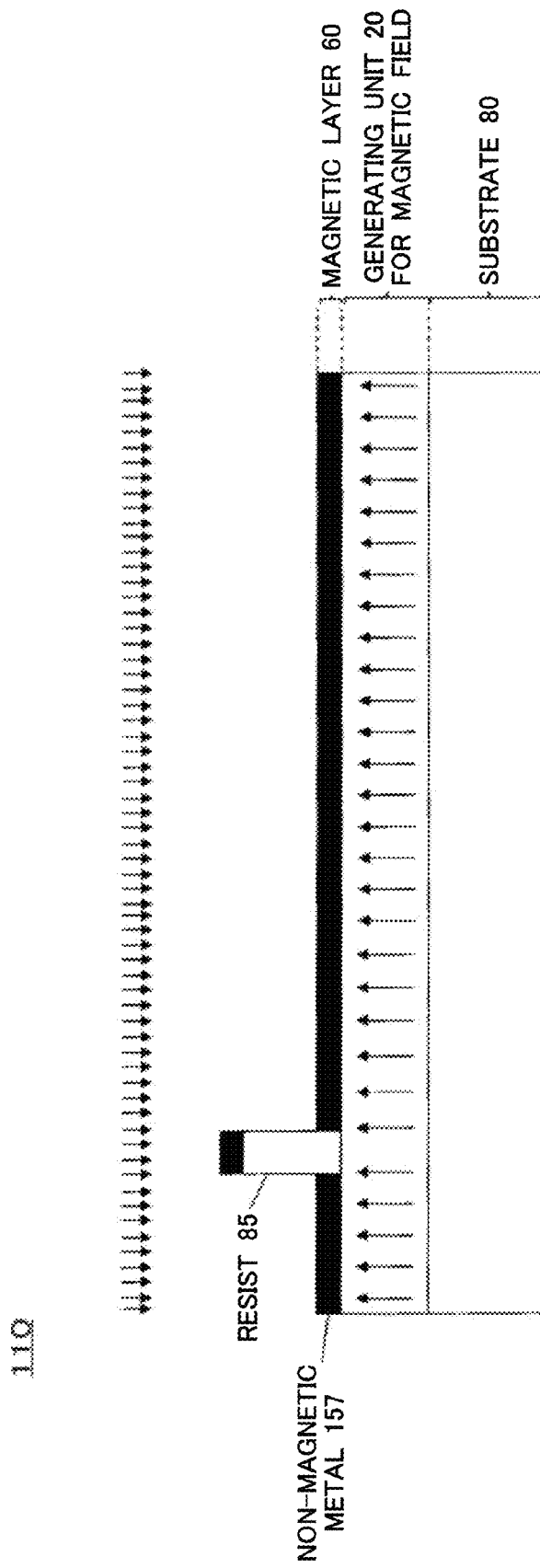

MAGNETIC ELEMENT, SKYRMION MEMORY, SKYRMION MEMORY DEVICE, SKYRMION-MEMORY EMBEDDED SOLID-STATE ELECTRONIC DEVICE, DATA STORAGE APPARATUS, DATA PROCESSING AND COMMUNICATION APPARATUS

The contents of the following Japanese patent applications are incorporated herein by reference:
NO. 2014-180686 filed in JP on Sep. 4, 2014, and
NO. PCT/JP2015/074735 filed on Aug. 31, 2015.

BACKGROUND

1. Technical Field

The present invention relates to a magnetic element that is capable of generating only one skyrmion and erasing the generated one skyrmion, a skyrmion memory using the magnetic element, a skyrmion memory device using the magnetic element, a skyrmion-memory embedded solid-state electronic device, a data storage apparatus having a skyrmion memory embedded therein, a data processing apparatus having a skyrmion memory embedded therein, and a communication apparatus having a skyrmion memory embedded therein.

2. Related Art

A known magnetic element uses the magnetic moments of a magnet as digital information. The magnetic element has a nanoscale magnetic texture serving as a component of a non-volatile memory, which does not require electric power to maintain stored information. The magnetic element is expected to be used as a high-capacity information storage medium due to its advantages such as a very high density achieved by the nanoscale magnetic texture and becomes increasingly important as a memory device used in an electronic device.

As possible next-generation magnetic memory devices, magnetic shift registers are proposed mainly by IBM United States. Magnetic shift registers drive magnetic domain walls and transfer the configuration of the magnetic moments of the magnetic domain walls using currents to read stored information (see U.S. Pat. No. 6,834,005).

FIG. 28 is a schematic view showing the principle of how to drive magnetic domain walls using currents. The magnetic domain wall means the boundary between the magnetic regions having magnetic moments of opposing orientations. FIG. 28 uses the solid lines to show the magnetic domain walls in a magnetic shift register 1. By supplying currents flowing in the direction shown by the arrows to the magnetic shift register 1, the magnetic domain walls are driven. As a result of the movement of the magnetic domain walls, a magnetic change is caused according to the orientations of the magnetic moments positioned above a magnetic sensor 2. The magnetic change is detected by the magnetic sensor 2, which retrieves magnetic information.

The above-described magnetic shift register 1, however, requires large currents to move the magnetic domain walls. Another drawback of the above-described magnetic shift register 1 is a low transfer speed achieved by the magnetic domain walls. Accordingly, the magnetic shift register 1 suffers from slow memory writing and erasing.

In light of the above, the inventors of the present invention proposed a skyrmion sensor using as memory units skyrmions generated within magnets (see Japanese Patent Application Publication No. 2014-86470). By making such proposals, the inventors of the present invention disclosed that skyrmions can be driven by currents.

A skyrmion has an extremely small magnetic texture with a diameter of 1 nm to 500 nm and can maintain the structure for a long time. For these reasons, it is highly expected to use skyrmions as memory elements. The fundamental physical properties of skyrmions are increasingly known (see, Naoto NAGAOSA and Yoshinori TOKURA, "Topological properties and dynamics of magnetic skyrmions," Nature Nanotechnology, United Kingdom, Nature Publishing Group, Dec. 4, 2013, Vol. 8, p 899-911). Here, Junichi IWASAKI, Masahito MOCHIZUKI, and Naoto NAGAOSA, "Current-induced skyrmion dynamics in constricted geometries," Nature Nanotechnology, United Kingdom, Nature Publishing Group, Sep. 8, 2013, Vol. 8, p 742-747 reports that inventions are actually made by using skyrmions as memories. Iwasaki et al. discloses an invention directed to how to generate and erase skyrmions. However, the methods of generating and erasing skyrmions disclosed in Iwasaki et al. use steady-state currents. When steady-state currents is employed, a large number of skyrmions are generated. It has yet not been discovered how to use the continuously generated skyrmions as memory bits. If skyrmions are used as memories with steady-state currents, the power consumption significantly increase. Power is also required to maintain skyrmions as memories, which makes it impossible to practically use skyrmions as non-volatile memory. The above are the serious problems to be solved. In addition, the method of manufacturing a skyrmion memory is not disclosed. Furthermore, no circuits are disclosed. Thus, the above-mentioned documents do not disclose various technical issues that would arise to realize practical devices using skyrmions.

SUMMARY

A first aspect of the innovations herein provides a magnetic element capable of generating one skyrmion and erasing the one skyrmion. The magnetic element includes a magnet shaped like a substantially rectangular flat plate, an upstream electrode connected to the magnet in a width Wm direction of the magnet and made of a non-magnetic metal, a downstream electrode connected to the magnet in the width Wm direction to oppose the upstream electrode and made of a non-magnetic metal, and a skyrmion sensor configured to detect the skyrmion. Here, a width Wm of the substantially rectangular magnet is such that $3\cdot\lambda > Wm \geq \lambda$, where $\lambda$ denotes a diameter of the skyrmion, a length Hm of the substantially rectangular magnet is such that $2\cdot\lambda > Hm \geq \lambda$, and the magnet has a notch structure at an edge between the upstream electrode and the downstream electrode.

A second aspect of the innovations herein provides a skyrmion memory including the magnetic element according to the first aspect, a generating unit of magnetic field opposing the magnet and configured to apply magnetic field to the magnet, a current source connected to the upstream electrode and the downstream electrode and configured to apply pulse currents to the magnet between the upstream electrode and the downstream electrode to generate and erase one skyrmion, and a measuring unit connected to the skyrmion sensor and configured to read whether the skyrmion is present or absent using an element configured to detect whether one skyrmion is present or absent. Here, the presence or absence of one skyrmion is used to indicate whether "1" or "0" is stored in a memory bit.

The current source applies a pulse current flowing from the upstream electrode to the downstream electrode in order to generate one skyrmion in the magnet and applies a pulse current flowing from the downstream electrode to the upstream electrode, or in an opposite direction to the pulse current applied to generate the skyrmion in order to erase the generated one skyrmion in the magnet. In the skyrmion memory, a plurality of the magnetic elements may be stacked in a thickness direction.

A third aspect of the innovations herein provides a skyrmion memory device including a plurality of electric lines to generate a skyrmion connected to a plurality of magnetic elements, where each electric line to generate a skyrmion is configured to supply a pulse current to generate a skyrmion in a corresponding one of the magnetic elements, a plurality of electric lines to erase a skyrmion connected to the magnetic elements, where each electric line to erase a skyrmion is configured to supply a pulse current to erase a skyrmion generated in a corresponding one of the magnetic elements, a plurality of word lines to sense a skyrmion connected to the magnetic elements, where each word line to sense a skyrmion is configured to transmit a voltage or current determined by whether a skyrmion is present or absent in a corresponding one of the magnetic elements, a plurality of switches provided in the electric lines to generate a skyrmion, the electric lines to erase a skyrmion and the word lines to sense a skyrmion, where the switches are configured to select one of the magnetic elements, and a circuit configured to read whether the skyrmion is present or absent in the magnetic element selected by the switches, based on a voltage or current flowing through a corresponding one of the word lines to sense a skyrmion.

A fourth aspect of the innovations herein provides a skyrmion memory device including a substrate, a semiconductor element formed on the substrate, and at least one magnetic element according to the first aspect, stacked on the semiconductor element.

A fifth aspect of the innovations herein provides a skyrmion-memory embedded solid-state electronic device including in the same chip one of the skyrmion memory and skyrmion memory devices relating to the second to fourth aspects and a solid-state electronic device.

A sixth aspect of the innovations herein provides a data storage apparatus having one of the skyrmion memory and skyrmion memory devices relating to the second to fourth aspects embedded therein.

A seventh aspect of the innovations herein provides a data processing apparatus having one of the skyrmion memory and skyrmion memory devices relating to the second to fourth aspects embedded therein.

An eighth aspect of the innovations herein provides a communication apparatus having one of the skyrmion memory and skyrmion memory devices relating to the second to fourth aspects embedded therein.

BRIEF DESCRIPTION OF THE DRAWINGS

FIG. 14A shows the step of forming a generating unit 20 of magnetic field and an electrode 157.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

A chiral magnet is one example of magnets capable of generating skyrmions. The chiral magnet is a type of magnet that exhibits a magnetic order phase in which the configuration of the magnetic moments rotates in a spiral pattern in the advancing direction of the magnetic moments when there is no application of external magnetic field. As a result of application of external magnetic field, the chiral magnet exhibits a ferromagnetic phase after exhibiting a phase in which skyrmions may be present.

Figure 1:
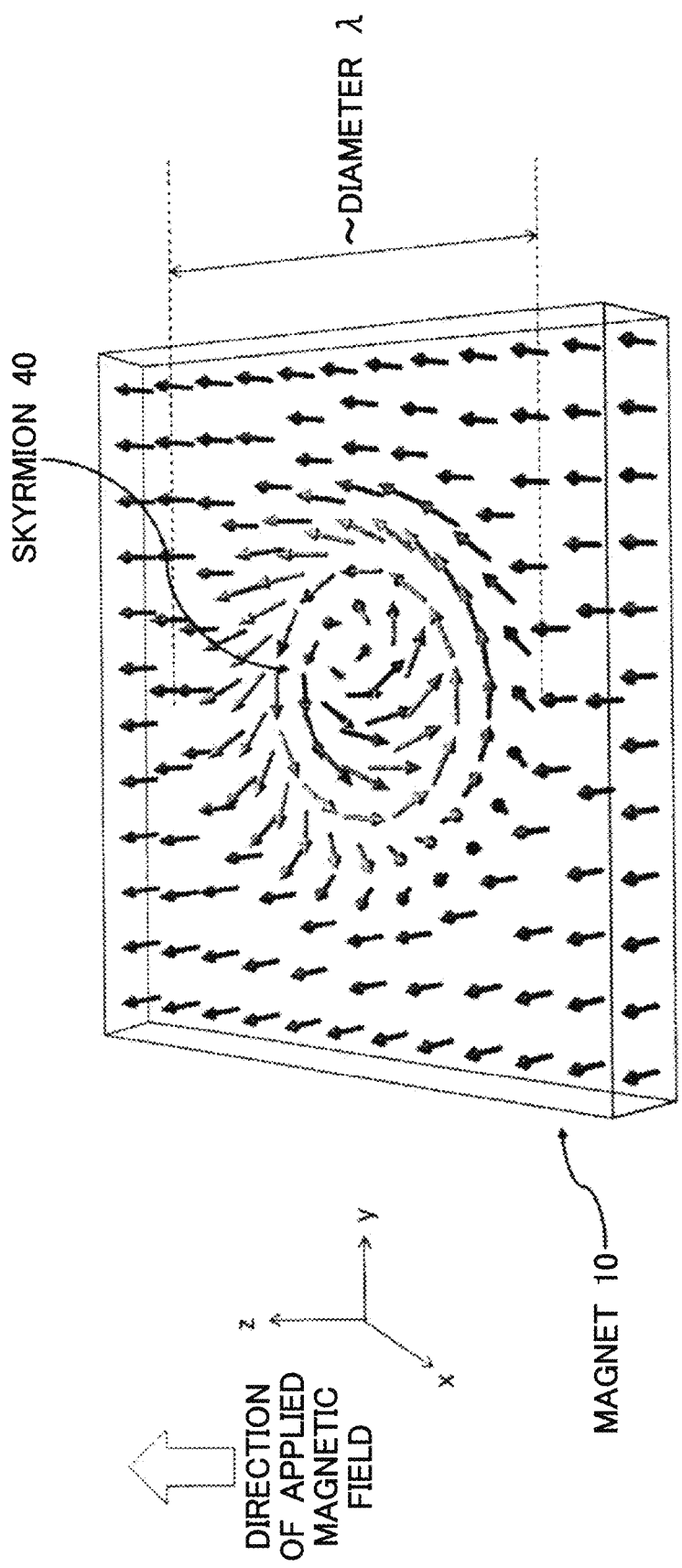
FIG. 1 is a schematic view showing an exemplary skyrmion, which is a magnetic nanoscale texture formed by magnetic moments in a magnet and schematically shows the magnitudes and orientations of the magnetic moments using arrows.

FIG. 1 is a schematic view showing one example of a skyrmion 40 being a magnetic nanoscale texture in a magnet 10. In FIG. 1, the arrows indicate the orientations of the magnetic moments in the skyrmion 40. The x axis and the y axis are axes orthogonal to each other, and the z axis is an axis orthogonal to the x-y plane.

The magnet 10 has a plane parallel to the x-y plane. The magnetic moments that can be oriented in all directions on this plane of the magnet 10 forms the skyrmion 40. In the present example, the direction of the magnetic field applied to the magnet 10 is the positive z direction. In this case, the magnetic moments at the outermost circumference of the skyrmion 40 in the present example are oriented in the positive z direction.

In the skyrmion 40, the magnetic moments form a vortex-like swirl from the outermost circumference to the inner side. Further, the orientations of the magnetic moments gradually change from the positive z direction to the negative z direction along with the vortex-like swirl.

In the skyrmion 40, the orientations of the magnetic moments successively twist between the center and the outermost circumference. That is, the skyrmion 40 is a magnetic nanoscale texture having a vortex structure formed by the magnetic moments. In a case where the magnet 10, in which the skyrmion 40 is present, is a thin plate-like solid material, the magnetic moments forming the skyrmion 40 are oriented in the same direction in the thickness direction of the magnet 10. That is, in the skyrmion 40, the magnetic moments arranged next to each other in the depth direction of the plate-like magnet 10 (z direction) from the front surface to the back surface are oriented in the same direction. The diameter λ of the skyrmion 40 indicates the diameter defined by the outermost circumference of the skyrmion 40. The outermost circumference in the present example indicates the circumference formed by the magnetic moments oriented in the same direction as the external magnetic field shown in FIG. 1.

A skyrmion number Nsk characterizes the skyrmion 40 being a magnetic nanoscale texture with a vortex structure. The skyrmion number Nsk can be expressed by the following Equation 1 and Equation 2. In Equation 2, the polar angle $\Theta(\gamma)$ between the magnetic moment and the z axis is a continuous function of the distance r from the center of the skyrmion 40. The polar angle $\Theta(\gamma)$ changes from $\pi$ to zero or from zero to $\pi$ when the distance r is changed from 0 to $\infty$.

$$Nsk = \frac{1}{4}\pi \int\int d^2 rn(r) \cdot \left[\left(\frac{\partial n(r)}{\partial x}\right) \times \left(\frac{\partial n(r)}{\partial y}\right)\right] \quad \text{[Equation 1]}$$

$$n(r)=(\cos\phi(\varphi)\sin\Theta(r),\ \sin\phi(\varphi)\sin\Theta(r),\ \cos\Theta(r))\phi$$
$$(\varphi)=m\varphi+\gamma \quad \text{[Equation 2]}$$

In Equation 1, n(r) denotes the unit vector indicating the orientation of the magnetic moment in the skyrmion 40 at the position r. In Equation 2, m indicates the vorticity, and $\gamma$ indicates the helicity. According to Equation 1 and Equation 2, when the polar angle $\Theta(r)$ changes from $\pi$ to zero as the distance r is changed from 0 to $\infty$, Nsk=−m.

Figure 2:
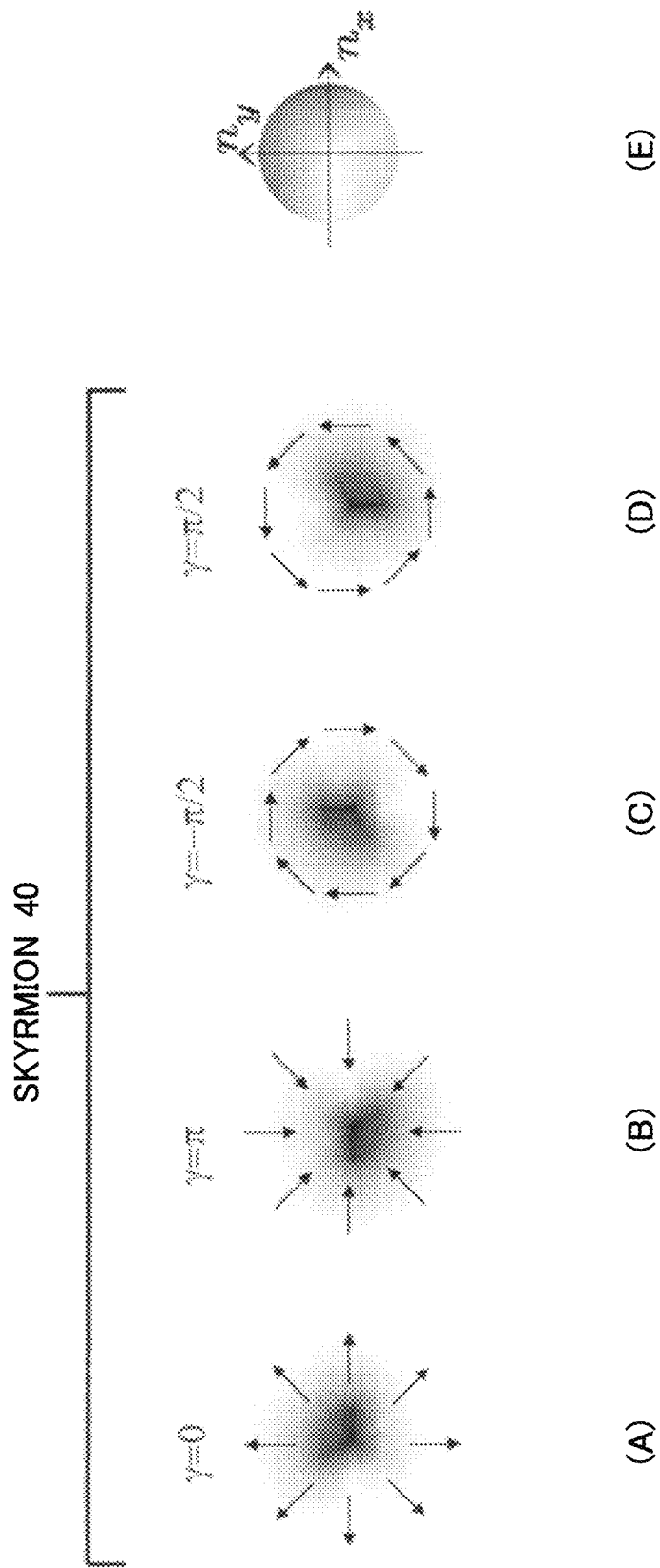
FIG. 2 shows skyrmions having different helicities $\gamma$.

FIG. 2 includes schematic views showing skyrmions 40 with different helicities $\gamma$. Particularly, FIG. 2 shows exemplary skyrmions 40 with a skyrmion number Nsk of −1. FIG. 2 shows in (E) a coordinate system (a right-handed system) of coordinates of magnetic moments n. Since this is a right-handed system, the $n_z$ axis is directed from the rear side of the plane of the drawing toward the front side relative to the $n_x$ axis and the $n_y$ axis. In (A) to (E) of FIG. 2, the gradations indicate the orientations of the magnetic moments.

The magnetic moments indicated by the gradation on the circumference in (E) of FIG. 2 are oriented along the $n_x$-$n_y$ plane. The magnetic moments indicated by the lightest gradation (white) at the center of the circle in (E) of FIG. 2 are oriented from the rear side of the plane of the drawing toward the front side. The magnetic moments indicated by the gradations at the positions between the circumference and the center have an angle with respect to the $n_z$ axis that ranges from $\pi$ to zero depending on the distance from the center. In (A) to (D) of FIG. 2, the orientations of the respective magnetic moments are indicated by the same gradations as in (E) of FIG. 2. The magnetic moments indicated by the darkest gradation (black) such as the ones at the center of the skyrmion 40 in (A) to (D) of FIG. 2 are oriented from the front side of the plane of the drawing toward the rear side. The arrows in (A) to (D) of FIG. 2 indicate the magnetic moments positioned at a predetermined distance from the center of the magnetic texture. The magnetic textures shown in (A) to (D) of FIG. 2 are in such a state that they can be defined as the skyrmions 40.

In (A) of FIG. 2 ($\gamma=0$), the gradation at a predetermined distance from the center of the skyrmion 40 is the same as the gradation on the circumference in (E) of FIG. 2. For this reason, the orientations of the magnetic moments indicated by the arrows in (A) of FIG. 2 are radially oriented outwardly from the center. Relative to each magnetic moment of (A) of FIG. 2 ($\gamma=0$), each magnetic moment of (B) of FIG. 2 ($\gamma=\pi$) has an orientation rotated by 180 degrees. Relative to each magnetic moment of (A) of FIG. 2 ($\gamma=0$), each magnetic moment of (C) of FIG. 2 ($\gamma=-\pi/2$) has an orientation rotated by −90 degrees (rotated right by 90 degrees).

Relative to each magnetic moment of (A) of FIG. 2 ($\gamma=0$), each magnetic moment of (D) of FIG. 2 ($\gamma=\pi/2$) has an orientation rotated by 90 degrees (rotated left by 90 degrees). The skyrmion 40 in FIG. 1 is the skyrmion 40 with a helicity $\gamma=\pi/2$ shown in (D) of FIG. 2.

Although the four exemplary magnetic textures illustrated in (A) to (D) of FIG. 2 may seem to be different from each other, they are topologically the same magnetic texture. The skyrmions having the structures shown in (A) to (D) of FIG. 2 exist stably once they are generated and function as a carrier to transmit information in the magnet 10 to which external magnetic field is applied.

Figure 3A:
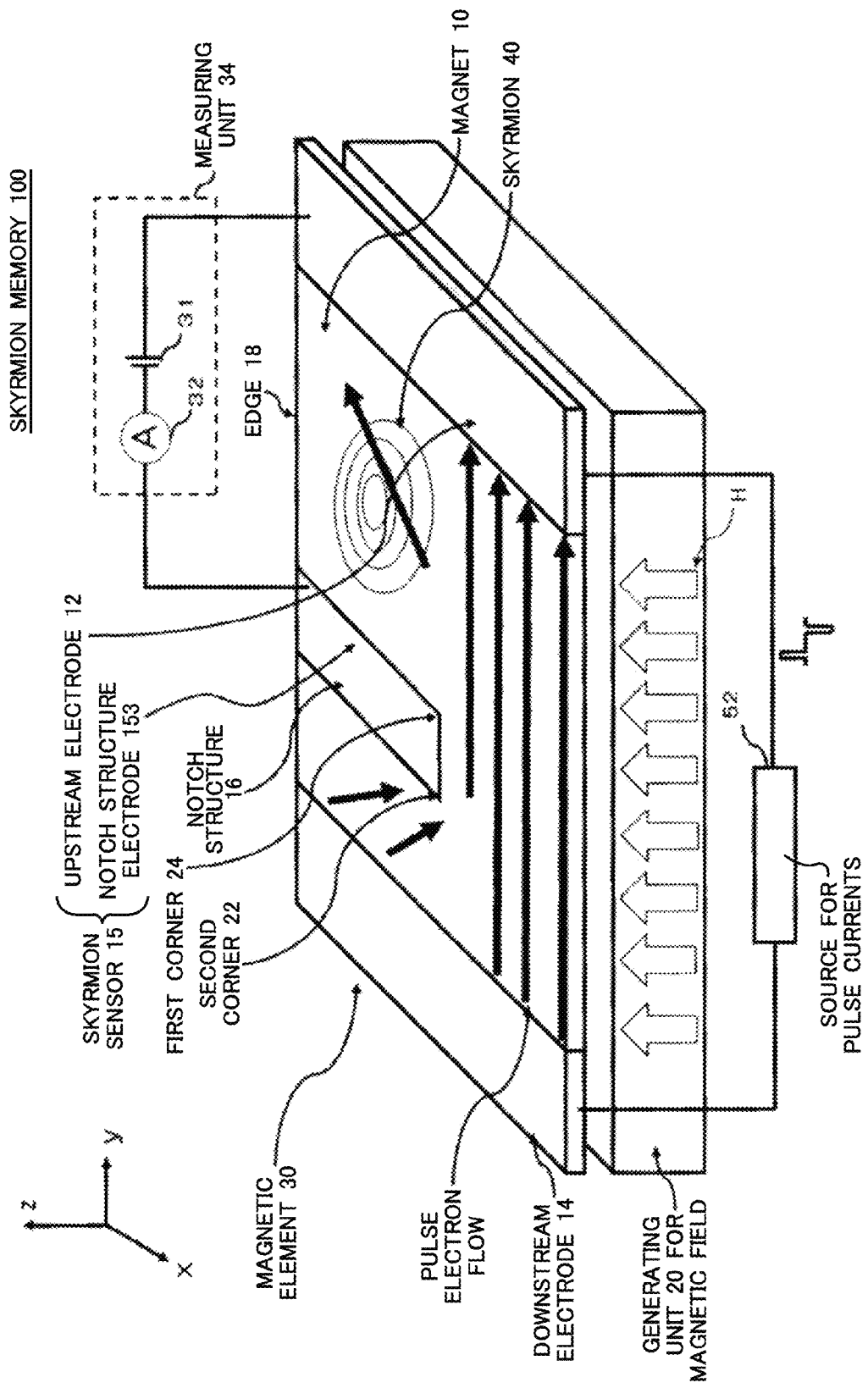
FIG. 3A shows an exemplary structure of a skyrmion memory 100.

FIG. 3A is a schematic view showing an exemplary structure of a skyrmion memory 100. The skyrmion memory 100 is configured to store information thereon by generating and erasing one skyrmion 40 using pulse currents. For example, 1-bit information is represented by whether the skyrmion 40 is present or absent at a predetermined location in the magnet 10. The skyrmion memory 100 of the present example includes a magnetic element 30, a generating unit 20 of magnetic field, a source 52 for pulse currents and a measuring unit 34.

The magnetic element 30 is capable of generating, erasing and detecting the skyrmion 40 using pulse currents. The magnetic element 30 of the present example is substantially shaped as a quadrangle. The magnetic element 30 of the present example includes a magnet 10, an upstream electrode 12, a downstream electrode 14 and a skyrmion sensor 15.

The magnet 10 at least exhibits a skyrmion crystal phase and a ferromagnetic phase depending on the magnetic field applied thereto. When the magnet 10 exhibits the skyrmion crystal phase, the skyrmion 40 can appear in the magnet 10. For example, the magnet 10 is a chiral magnet. The magnet 10 is formed as a thin layer to enable the skyrmion 40 to be stably present. The thickness of the magnet 10 may be, for example, approximately 10 times or less as large as the diameter of the skyrmion 40. The diameter of the skyrmion 40 indicates the diameter defined by the outermost circumference of the skyrmion 40.

The generating unit 20 of magnetic field applies magnetic field H to the magnet 10. In the present example, the generating unit 20 of magnetic field generates the magnetic field H that can cause the magnet 10 to transition to the ferromagnetic phase. The generating unit 20 of magnetic field also applies to the magnet 10 the magnetic field H that is substantially perpendicular to the front surface of the thin-film magnet 10. The magnet 10 of the present example has a surface parallel to the x-y plane (one surface), and the generating unit 20 of magnetic field generates the magnetic field H in the positive z direction as shown by the arrows in the generating unit 20 of magnetic field. The generating unit 20 of magnetic field may face the back surface of the magnet 10. The generating unit 20 of magnetic field may be spaced away from or in contact with the magnet 10. When the generating unit 20 of magnetic field is made of metals, the generating unit 20 of magnetic field is preferably spaced away from the magnet 10. A portion of the generating unit 20 of magnetic field that faces the magnet 10 may not necessarily have the same area as the magnet 10. The generating unit 20 of magnetic field may additionally serve as a generating unit 20 of magnetic field for a different magnet 10.

The upstream electrode 12 is connected to the magnet 10. The upstream electrode 12 is connected in the spreading direction of the magnet 10. In the present example, the spreading direction of the magnet 10 is defined as the direction parallel to the x-y plane. The upstream electrode 12 may be shaped as a thin layer. The upstream electrode 12 may have the same thickness as the magnet 10.

The downstream electrode 14 is spaced away from the upstream electrode 12 and connected to the magnet 10. The downstream electrode 14 may be connected in the spreading direction of the magnet 10. The upstream electrode 12 and the downstream electrode 14 are arranged such that, when voltages are applied, currents may flow through the magnet 10 in the direction substantially parallel to the x-y plane.

The source 52 for pulse currents is connected to the upstream electrode 12 and the downstream electrode 14. The source 52 for pulse currents selects one of the direction from the upstream electrode 12 to the downstream electrode 14 and the direction from the downstream electrode 14 to the upstream electrode 12 and supplies pulse currents to the magnet 10 to flow in the selected direction. In order to generate the skyrmion 40 in the magnet 10, the source 52 for pulse currents applies pulse currents to the magnet 10 to flow in the direction from the upstream electrode 12 to the downstream electrode 14. In order to erase the skyrmion 40 present in the magnet 10, the source 52 for pulse currents applies pulse currents to the magnet 10 to flow in the direction from the downstream electrode 14 to the upstream electrode 12.

The magnet 10 has a notch structure 16 at an edge 18. The edge 18 of the present example is one of the edges of the magnet 10 that is sandwiched between the upstream electrode 12 and the downstream electrode 14. To be more specific, for example, when the upstream electrode 12 is positioned on the right side and the downstream electrode 14 is positioned on the left side, the edge 18 is the upper edge of the magnet 10. The notch structure 16 is positioned at the edge 18 while being spaced away from both of the upstream electrode 12 and the downstream electrode 14. In the notch structure 16, a non-magnetic material may be provided.

The skyrmion memory 100 uses the one skyrmion 40 generated by the currents supplied from the source 52 for pulse currents as an information storage medium. In FIG. 3A, the direction of the flow of the electrons of the pulses is indicated by the arrows (the currents flow in the opposite direction). This pulse electron flow can be used to generate one skyrmion 40 from the notch structure 16 in the magnet 10.

In the present example, one of the corners of the notch structure 16 that faces the upstream electrode 12 is referred to as a first corner 24. When the pulse electron flow is applied from the downstream electrode 14, the skyrmion 40 appears from the vicinity of the first corner 24. The notch structure 16 may have a side parallel to the upstream electrode 12 and a side parallel to the downstream electrode 14. The first corner 24 may be at an end of the side parallel to the upstream electrode 12. In the present example, the notch structure 16 has a quadrangular shape. The magnet 10 may surround the notch structure 16 along three of its sides. The remaining one of the sides of the notch structure 16 bridges the separate portions of the edge 18 that are disconnected by the notch structure 16. In this case, the first corner 24 is one of the two corners at the top end of the notch structure 16 that faces the upstream electrode 12. The other corner facing the downstream electrode 14 is referred to as a second corner 22. Note that the shape of the notch structure 16 is not limited to a quadrangle. The notch structure 16 may be shaped as a polygon. In addition, the sides of the notch structure 16 do not need to be linear. Furthermore, at least one of the corners of the notch structure 16 may be rounded.

The magnet 10 exhibits the ferromagnetic phase due to the generating unit 20 of magnetic field. As a result, the magnetic moments in the magnet 10 are oriented in the same orientation as the magnetic field H. Note that, however, the magnetic moments at the edges of the magnet 10 are not oriented in the same orientation as the magnetic field H but angled with respect to the magnetic field H. In particular, the gradients of the magnetic moments successively change in the vicinity of the first corner 24 of the notch structure 16. For this reason, the skyrmion 40 is more likely to be generated at the corners of the magnet 10 than in the other regions and can be generated using predetermined pulse electron flows. In order to generate one skyrmion, the distance between the first corner 24 and the upstream electrode 12 in the magnet 10 needs to be equal to or shorter than a predetermined distance. More than one skyrmion may be generated when the distance is longer than the predetermined distance.

From among the corners of the notch structure 16, the first corner 24, which is adjacent to the upstream electrode 12, has an interior angle of 180° or larger. The second corner 22, which is adjacent to the downstream electrode 14, may also have an interior angle of 180° or larger. Here, the interior angle of the corner of the notch structure 16 denotes the angle of the corner formed in the magnet 10. For example, in the example shown in FIG. 3A, the first corner 24, which is adjacent to the upstream electrode 12, has an interior angle of 270°.

In a case where the first corner 24 has an interior angle of 270°, the magnetic moments observed in the vicinity of the first corner 24 while no currents are applied are most likely to appear as a vortex. Accordingly, the interior angle of the first corner 24 is preferably 270° in order to generate the skyrmion 40.

A negative pulse current is supplied to the magnet 10 to flow from the upstream electrode 12 to the downstream electrode 14. This is the same as supplying a pulse current to the magnet 10 to flow from the downstream electrode 14 to the upstream electrode 12. The direction of the flow of the electrons of the pulse is opposite to the direction shown in FIG. 3A. The pulse electron flow in the opposite direction forces the skyrmion 40 into the notch structure 16 so that the skyrmion 40 disappears. The distance between the notch structure 16 and the downstream electrode 14 needs to be shorter than a predetermined length. Otherwise, skyrmions appear between the notch structure 16 and the downstream electrode 14.

Note that, in the present example, the notch structure 16 has a notch structure electrode 153, which is formed by an electrode connected to the magnet 10 in the spreading direction of the magnet 10. The upstream electrode 12 is not only used to generate and erase the skyrmion 40 but also serves as an electrode in the skyrmion sensor 15. The skyrmion sensor 15 is configured to detect whether the skyrmion 40 is generated or erased. For example, the skyrmion sensor 15 is a resistance element whose resistance value changes depending on whether the skyrmion 40 is present or absent.

The notch structure electrode 153 is in contact with the side of the notch structure 16 that faces the upstream electrode 12. Note that, as shown in FIG. 3A, the notch structure electrode 153 may be formed by the entire region of the notch structure 16. The notch structure electrode 153 is positioned such that the skyrmion 40 in the stable state is positioned between the notch structure electrode 153 and the upstream electrode 12. In the present example, the resistance value of the magnet 10 between the upstream electrode 12 and the notch structure electrode 153 varies according to whether the skyrmion 40 appears or disappears. The resistance value of the skyrmion sensor 15 takes a minimum value when the skyrmion 40 is absent in the magnet 10 and takes an increased value when the skyrmion 40 is present. The high resistance (H) and the low resistance (L) exhibited by the skyrmion sensor 15 correspond to whether the skyrmion 40 is present or absent, and also to whether the information stored on the memory cell is "1" or "0."

The measuring unit 34 is connected to the notch structure electrode 153 and the upstream electrode 12. The measuring unit 34 measures the resistance value of the magnet 10 between the notch structure electrode 153 and the upstream electrode 12. The resistance value between the notch structure electrode 153 and the upstream electrode 12 corresponds to the resistance value of the magnet 10 and changes according to whether the skyrmion 40 appears or disappears. For example, when the skyrmion 40 is absent, the magnetic field H generated in the magnet 10 is spatially uniform. On the other hand, when the skyrmion 40 is present, the magnetic field applied to the magnet 10 is no longer spatially uniform. When such a spatially non-uniform magnetic field is generated, the conduction electrons flowing through the magnet 10 scatter due to the magnetic moments in the magnet 10. In other words, the resistance value of the magnet 10 is higher when the skyrmion 40 is present than when the skyrmion 40 is absent.

In the present example, the measuring unit 34 includes a power supply 31 for measuring and an ammeter 32. The power supply 31 for measuring is provided between the notch structure electrode 153 and the upstream electrode 12. The ammeter 32 measures the currents under measurement flowing from the power supply 31 for measuring. The resistance value of the magnet 10 can be detected based on the ratio of the known voltage applied by the power supply for measuring 31 to the currents measured by the ammeter 32. In the above-described manner, the information stored on the skyrmion memory 100 can be read.

Figure 3B:
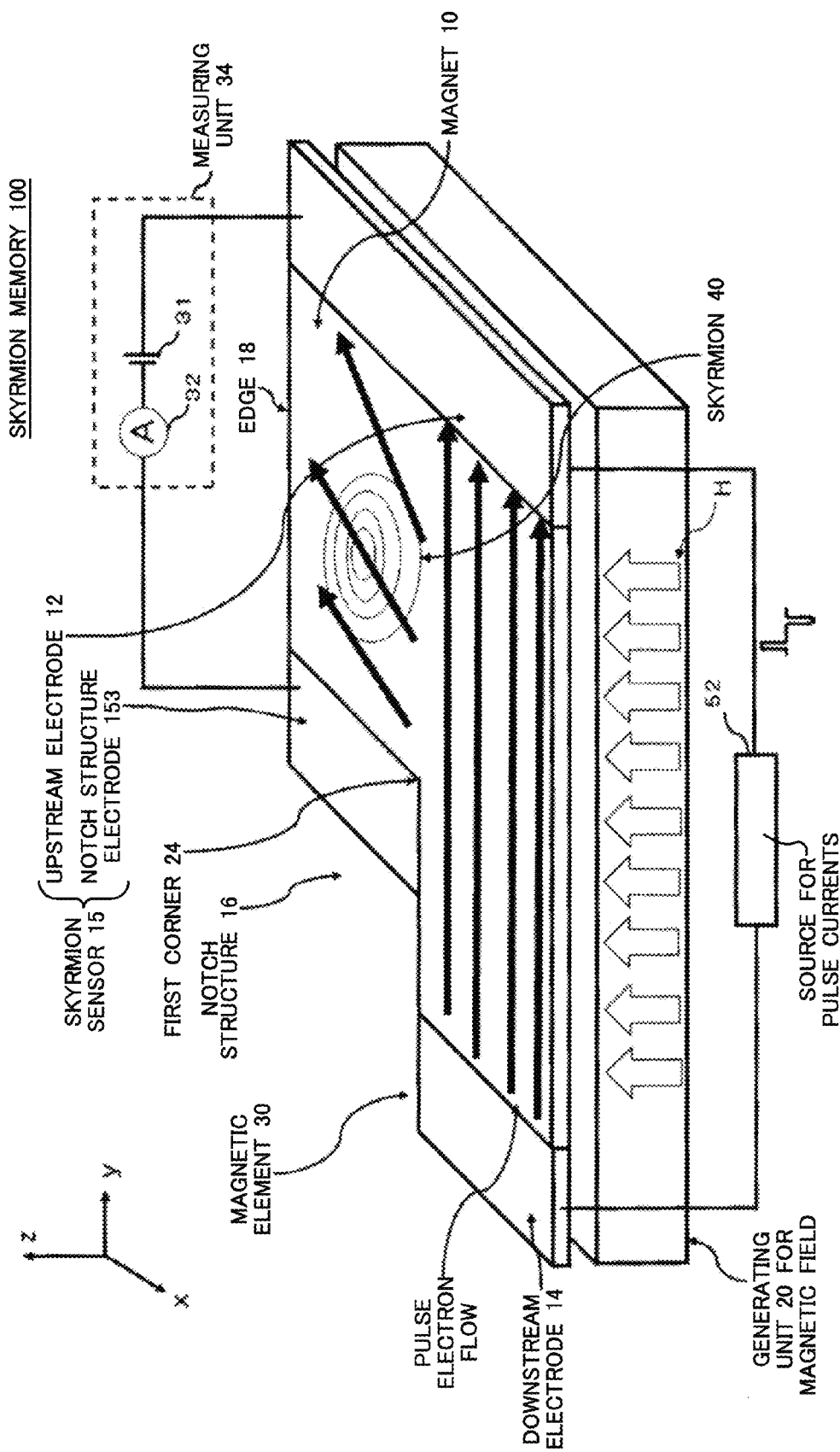
FIG. 3B shows another example of the skyrmion memory 100.

FIG. 3B is a schematic view showing another example of the skyrmion memory 100. The edge of the notch structure 16 that faces the downstream electrode 14 may be aligned with the edge of the magnet 10 that faces the downstream electrode 14, as a result of which the notch structure 16 is expanded. In this case, the notch structure 16 has only one corner or the first corner 24. The design of the present example for the magnet is structurally simpler than the design shown in FIG. 3A and more preferable from the perspective of fine fabrication. The length of the downstream electrode 14 in the x direction may be substantially the same as the length of the edge of the magnet 10 that faces the downstream electrode 14. Note that, however, the downstream electrode 14 is electrically insulated from the notch structure electrode 153. The notch structure electrode 153 may only occupy a partial region of the notch structure 16 that faces the upstream electrode 12 so as to be insulated from the downstream electrode 14.

The elaborate simulation experiments using pulse currents revealed surprising characteristics of how to generate and erase skyrmions. The time required to generate and erase a nano-size skyrmion using a pulse current may be approximately several hundred picoseconds (psec), which means an extremely short pulse. Stated differently, a current pulse for generating or erasing a skyrmion is applied for a duration shorter than 1 nsec. This is two orders of magnitude faster than 20 nsec, which is necessary for dynamic random access memory (DRAM). High-speed SRAM (static random access memory) requires 2 nsec, and the skyrmion memory 100 can operate faster than high-speed SRAM. The experiments also discovered that, when no pulse currents are applied, the generated skyrmion stayed at a predetermined location. Thus, the skyrmion memory 100 does not consume power to maintain the stored information, or has non-volatile memory characteristics. Power is only required to generate and erase a skyrmion. Since such power can be applied with an extremely short pulse as described above, data can be written and erased with extremely low power consumption. The skyrmion memory 100 is a memory element that is highly likely to be characterized as an ultimate memory element since the skyrmion memory 100 can achieve the above-described goals.

The magnetic element 30, which is capable of generating the skyrmion 40, is, for example, an element formed as a thin layer having a thickness of 500 nm or less and can be formed using techniques such as molecular beam epitaxy (MBE) and sputtering. The upstream electrode 12 and the downstream electrode 14 are made of electrically conductive and non-magnetic metals such as Cu, W, Ti, TiN, Al, Pt and Au.

The magnet 10 is constituted by a chiral magnet. The above-described conclusions can be also true when the magnet 10 is a dipole magnet, a frustrated magnet or a structure in which a magnet and a non-magnetic material are stacked on each other. The dipole magnet is a magnet in which the magnetic dipole-dipole interaction is important. The frustrated magnet is a magnet including a spatial structure of a magnetic interaction preferring a magnetic mismatching state. The magnet having a layered structure of a magnetic material and a non-magnetic material is a magnet in which the magnetic moments of the magnetic material in contact with the non-magnetic material are modulated by the spin orbital interaction of the non-magnetic material.

The innovations herein having the above-described characteristics can be embodied as a magnetic element that is capable of generating and erasing one skyrmion in a magnet using a pulse current. The following describes how to generate and erase a skyrmion with reference to embodiments.

First Embodiment

In a first embodiment, elaborate simulation experiments are conducted to examine generation of one skyrmion 40 using a pulse current. The movement of the skyrmion 40 can be expressed by the following equations. The following shows a numerical solution of the equations shown in Equations 3 and 4, which include terms for adiabatic and non-adiabatic spin transfer torque.

$$dM_r/dt = -\gamma M_r \times B_r^{\text{eff}} + (\alpha/M) M_r \times dM_r/dt + pa^3/2eM$$
$$(j(r) \cdot \nabla) M_r - (pa^3 \beta/(2eM^2))[M_r \times (j(r) \cdot \nabla) M_r]) \quad \text{[Equation 3]}$$

Also, the Hamiltonian in the chiral magnet can be expressed by Equation 4.

$$H = -J\Sigma M_r \cdot (M_{r+ex} + M_{r+ey}) - D\Sigma(M_r \times M_{r+ex} \cdot e_x + M_r \times M_{r+ey} \cdot e_y) + \Sigma H_r \cdot M_r \quad \text{[Equation 4]}$$

In the above-described Equations 3 and 4, X denotes the cross product. Here, $Mr = M \cdot n(r)$ and $n(r)$ is defined by Equation 2. Equations 3 and 4 are related to each other due to $B_r^{\text{eff}} = -(1/(h\Gamma))(\partial H/\partial M_r)$. Here, $\Gamma = g\mu_B/h$ (>0) represents the gyromagnetic ratio, h represents the Planck's constant and $M_r$ denotes the magnetization in dimensionless quantity.

Here, the Hamiltonian H expressed by Equation 4 is of a chiral magnet. In the cases of a dipole magnet, a frustrated magnet and a magnet having an interface between a non-magnetic material and a magnetic material stacked on each other, the expression of H may be replaced with the Hamiltonians of the respective types of magnets.

In the present embodiment, simulations are conducted using the above-described equations under such conditions that the electrodes made of non-magnetic materials extend parallel to the x axis and the magnetic field is applied in the direction from the back side of the magnet 10 (the side facing the generating unit 20 of magnetic field) to the front side.

Figure 4:
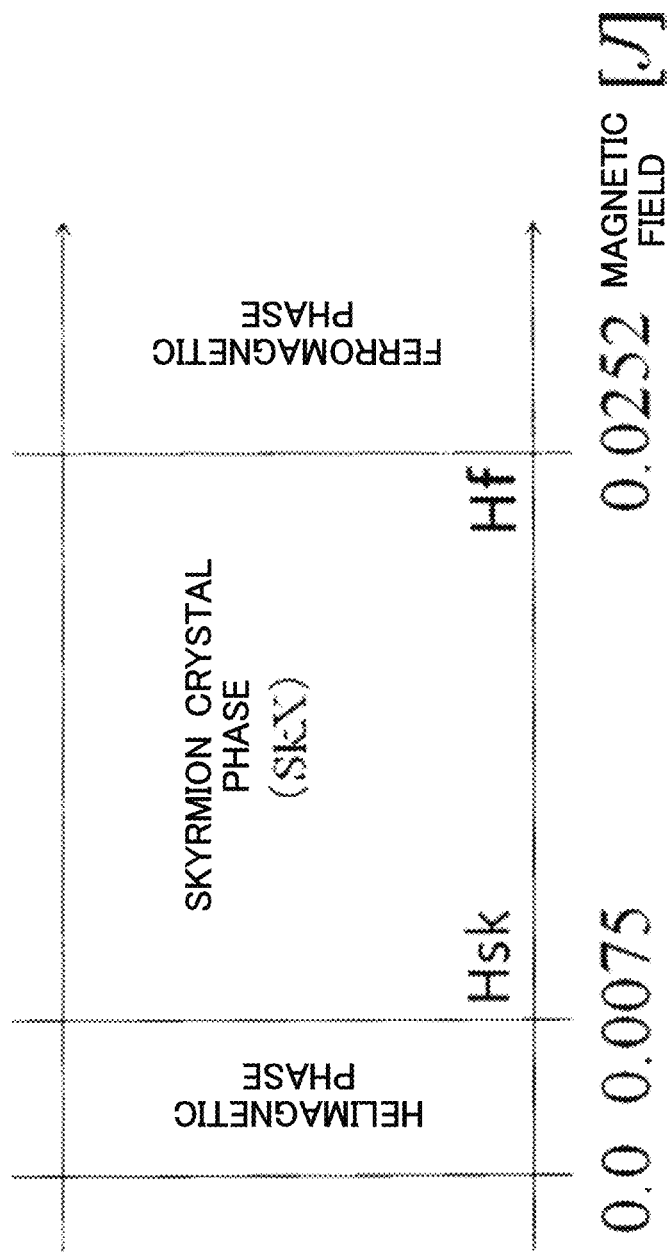
FIG. 4 is a phase diagram showing the magnetic phases of a magnet.

FIG. 4 is a phase diagram showing how the magnetic phases of the magnet depend on the magnetic field. In the present embodiment, the simulation experiments were conducted with the parameters Hsk and Hf being set as shown in FIG. 4. The chiral magnet transitions from the chiral magnetic phase to the skyrmion crystal phase (SkX) with the magnetic field strength HsK and transitions from the skyrmion crystal phase (SkX) to the ferromagnetic phase with a further higher magnetic field strength Hf. When the chiral magnet exhibits the skyrmion crystal phase (SkX), a plurality of skyrmions 40 are generated and arranged in the highest density in the x-y plane.

In the following, J denotes the magnitude of the magnetic exchange interaction of the above-mentioned magnet and various physical quantities are defined in relation to J. The magnet transitions from the chiral phase, in which the magnetic moments have a spiral magnetic texture with low magnetic field, to the skyrmion crystal phase when the magnetic field strength Hsk=0.0075 J. The diameter $\lambda$ of the skyrmion 40 can be such that $\lambda=2\pi\sqrt{2}\cdot J\cdot a/D$. Here, a denotes the lattice constant of the magnet 10 and D denotes the magnitude of the Dzyaloshinskii-Moriya interaction, which is a substance-specific physical constant. Accordingly, the skyrmion diameter $\lambda$ is a substance-specific constant. The skyrmion diameter $\lambda$ is, for example, 70 nm for FeGe and 18 nm for MnSi as disclosed in Prior Art Document 1.

In the case of the chiral magnet used in the present embodiment, D=0.18 J, a magnetic moment M=1, and a Gilbert damping constant $\alpha$=0.08. In the present example, since D=0.18 J, $\lambda$=50a. When the lattice constant a of the magnet 10 is 0.5 nm, $\lambda$=25 nm. The chiral magnet used in the present embodiment transitions from the skyrmion crystal phase to the ferromagnetic phase with the magnetic field strength Hf=0.0252 J.

Figure 5:
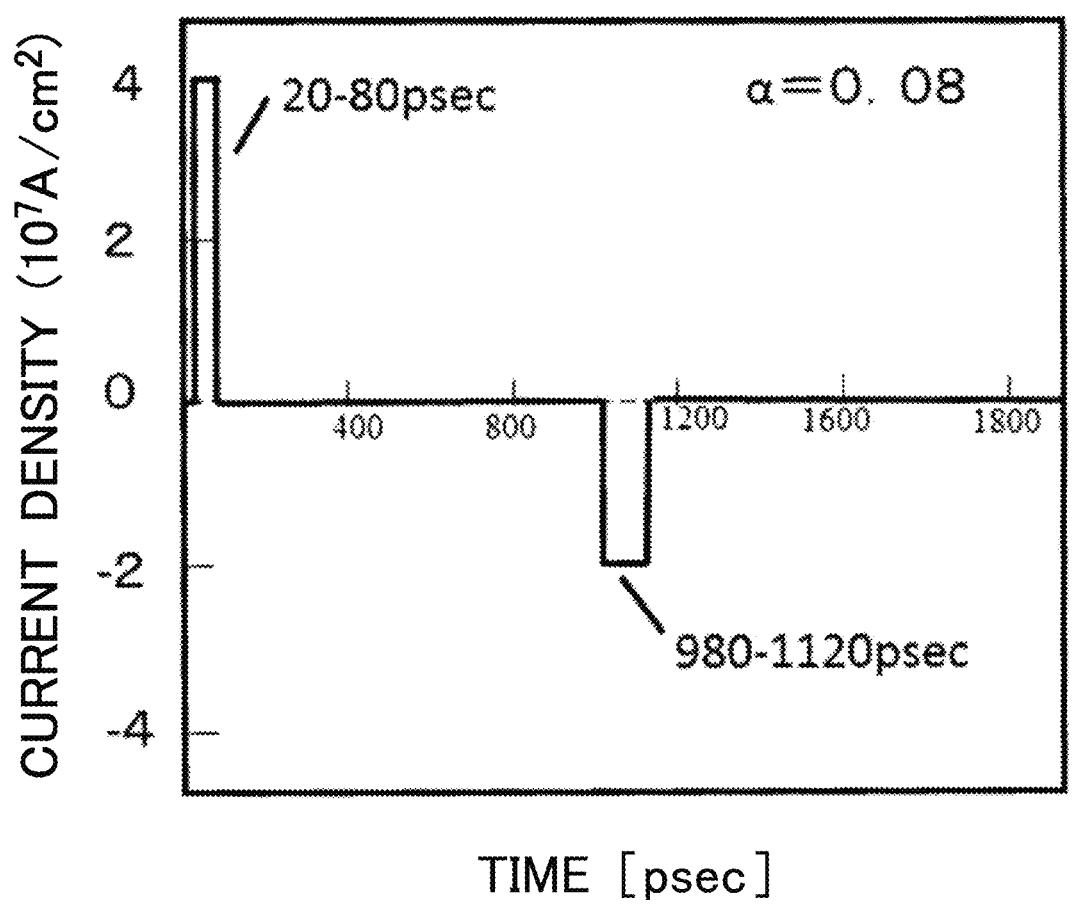
FIG. 5 shows how pulse currents are applied to generate and erase one skyrmion, which is to be fed to a magnet 10 to flow from an upstream electrode 12 to a downstream electrode 14 in simulations of a first embodiment ($\alpha=0.08$).

FIG. 5 shows how a pulse current is applied to the magnet 10 to flow from the upstream electrode 12 to the downstream electrode 14 in simulations. FIG. 5 shows a pulse current to generate one skyrmion 40 that is applied between the time t=20 psec and the time t=80 psec and a pulse current to erase the generated skyrmion 40 that is applied between the time t=980 psec and the time t=1120 psec. The current density is zero except while the pulse current to generate a skyrmion and the pulse current to erase a skyrmion are applied. The pulse current to generate a skyrmion and the pulse current to erase a skyrmion flow in different directions as shown in FIG. 5.

Figure 6:
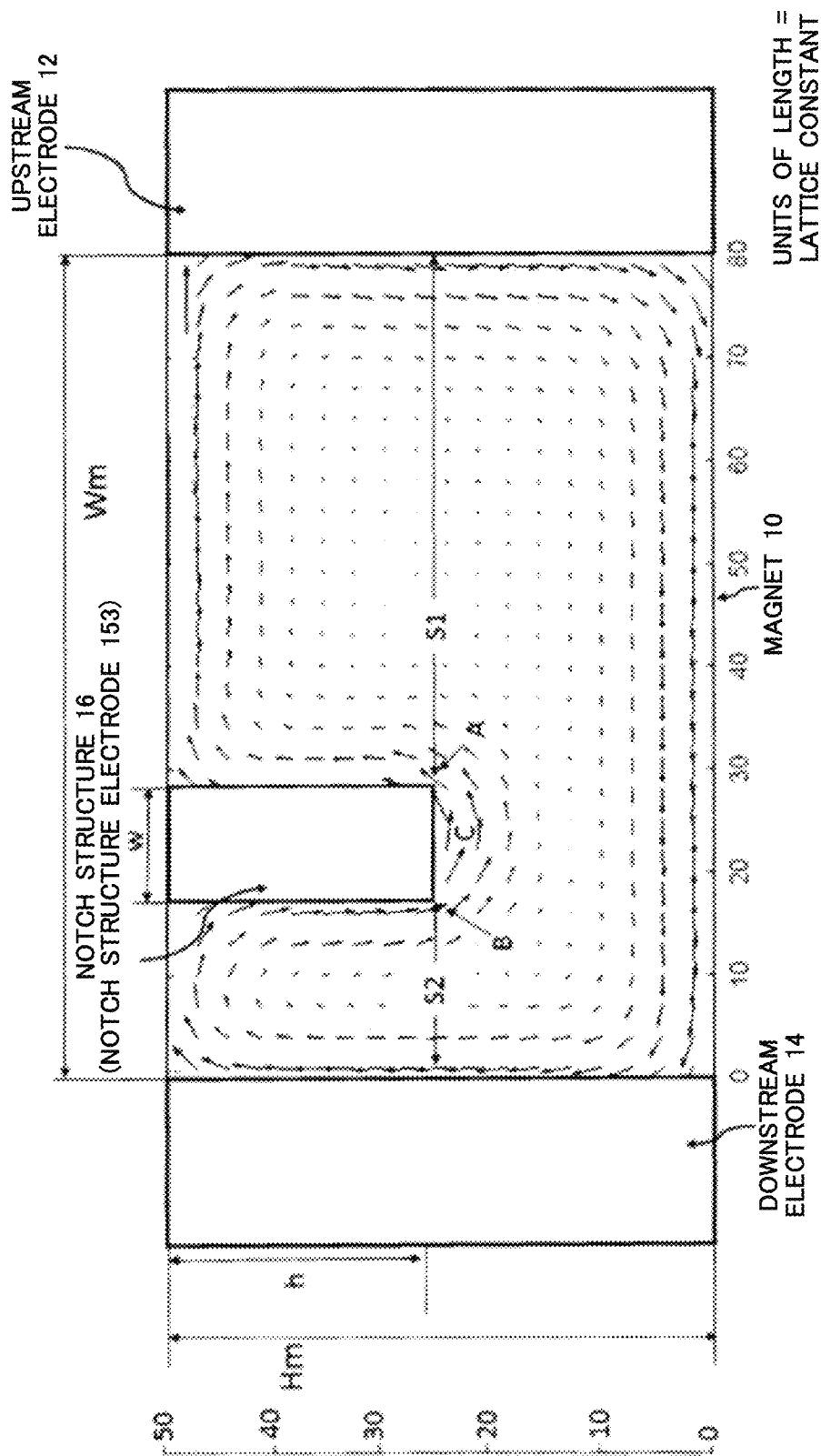
FIG. 6 shows the shape of the magnet 10 used in the simulations of the first embodiment.

FIG. 6 shows a magnet 10 that is used in the simulations and has a notch structure 16 and an notch structure electrode 153. The magnet 10 is substantially shaped as a rectangle having a width Wm in the x direction and a height Hm in the y direction. In the present example, the magnet 10 has a size Wm×Hm=80×50 in units of the lattice constant a of the magnet 10. An upstream electrode 12 and a downstream electrode 14, which are made of non-magnetic metals, are in contact with the two opposing sides of the magnet 10. In the present example, the upstream electrode 12 and the downstream electrode 14 have the same height as the magnet 10 and have a width of 15. In the present example, the electrodes 12 and 14 are in contact with the edges of the magnet 10 in the spreading direction of the magnet 10. The magnet 10 includes a notch structure 16 and an notch structure electrode 153 having a width w and a height h. Furthermore, in the present example, the notch structure electrode 153 occupies the entire region of the notch structure 16. Stated differently, in the present example, the notch structure 16 and the notch structure electrode 153 have the same shape and provided at the same position.

The distance between the upstream electrode 12 and the notch structure 16 is expressed as S1, and the distance between the downstream electrode 14 and the notch structure 16 is expressed as S2. In the present embodiment, w=11, h=25, S1=52 and S2=17 in units of the lattice constant a. In FIG. 6, the arrows indicate the magnetic moments observed at the time t=0 psec. FIG. 6 shows that the magnetic moments are tilted at the edges of the magnet 10. It is particularly important to note the magnetic moments at a vertex A, where the interior angle of the corner of the notch structure 16 is obtuse. At the vertex A, the magnetic moments are oriented in the counter-clockwise direction. The vertex A coincides with the first corner 24. According to the results of the simulations shown in FIG. 7A to FIG. 7I, the magnetic moments are vectors having a uniform magnitude. The arrows shown in these drawings presenting the results of the simulations indicate the projections of the magnetic moments on the x-y plane. The magnetic moments oriented in the z direction are indicated by the dots. The long arrows indicate that the corresponding magnetic moments are tilted with respect to the z axis to have a large x and y components, in other words, included in the x-y plane.

As shown in FIG. 5, the pulse current to generate a skyrmion is applied to the magnet 10 between the time t=20 psec and the time t=80 psec. The pulse current is supplied with a current density of $4\times10^7$ A/cm$^2$ to flow from the upstream electrode 12 to the downstream electrode 14.

Figure 7A:
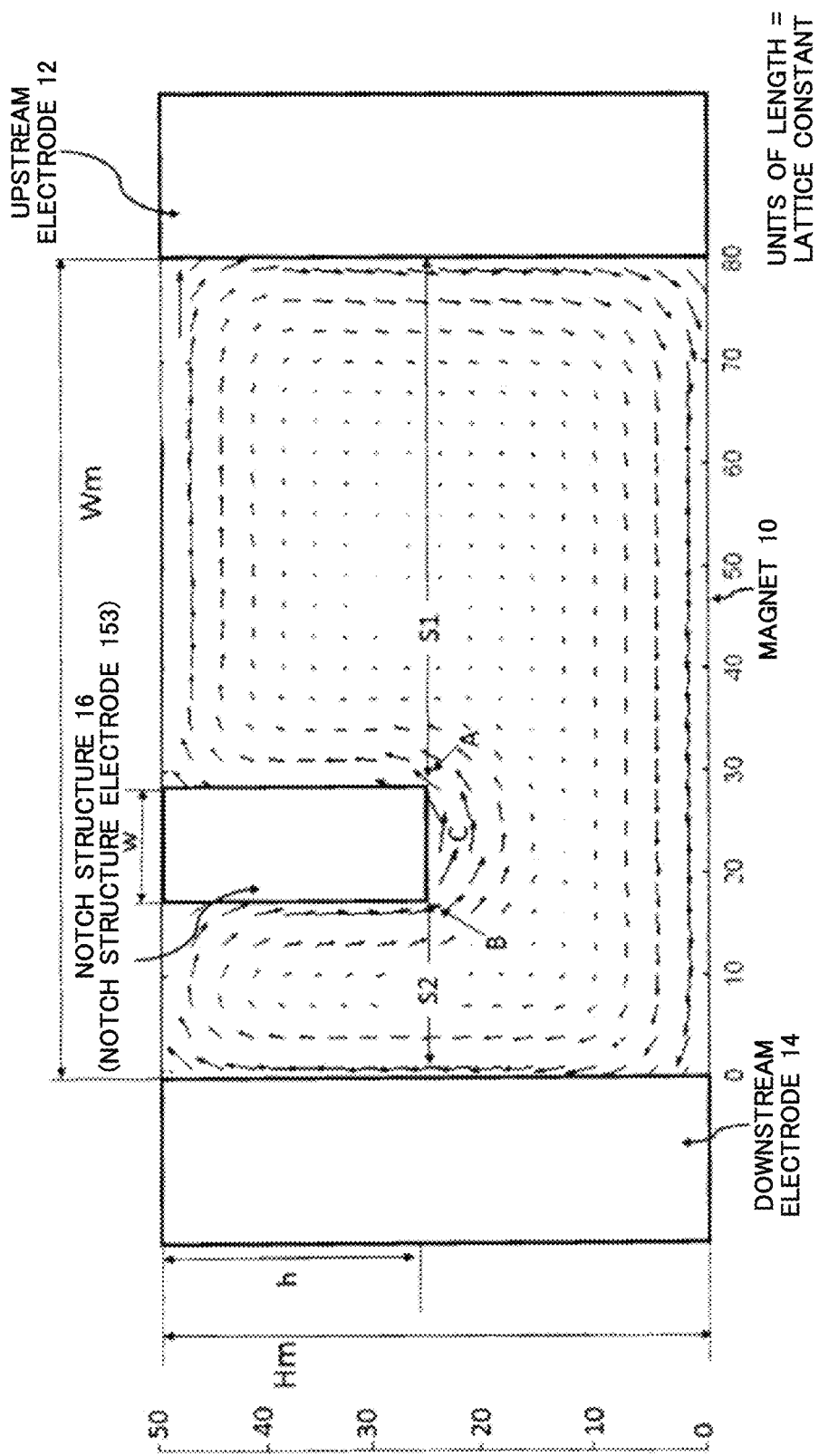
FIG. 7A shows the results of simulating the magnetic moments of the magnet 10 at the time t=20 psec, at which a pulse current starts to be fed to the magnet 10 to flow from the upstream electrode 12 to the downstream electrode 14 to generate one skyrmion.

FIG. 7A shows the results of simulating the magnetic moments of the magnet 10 at the time t=20 psec, at which the pulse current to generate a skyrmion starts to be fed to the magnet 10 to flow from the upstream electrode 12 to the downstream electrode 14. The skyrmion 40 is in the initial state.

Figure 7B:
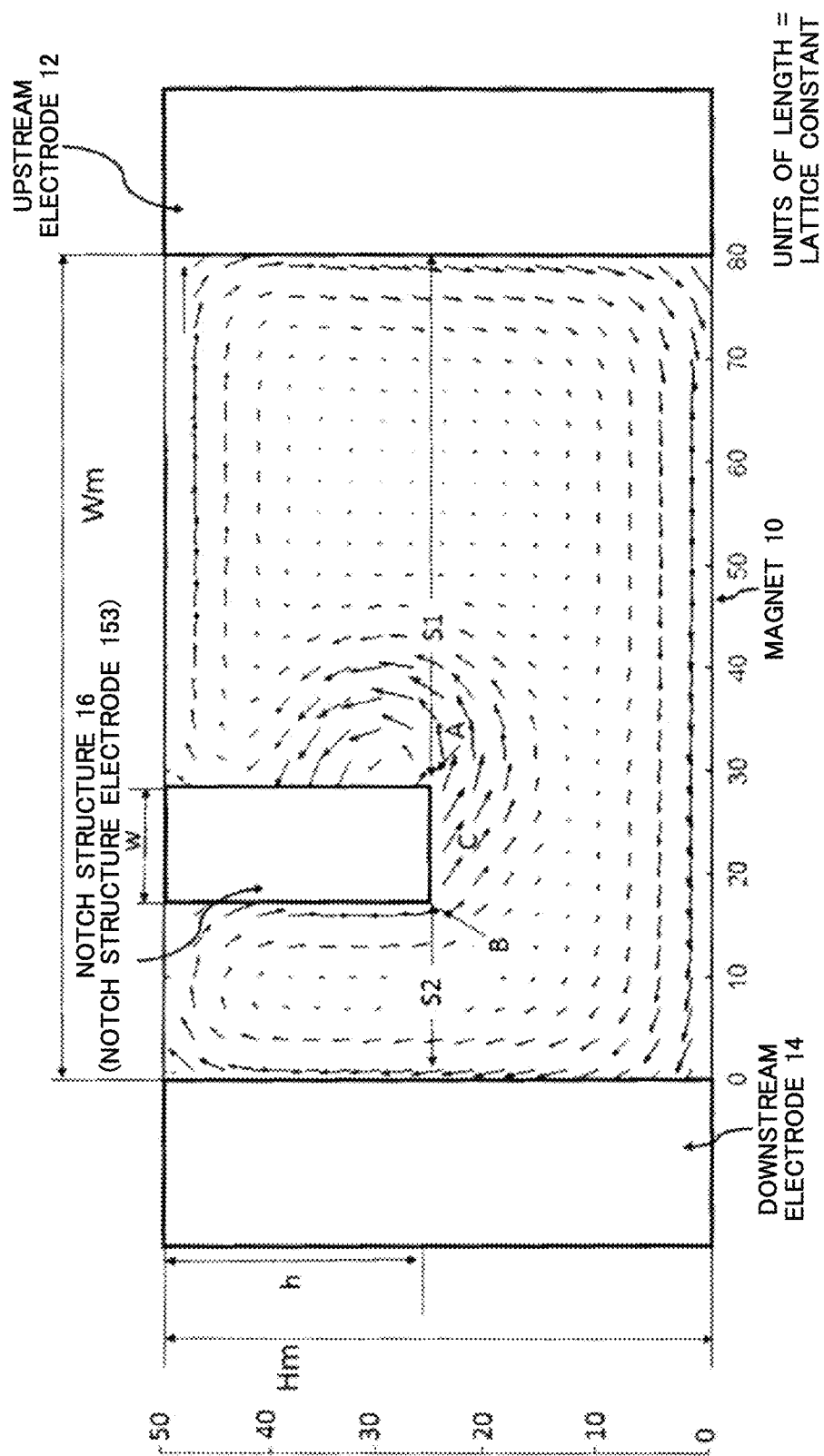
FIG. 7B shows the results of simulating the magnetic moments of the magnet 10 at the time t=60 psec, or immediately after the pulse current starts to be fed to the magnet 10 to flow from the upstream electrode 12 to the downstream electrode 14 to generate one skyrmion.

FIG. 7B shows the results of simulating the magnetic moments of the magnet 10 at the time t=60 psec, or immediately after the pulse current to generate a skyrmion starts to be fed to the magnet 10 to flow from the upstream electrode 12 to the downstream electrode 14. As shown in FIG. 6, the height of the portion of the magnet 10 that is below the notch structure 16 (Hm−h) is smaller than the height Hm of the region of the magnet 10 that is in contact with the upstream electrode 12. Therefore, as shown in FIG. 3A, the electron flow of the pulse current to generate a skyrmion scatters into the region between the upstream electrode 12 and the notch structure 16 after passing the vicinity of the first corner 24. FIG. 7B shows that the pulse electron flow causes the skyrmion 40 to appear from the vertex A.

Figure 7C:
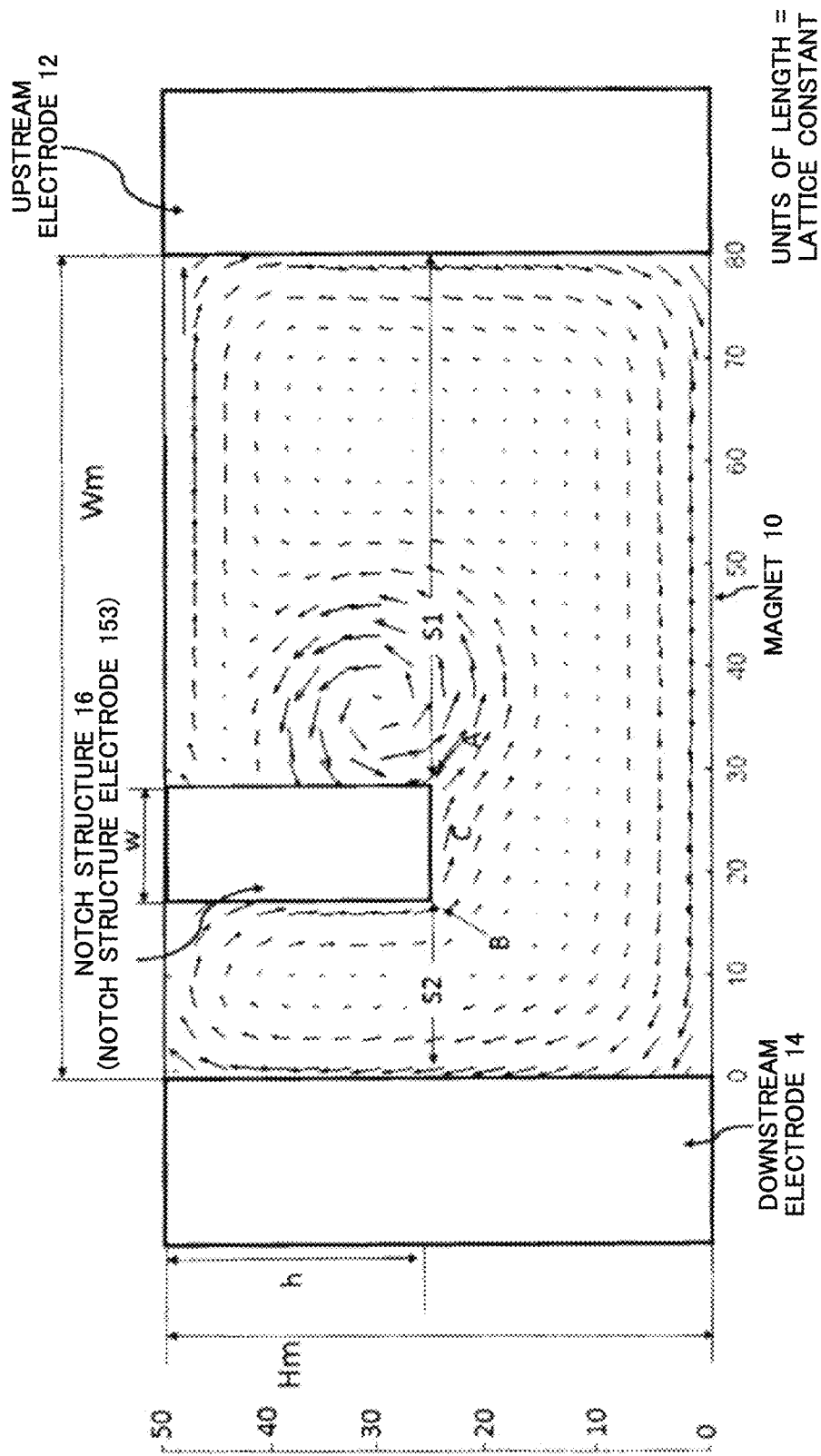
FIG. 7C shows the results of simulating the magnetic moments of the magnet 10 at the time t=120 psec, or immediately after the pulse current has been fed to the magnet 10 to flow from the upstream electrode 12 to the downstream electrode 14 to generate one skyrmion.

FIG. 7C shows the results of simulating the magnetic moments of the magnet 10 at the time t=120 psec, or immediately after the pulse current to generate a skyrmion has been fed to the magnet 10 to flow from the upstream electrode 12 to the downstream electrode 14. The one skyrmion 40 that has appeared from the vertex A can be clearly seen. After a while, the skyrmion 40 moves toward the upstream electrode 12 as if it leaves the first corner 24 of the notch structure 16. The pulse current to generate a skyrmion is turned off at the time t=80 psec, but the skyrmion 40 still keeps moving after the pulse current to generate a skyrmion is turned off.

Figure 7D:
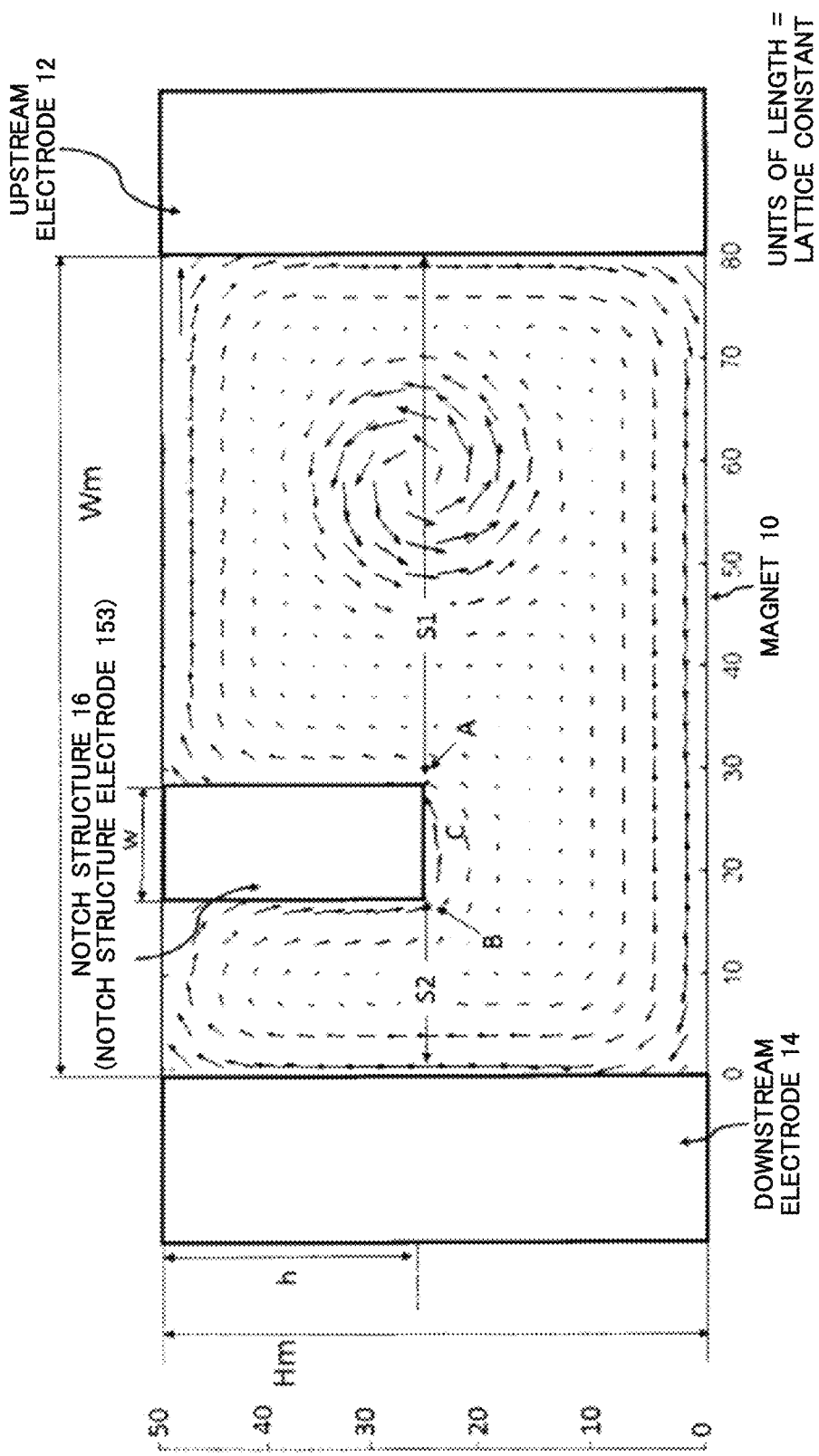
FIG. 7D shows the results of simulating the magnetic moments of the magnet 10 at the time t=960 psec, or after the pulse current fed to the magnet 10 to flow from the upstream electrode 12 to the downstream electrode 14 to generate one skyrmion is turned off.

FIG. 7D shows the results of simulating the magnetic moments of the magnet 10 at the time t=960 psec, or after the pulse current to generate a skyrmion fed to the magnet 10 to flow from the upstream electrode 12 to the downstream electrode 14 is turned off. The one skyrmion 40 is stabilized between the notch structure 16 and the upstream electrode 12. Thus, the period of time from when the pulse current to generate a skyrmion starts to be fed to when the skyrmion 40 is stabilized is approximately 840 psec. The current density to generate one skyrmion is $4\times10^7$ A/cm$^2$. In the example shown in FIG. 7D, the current density is $4\times10^7$ A/cm$^2$. In this way, the skyrmion 40 can be generated with a relatively low current density.

The width w of the notch structure 16 needs to be 0.2·λ or more in order to generate skyrmions. If the width w is smaller than this value, it cannot be assured that the magnetic moments at the vertex A are appropriately oriented. Accordingly, the width w is within the range of 0.5·λ>w>0.2·λ.

The distance S1 between the notch structure 16 and the upstream electrode 12 needs to fall within an appropriate range. The distance S1 needs to be larger than 0.5·λ in order that the one generated skyrmion can remain stably present. If the distance S1 is equal to or smaller than 0.5·λ the generated skyrmion is absorbed by the notch structure 16 and disappear. On the other hand, if the distance S1 is 2·λ or larger, the second skyrmion may appear. In light of the above, the distance S1 needs to be in the following range in order that the one generated skyrmion can remain stably present.

$$2\cdot\lambda > S1 \geq 0.5\cdot\lambda$$

The following describes the results of the simulation experiments in which the pulse current to erase a skyrmion of the opposite (negative) direction is supplied between the upstream electrode 12 and the downstream electrode 14 in order to erase the skyrmion 40. As shown in FIG. 5, the current level is zero for the duration of 900 psec after the pulse current to generate a skyrmion stops, and the pulse current to erase a skyrmion starts to be supplied at the time t=980 psec. The current density to erase one skyrmion is $2\times10^7$ A/cm$^2$.

Figure 7E:
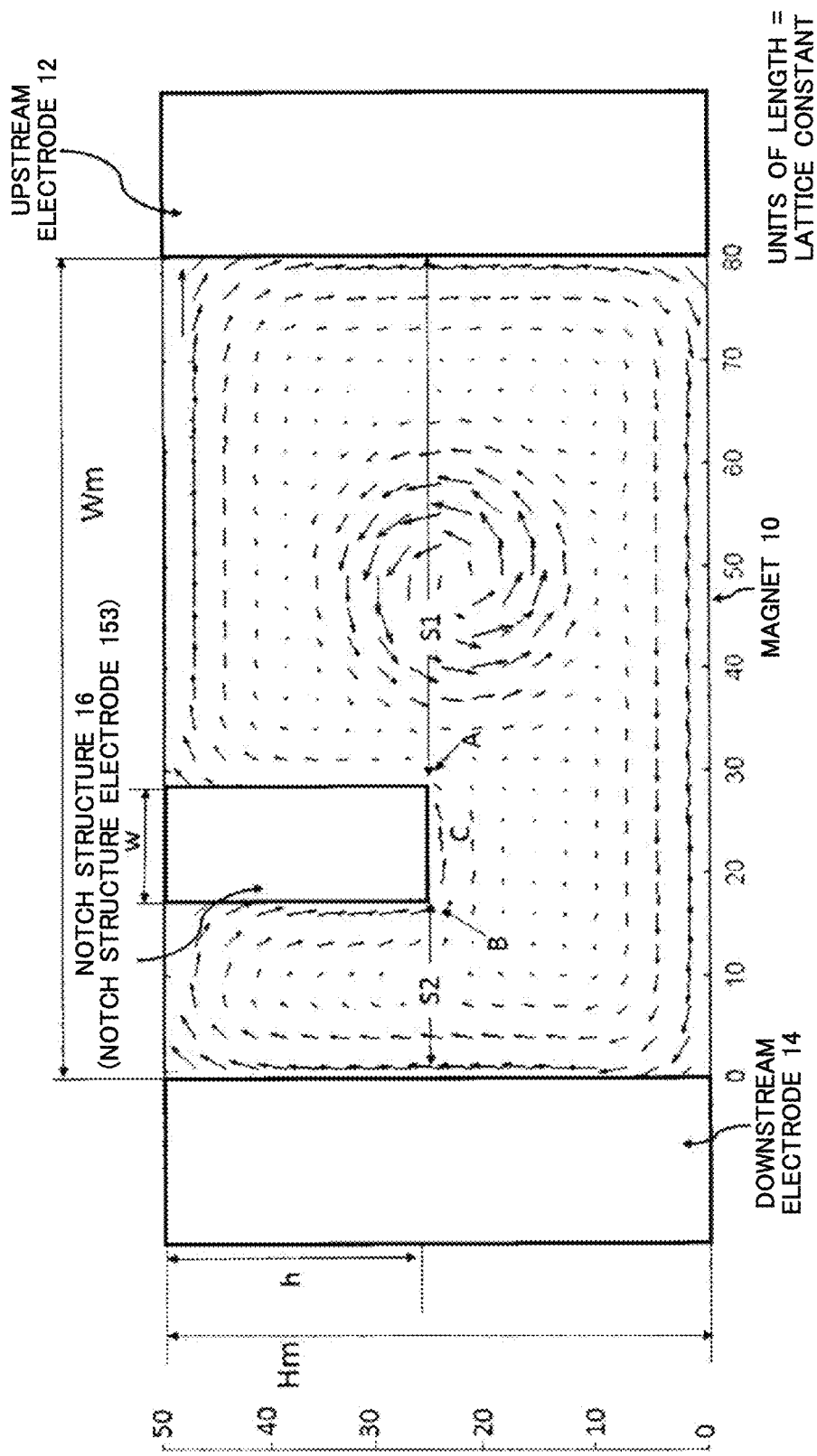
FIG. 7E shows the results of simulating the magnetic moments of the magnet 10 at the time t=1020 psec, or when a pulse current starts to be fed to the magnet 10 to flow from the downstream electrode 14 to the upstream electrode 12 to erase one skyrmion.

FIG. 7E shows the results of simulating the magnetic moments of the magnet 10 at the time t=1020 psec, or when the pulse current to erase a skyrmion starts to be fed to the magnet 10 to flow from the downstream electrode 14 to the upstream electrode 12. The pulse current to erase a skyrmion forms a pulse electron flow in the opposite direction to the pulse current to generate a skyrmion. The pulse electron flow causes the skyrmion 40 to move toward the downstream electrode 14.

Figure 7F:
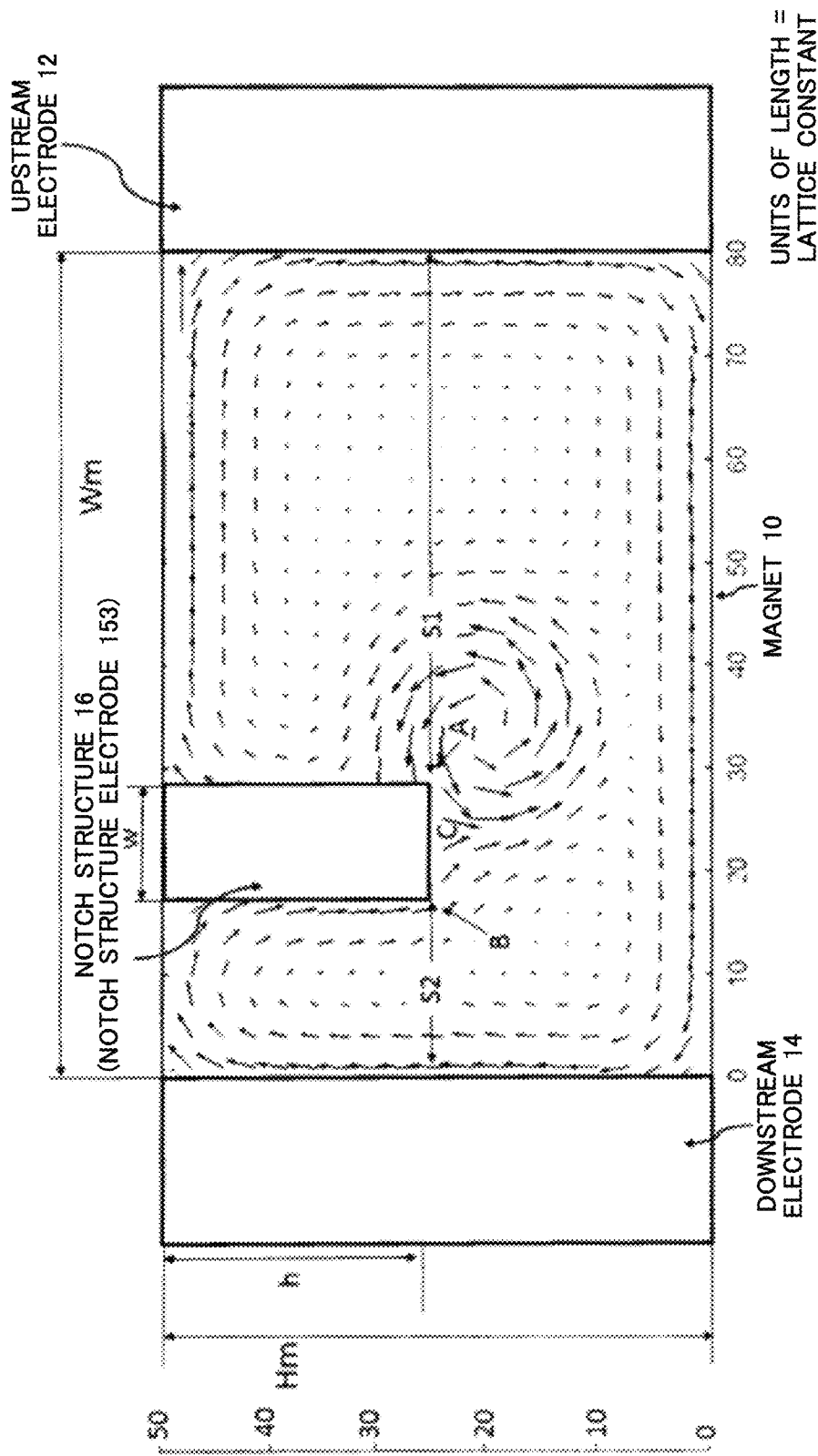
FIG. 7F shows the results of simulating the magnetic moments of the magnet 10 at the time t=1100 psec, or immediately after the pulse current starts to be fed to the magnet 10 to flow from the downstream electrode 14 to the upstream electrode 12 to erase one skyrmion.

FIG. 7F shows the results of simulating the magnetic moments of the magnet 10 at the time t=1100 psec, or immediately after the pulse current to erase a skyrmion starts to be fed to the magnet 10 to flow from the downstream electrode 14 to the upstream electrode 12. The pulse electron flow causes the skyrmion 40 to come into contact with the vertex A of the notch structure 16.

Figure 7G:
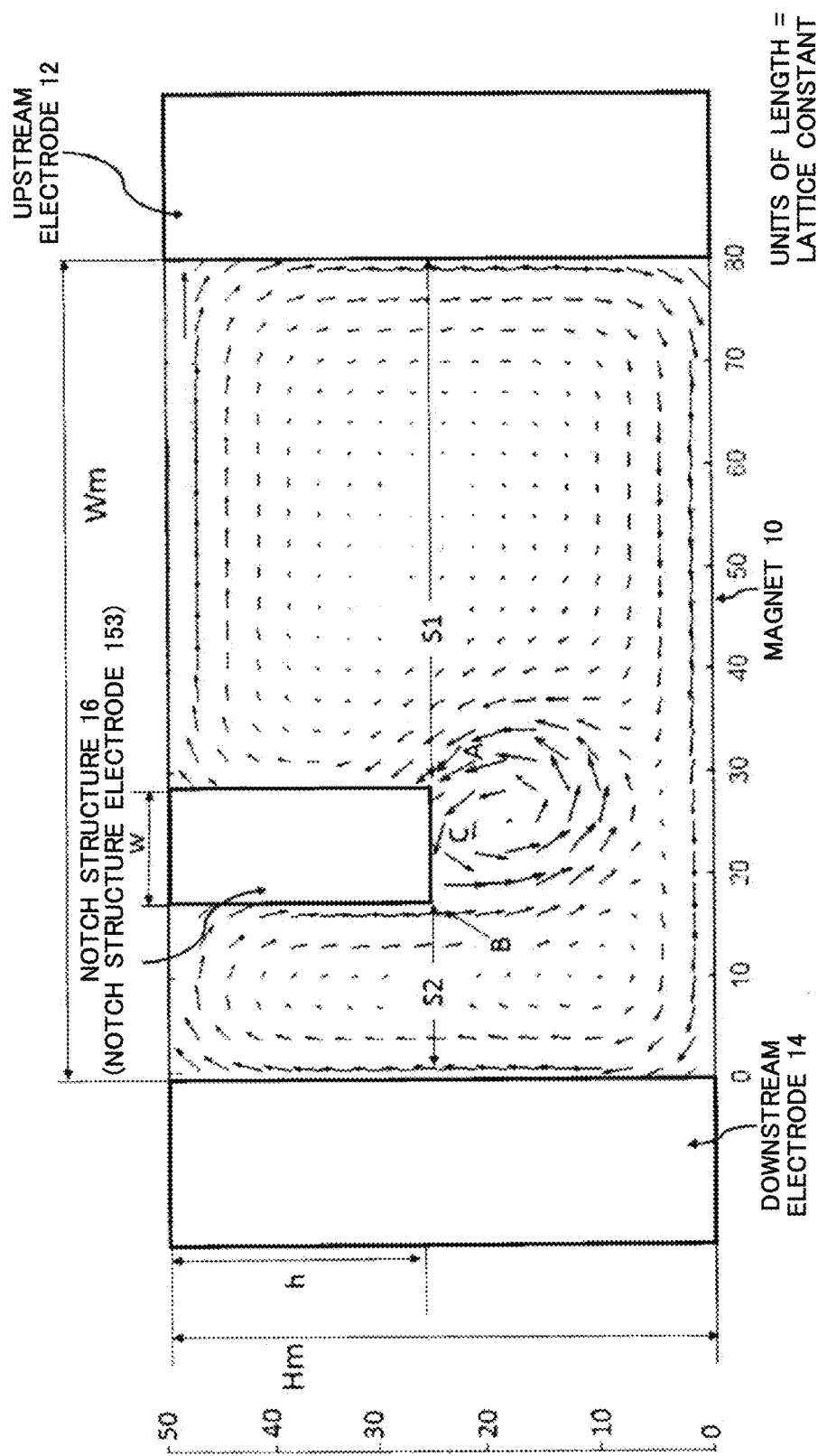
FIG. 7G shows the results of simulating the magnetic moments of the magnet 10 at the time t=1120 psec, or when the pulse current fed to the magnet 10 to flow from the downstream electrode 14 to the upstream electrode 12 to erase one skyrmion is turned off.

FIG. 7G shows the results of simulating the magnetic moments of the magnet 10 observed at the time t=1120 psec, or when the pulse current to erase a skyrmion fed to the magnet 10 to flow from the downstream electrode 14 to the upstream electrode 12 is turned off. The skyrmion 40 is absorbed into the bottom portion of the notch structure 16.

At the time t=1120 psec, the current to erase a skyrmion is turned off. Although the current to erase a skyrmion is turned off, the skyrmion 40 still keeps moving due to its inertia.

Figure 7H:
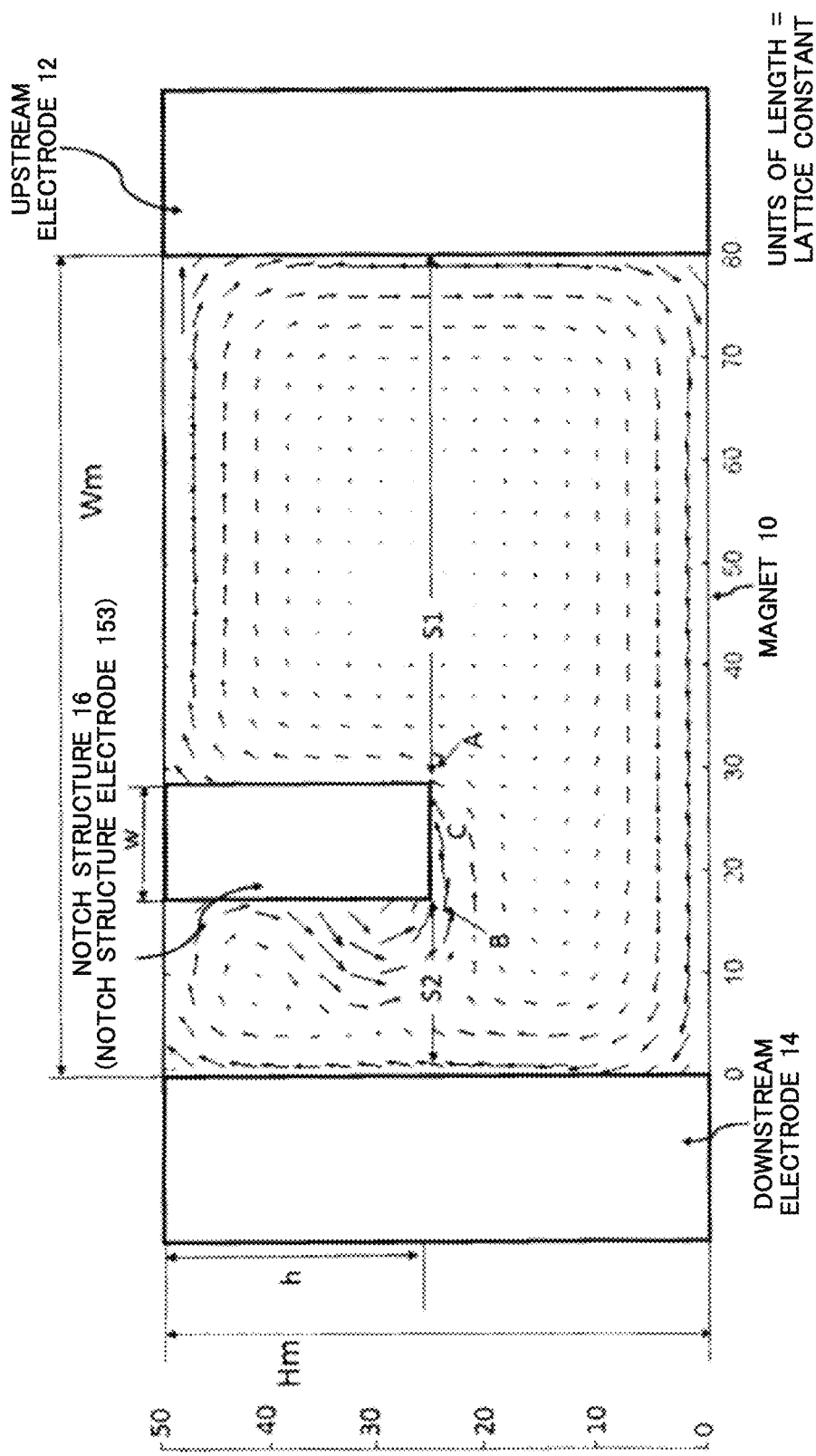
FIG. 7H shows the results of simulating the magnetic moments of the magnet 10 at the time t=1180 psec, or after the pulse current fed to the magnet 10 to flow from the downstream electrode 14 to the upstream electrode 12 to erase one skyrmion is turned off.
Figure 7I:
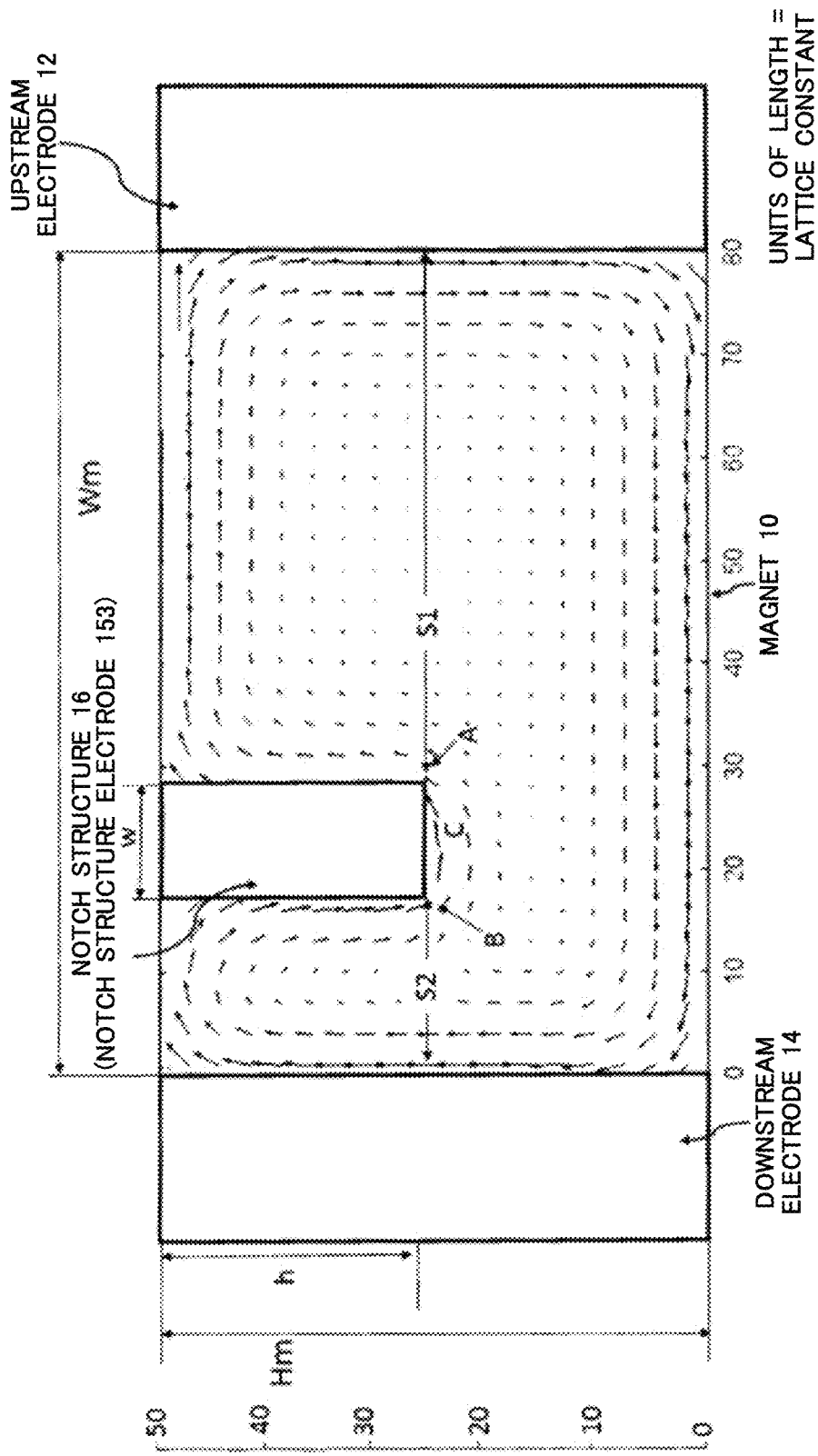
FIG. 7I shows the results of simulating the magnetic moments of the magnet 10 at the time t=1360 psec, or after the pulse current fed to the magnet 10 to flow from the downstream electrode 14 to the upstream electrode 12 to erase one skyrmion is turned off.

FIG. 7H shows the results of simulating the magnetic moments of the magnet 10 at the time t=1180 psec, or after the pulse current to erase a skyrmion fed to the magnet 10 to flow from the downstream electrode 14 to the upstream electrode 12 is turned off. As shown in FIG. 7H, the skyrmion 40 passes along the left side of the notch structure 16, but no skyrmions 40 are generated. Due to the spin transfer torque of the pulse electron flow, a force acts on the skyrmion 40 to confine the skyrmion 40 into the region between the notch structure 16 and the downstream electrode 14. The skyrmion 40 may attempt to move into this region due to its inertia even if the current to erase a skyrmion is turned off, but the size of this region does not allow the presence of the skyrmion 40. Thus, as shown in FIG. 7I, the skyrmion 40 completely disappears at the time t=1360 psec. The distance S2 between the notch structure 16 and the downstream electrode 14 is within the range of 0.4·λ>S2 and may be approximately 0.25·λ.

The time required to erase the skyrmion 40 after the pulse current to erase a skyrmion starts to be fed is 140 psec. The required current density here is $2\times10^7$ A/cm$^2$, which indicates that the skyrmion 40 can be erased with a relatively low current density.

The length h of the side of the notch structure 16 that faces the upstream electrode 12 in the magnet 10, which is shown in FIG. 6, is preferably as small as possible in order to improve the integration density, provided that the skyrmion 40 can be generated. The length h of the notch structure 16 is within the range of 0.8·λ≥h≥0.2·λ, and may be approximately 0.5·λ.

The width w of the notch structure 16 is preferably small from the perspective of microfabrication. If the width w of the notch structure 16 is too small, the magnetic moments in the vicinity of the first corner 24 do not form a vortex without application of currents. In order to generate skyrmions, the width w of the notch structure 16, 0.5·λ>w>0.2·λ.

The distance S2 between the notch structure 16 and the downstream electrode 14 needs to be λ/2 or less in order to erase the skyrmion 40. The distance S2 may be 0.25·λ. Alternatively, the distance S2 may be zero. In this case, the notch structure 16 has only one corner, which simplifies the fine processing and is thus preferable.

The size Wm of the magnet 10 is preferably as small as possible provided that the above-described conditions for the sizes of the notch structure 16 and the distances between the notch structure 16 and the electrodes are satisfied. The length Wm of the edge 18 of the magnet 10 is Wm=S1+w+S2 and may be 3·λ>Wm≥λ. In order to generate one skyrmion 40, the length Wm of the edge 18 of the magnet 10 may need to be less than 3·λ. If the length Wm is equal to or longer than 3·λ, two or more skyrmions may appear as a result of application of a long pulse current to generate a skyrmion. The length Wm may denote the straight-line distance between the upstream electrode 12 and the downstream electrode 14.

The width Hm of the edge of the magnet 10 that is connected to the upstream electrode 12 or the downstream electrode 14 may be 2·λ>Hm≥h+0.5·λ. Since h~0.5·λ, the width Hm may be approximately equal to λ. Stated differently, the width Hm may be within the range of 2·λ>Hm≥λ. If the width Hm is smaller than λ, the skyrmion 40 cannot be generated. This range is suitable for achieving an appropriate distribution of electron polarization flows to allow one skyrmion to be generated. Note that the current to erase a skyrmion may have the opposite sign to the current to generate a skyrmion and be small.

The above-described design rules for the memory cell are summarized in the following.

(Rule 1) The width Wm of the cell falls within the following range.

$$3 \cdot \lambda > Wm \geq \lambda$$

(Rule 2) The height Hm of the cell falls within the following range.

$$2 \cdot \lambda > Hm \geq \lambda$$

(Rule 3) The distance S1 between the notch structure 16 and the upstream electrode 12 falls within the following range.

$$2 \cdot \lambda > S1 \geq 0.5 \cdot \lambda$$

(Rule 4) The width w of the notch structure 16 falls within the following range.

$$0.5 \cdot \lambda > w > 0.2 \cdot \lambda$$

(Rule 5) The length h of the notch structure 16 falls within the following range and may be preferably approximately 0.5·λ.

$$0.8 \cdot \lambda \geq h \geq 0.2 \cdot \lambda$$

(Rule 6) The distance S2 between the notch structure 16 and the downstream electrode 14 falls within the following range and may be preferably approximately 0.25·λ.

$$0.4 \cdot \lambda > S2$$

(Rule 7) The minimum duration of the application of the pulse current to generate one skyrmion may be substantially 10 picoseconds.

(Rule 8) The minimum duration of the application of the pulse current to erase one skyrmion may be substantially 100 picoseconds.

(Rule 9) The current to erase a skyrmion may have the opposite sign to the current to generate a skyrmion and be small.

Second Embodiment

The chiral magnet used in the present embodiment has a Gilbert damping constant α=0.04. In a second embodiment, the Gilbert damping constant is smaller than in the first embodiment. Except for this, no rules are changed.

Figure 8:
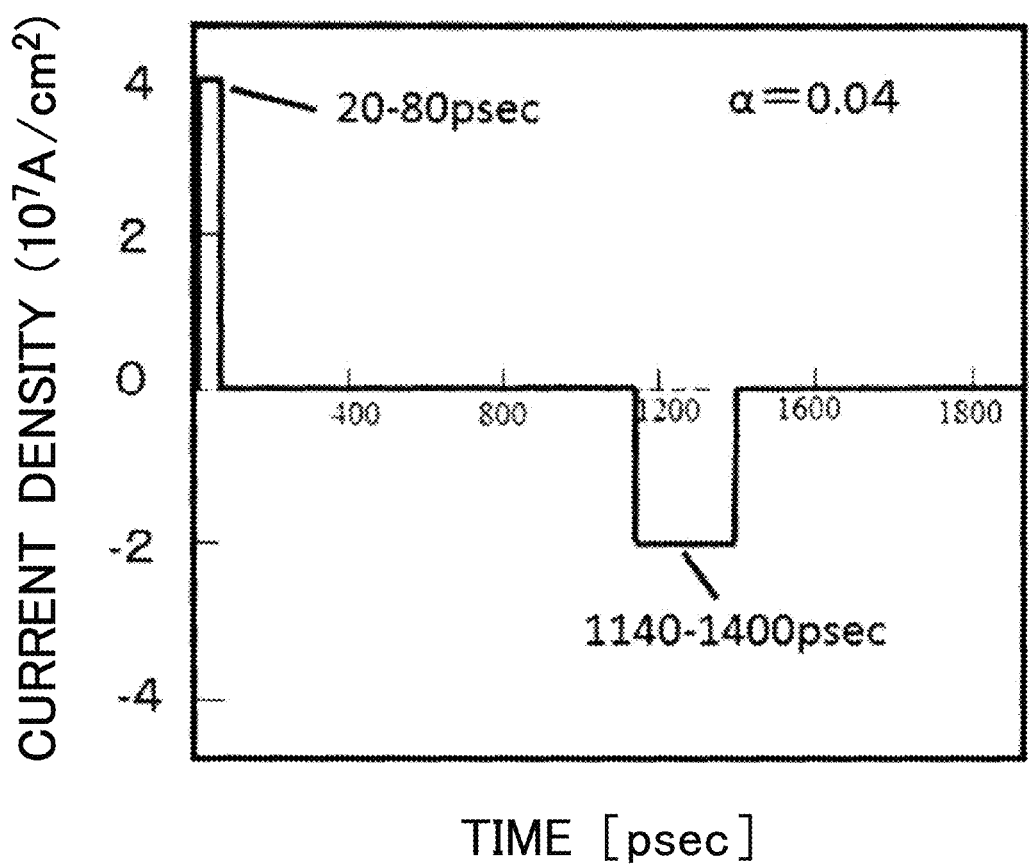
FIG. 8 shows how to apply pulse currents to the magnet 10 to flow from the upstream electrode 12 to the downstream electrode 14 in simulations of a second embodiment ($\alpha=0.04$).

FIG. 8 shows how the current density of the currents supplied to the magnet 10 to flow from the upstream electrode 12 to the downstream electrode 14 in simulations is dependent on the time. FIG. 8 shows a pulse current to generate the skyrmion 40 that is applied between the time t=20 psec and the time t=80 psec and a pulse current to erase the skyrmion 40 that is applied between the time t=1140 psec and the time t=1400 psec. The current density is zero except while the pulse current to generate a skyrmion and the pulse current to erase a skyrmion are applied. The pulse current to generate a skyrmion and the pulse current to erase a skyrmion flow in different directions as shown in FIG. 8. The pulse current to generate a skyrmion and the pulse current to erase a skyrmion have the same current density levels as in the first embodiment.

Figure 9:
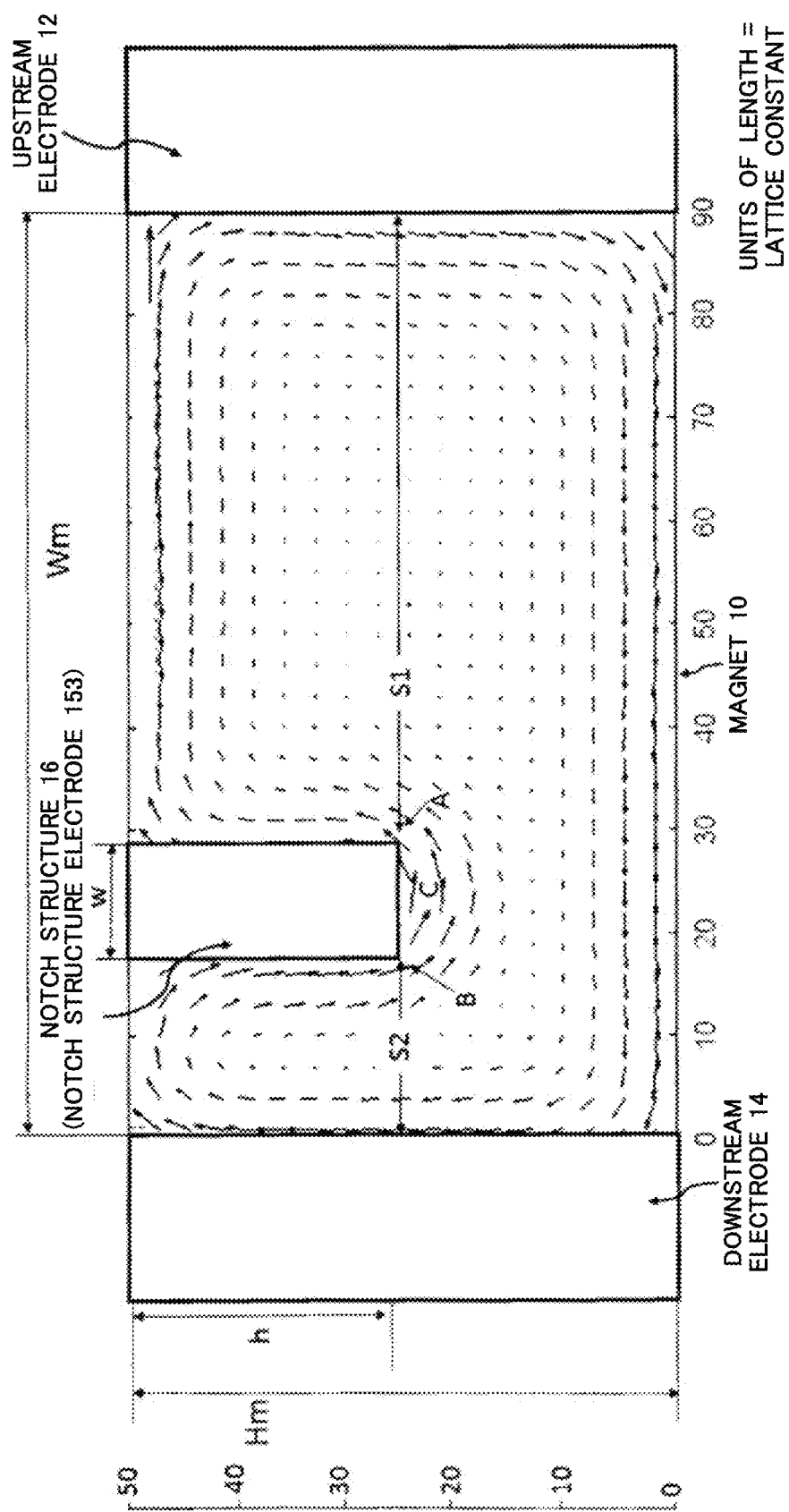
FIG. 9 shows a simulated size of the magnet 10 and the size of a notch structure 16 in the second embodiment.

FIG. 9 shows a magnet 10 that is used in the simulations and has a notch structure 16 and an notch structure electrode 153. The magnet 10 is shaped as a rectangle having a width Wm in the x direction and a height of Hm in the y direction. In the present example, the magnet 10 has a size Wm×Hm=90×50 in units of the lattice constant a of the magnet 10.

The distance S1 between the upstream electrode 12 and the notch structure 16 is set as S1=62. Except the parameter S1, the parameters have the same values as in the first embodiment. FIG. 9 uses the arrows to show the magnetic moments observed at the time t=0 psec. FIG. 10A to FIG. 10I shows the results of the simulations.

Figure 10A:
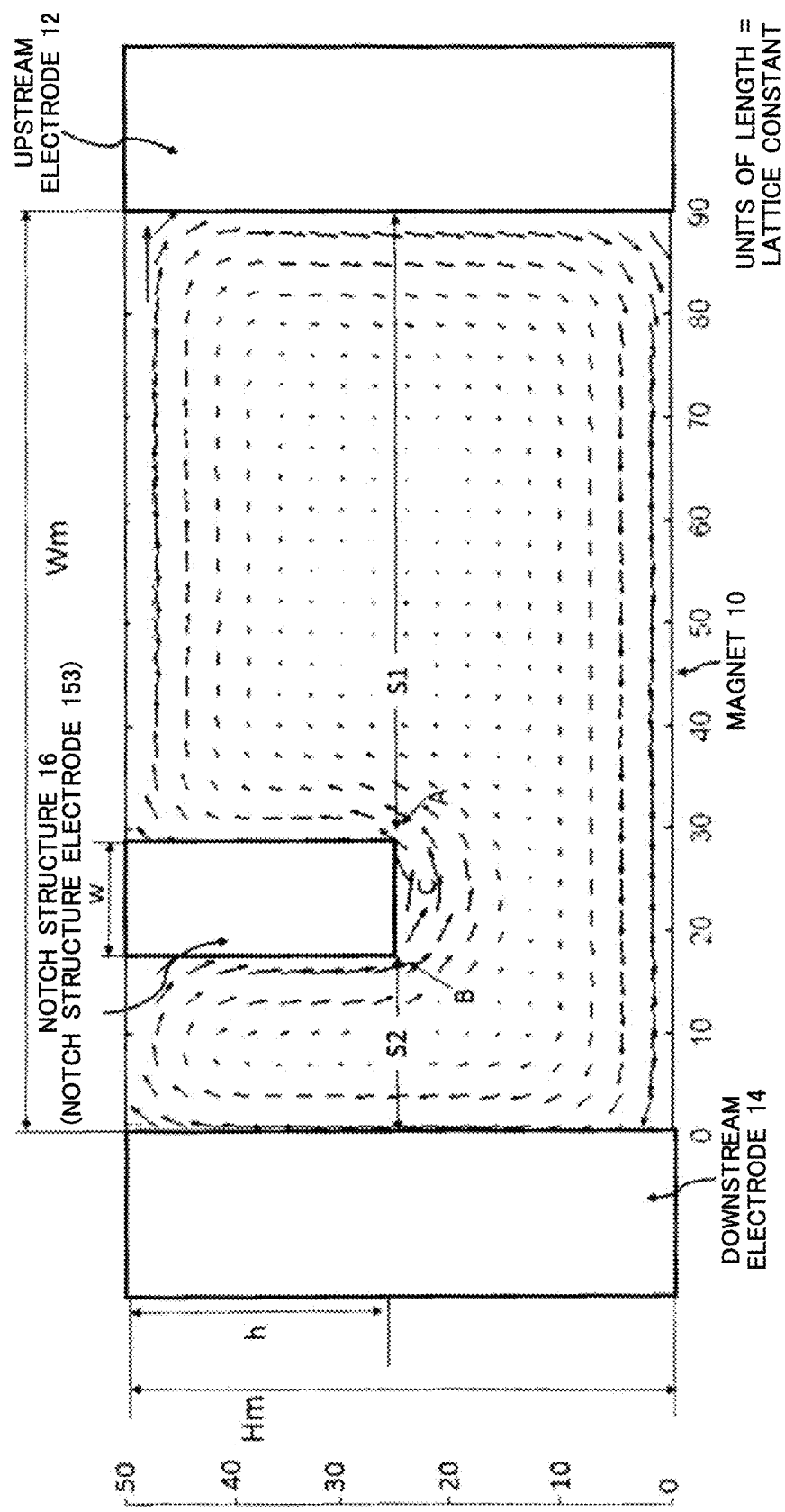
FIG. 10A shows the results of simulating the magnetic moments of the magnet 10 at the time t=20 psec, at which a pulse current starts to be fed to the magnet 10 to flow from the upstream electrode 12 to the downstream electrode 14 to generate one skyrmion.

FIG. 10A shows the results of simulating the magnetic moments of the magnet 10 at the time t=20 psec, at which the pulse current to generate a skyrmion starts to be fed to the magnet 10 to flow from the upstream electrode 12 to the downstream electrode 14. The skyrmion 40 is in the initial state.

Figure 10B:
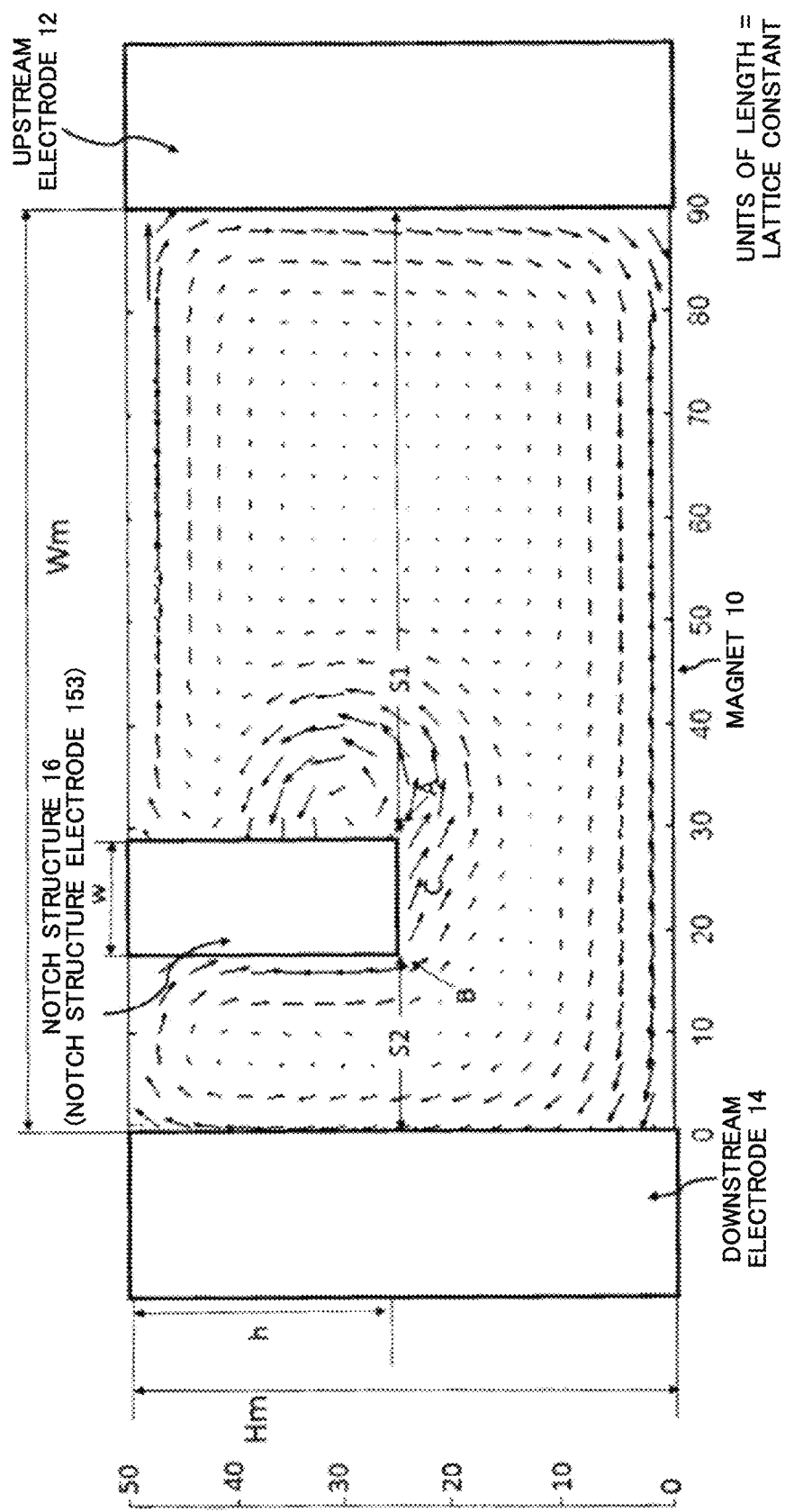
FIG. 10B shows the results of simulating the magnetic moments of the magnet 10 at the time t=60 psec, at which the pulse current to generate a skyrmion is being fed to the magnet 10 to flow from the upstream electrode 12 to the downstream electrode 14.

FIG. 10B shows the results of simulating the magnetic moments of the magnet 10 observed at the time t=60 psec, at which the pulse current to generate a skyrmion is being fed to the magnet 10 to flow from the upstream electrode 12 to the downstream electrode 14. The skyrmion 40 appears from the vertex A.

Figure 10C:
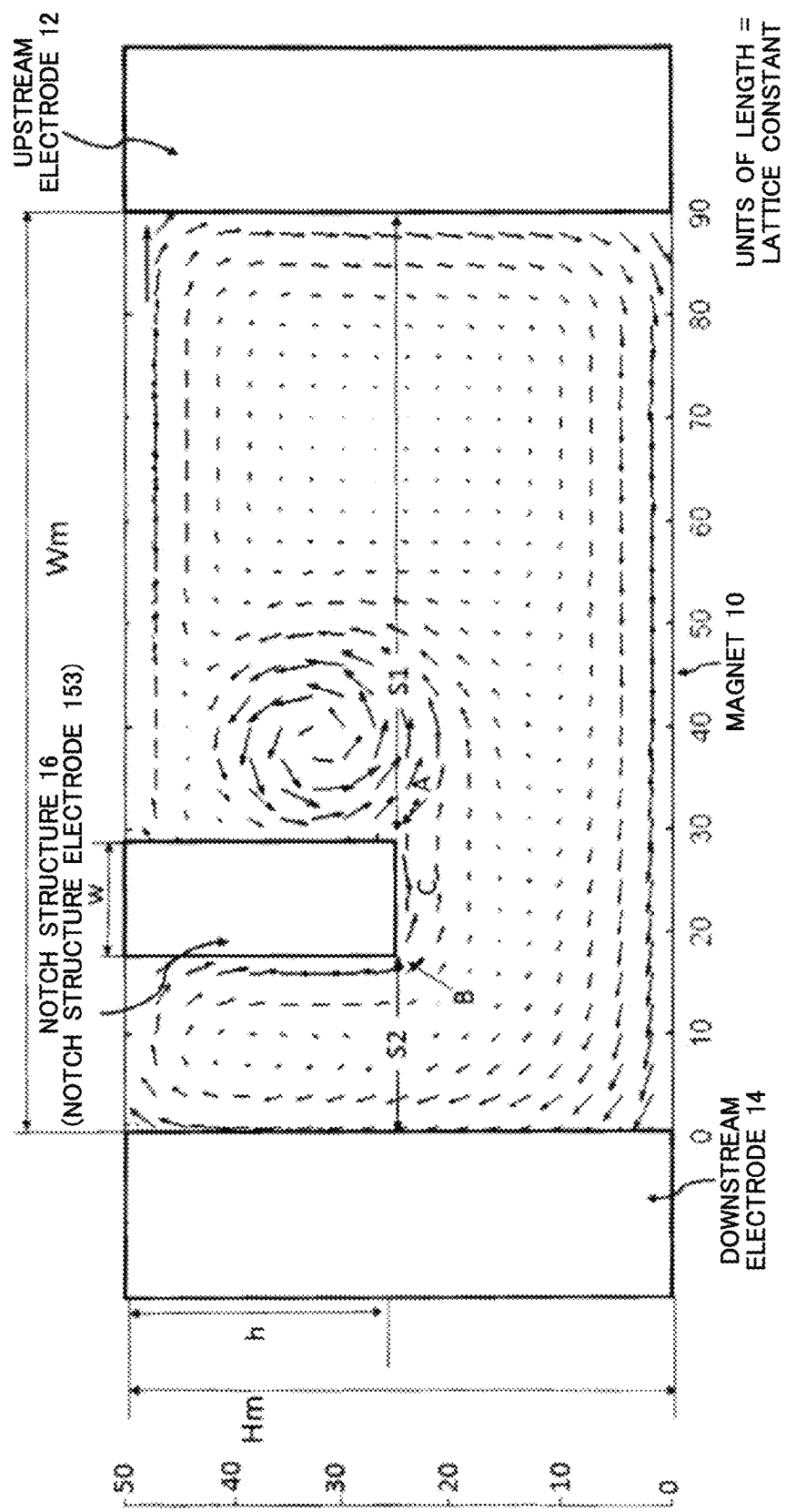
FIG. 10C shows the results of simulating the magnetic moments of the magnet 10 at the time t=80 psec, at which the pulse current to generate a skyrmion fed to the magnet 10 to flow from the upstream electrode 12 to the downstream electrode 14 is turned off.

FIG. 10C shows the results of simulating the magnetic moments of the magnet 10 observed at the time t=80 psec, at which the pulse current to generate a skyrmion fed to the magnet 10 to flow from the upstream electrode 12 to the downstream electrode 14 is turned off. The skyrmion 40 that has appeared from the vertex A can be clearly seen. After a while, the skyrmion 40 moves toward the upstream electrode 12 as if it leaves the first corner 24 of the notch structure 16. At this timing, the pulse current to generate a skyrmion is turned off.

Figure 10D:
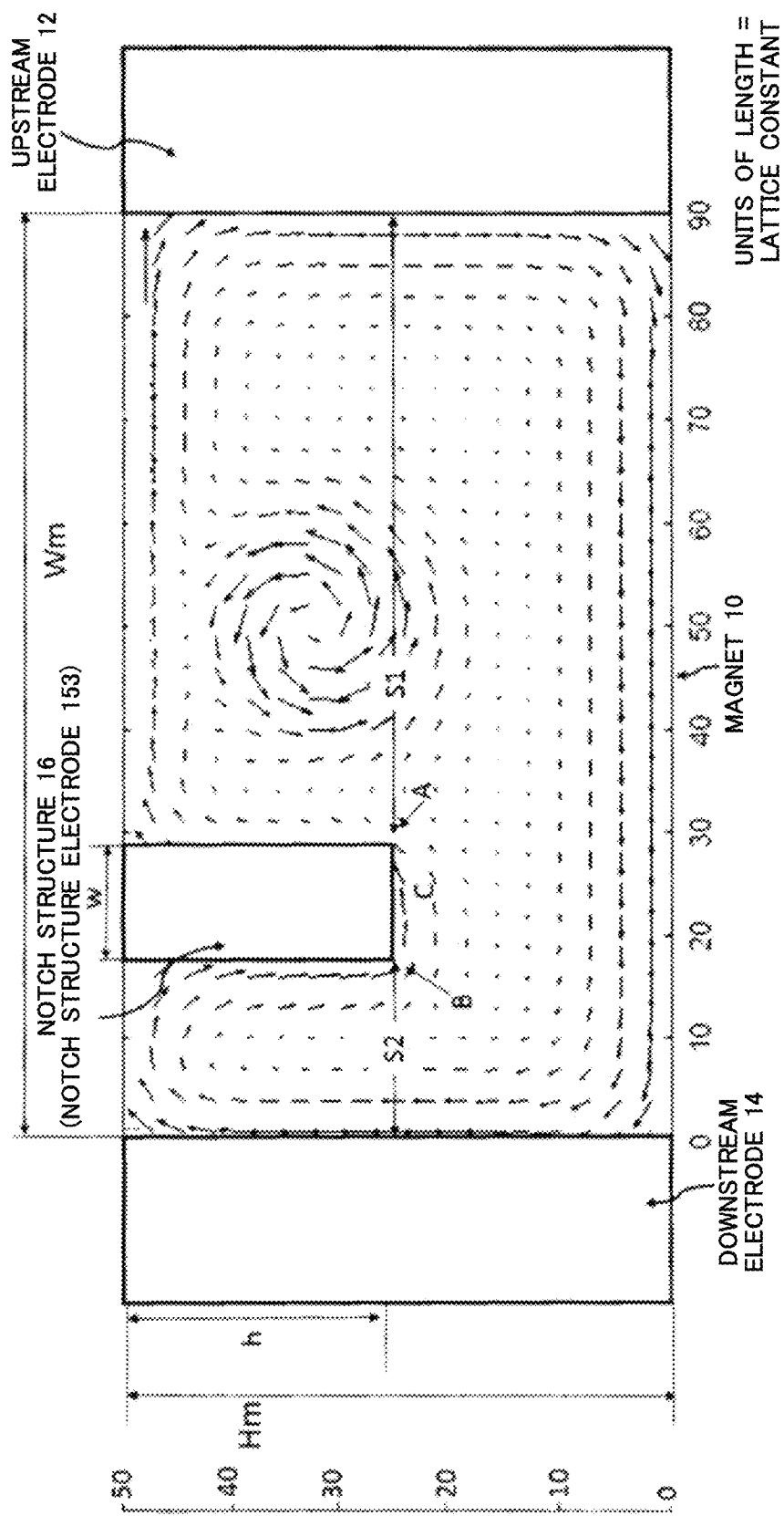
FIG. 10D shows the results of simulating the magnetic moments of the magnet 10 at the time t=960 psec, or after the pulse current to generate a skyrmion fed to the magnet 10 to flow from the upstream electrode 12 to the downstream electrode 14 is turned off.

FIG. 10D shows the results of simulating the magnetic moments of the magnet 10 at the time t=960 psec, or after the pulse current to generate a skyrmion fed to the magnet 10 to flow from the upstream electrode 12 to the downstream electrode 14 is turned off. The skyrmion 40 is stabilized between the notch structure 16 and the upstream electrode 12. The period of time from when the pulse current to generate a skyrmion is turned off to when the skyrmion 40 is stabilized is approximately 880 psec.

The following describes the results of the simulation experiments in which the pulse current to erase a skyrmion of the opposite (negative) direction is supplied between the upstream electrode 12 and the downstream electrode 14 in order to erase the skyrmion 40. As shown in FIG. 8, the current level is zero for the duration of 1020 psec after the pulse current to generate a skyrmion stops, and the pulse current to erase a skyrmion starts to be supplied at the time t=1140 psec.

Figure 10E:
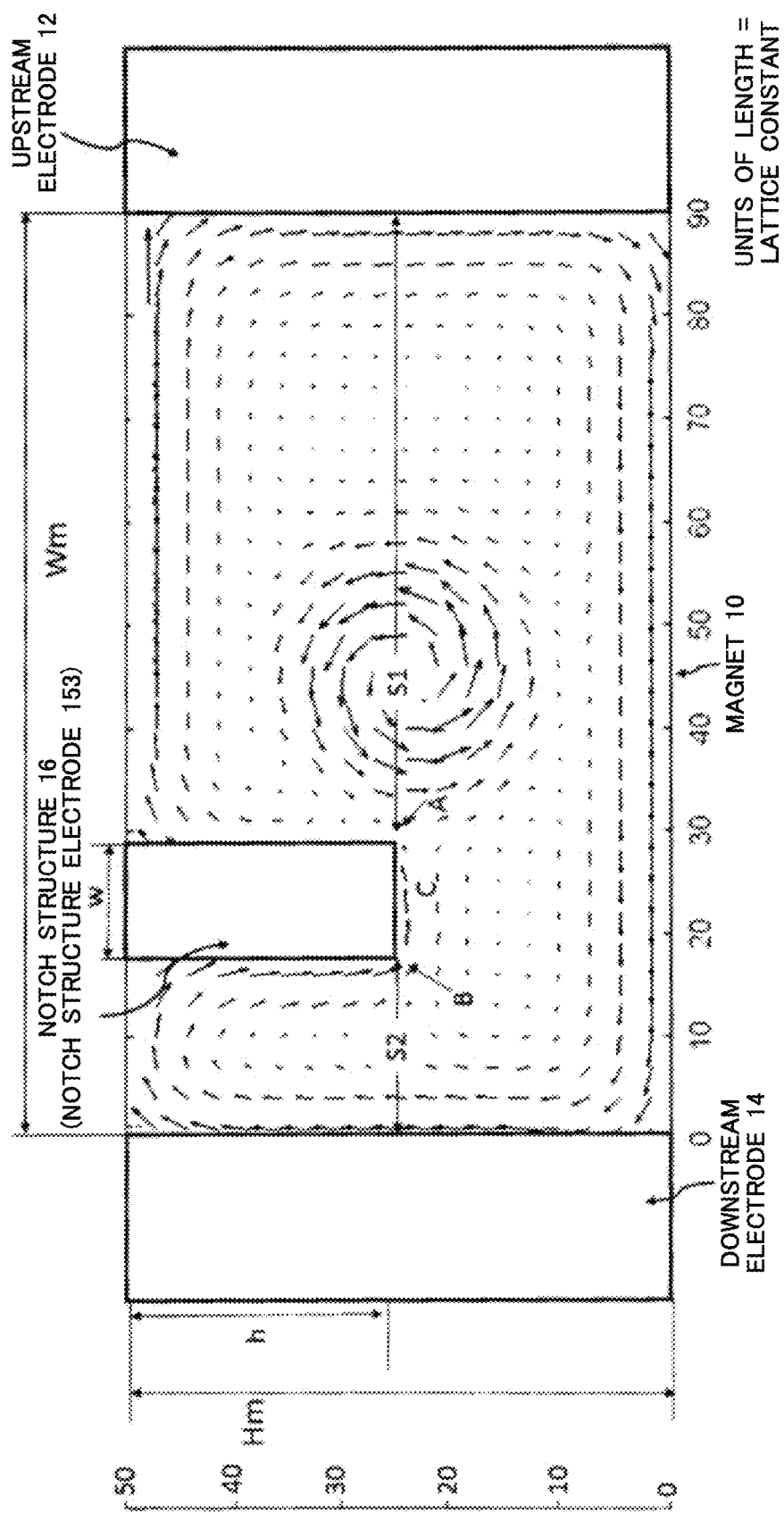
FIG. 10E shows the results of simulating the magnetic moments of the magnet 10 observed at the time t=1300 psec, or immediately after a pulse current to erase a skyrmion starts to be fed to the magnet 10 to flow from the downstream electrode 14 to the upstream electrode 12.

FIG. 10E shows the results of simulating the magnetic moments of the magnet 10 at the time t=1300 psec, or immediately after the pulse current to erase a skyrmion starts to be fed to the magnet 10 to flow from the downstream electrode 14 to the upstream electrode 12. As shown in FIG. 5, the current density of the pulse current to erase a skyrmion is $2 \times 10^7$ A/cm$^2$. The pulse current to erase a skyrmion supplies the pulse electron flow in the opposite direction to the pulse current to generate a skyrmion. The pulse electron flow causes the skyrmion 40 to move toward the downstream electrode 14.

Figure 10F:
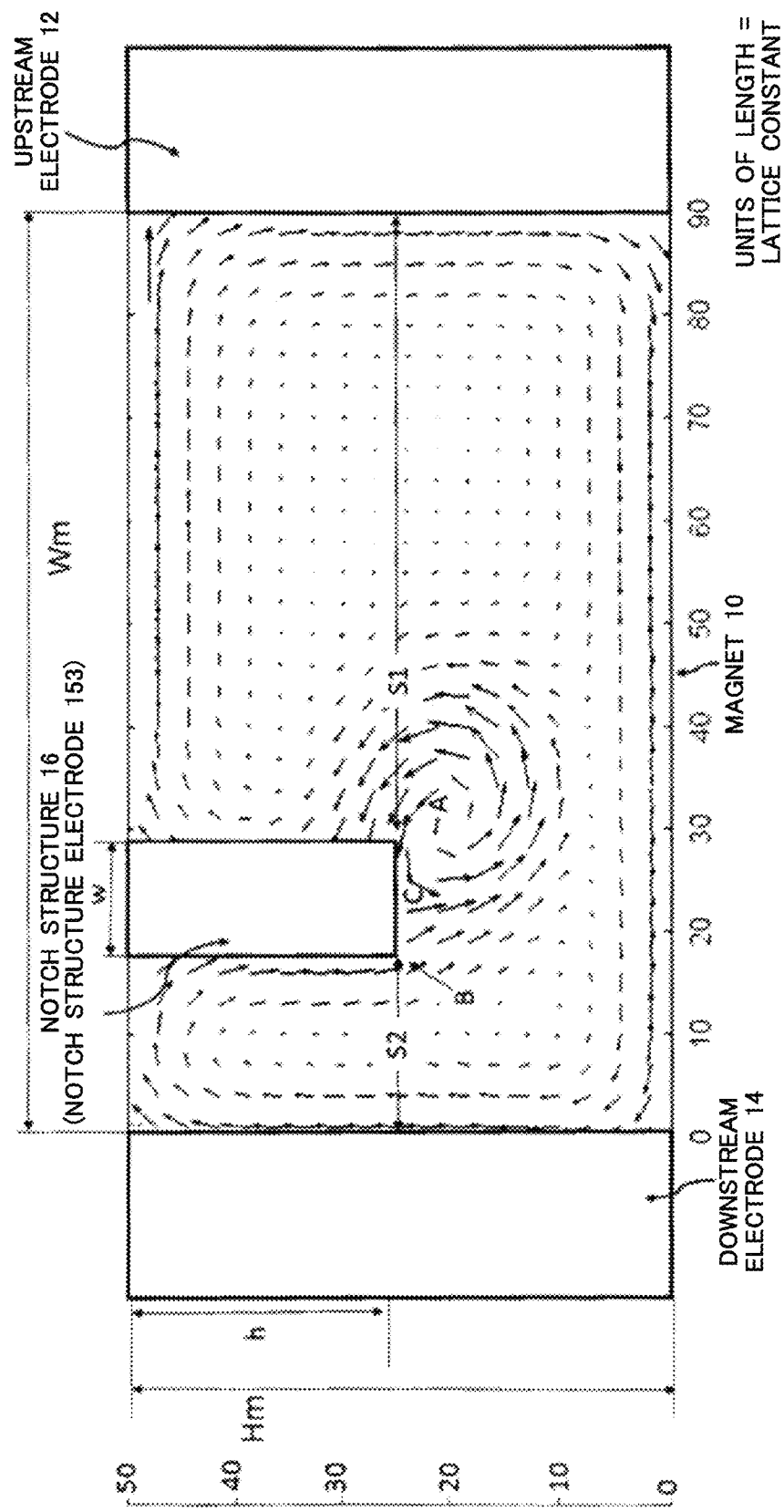
FIG. 10F shows the results of simulating the magnetic moments of the magnet 10 at the time t=1380 psec, or immediately before the pulse current to erase a skyrmion fed to the magnet 10 to flow from the downstream electrode 14 to the upstream electrode 12 is turned off.

FIG. 10F shows the results of simulating the magnetic moments of the magnet 10 at the time t=1380 psec, or immediately before the pulse current to erase a skyrmion fed to the magnet 10 to flow from the downstream electrode 14 to the upstream electrode 12 is turned off. The pulse electron flow causes the skyrmion 40 to come into contact with the vertex A of the notch structure 16.

Figure 10G:
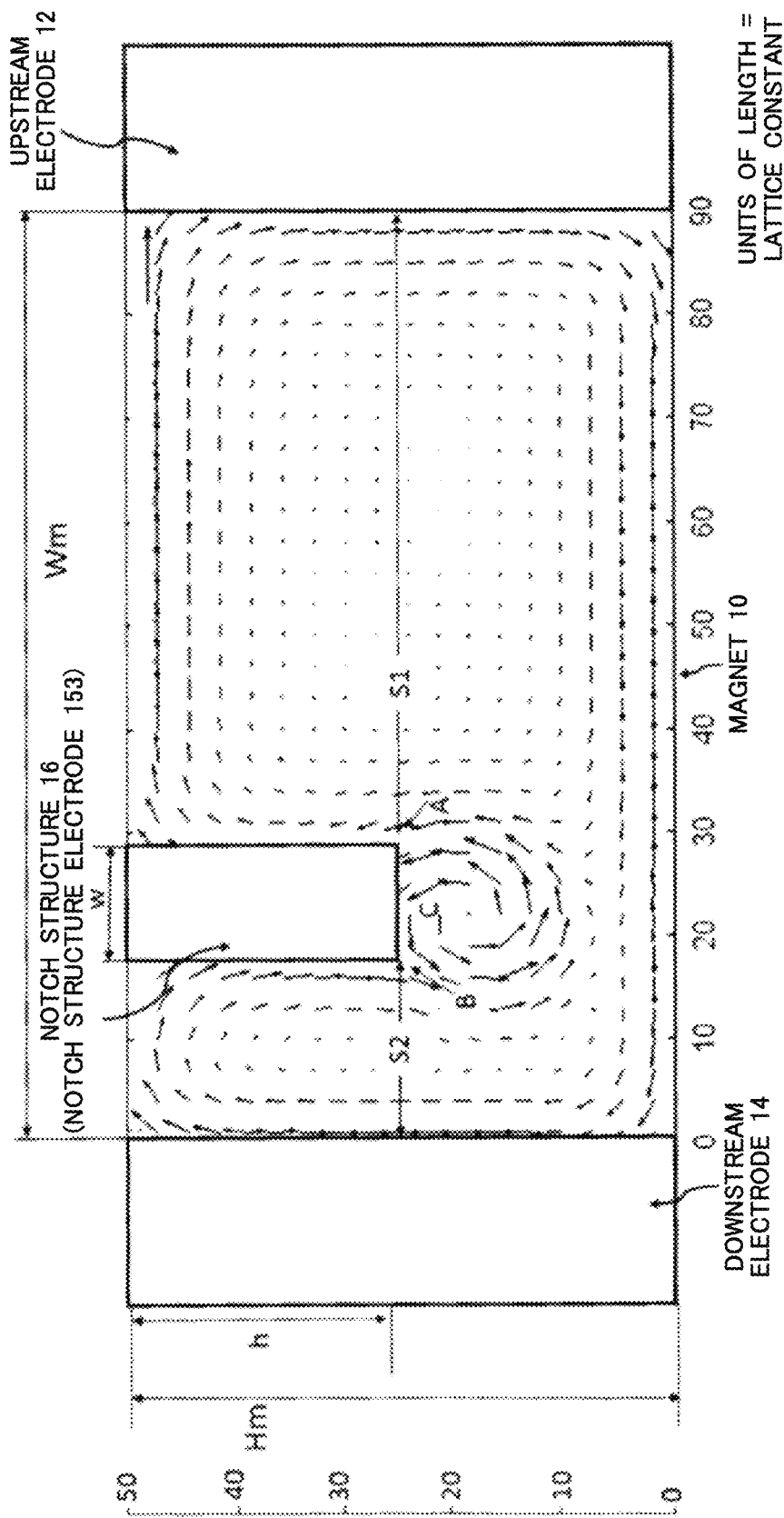
FIG. 10G shows the results of simulating the magnetic moments of the magnet 10 at the time t=1400 psec, at which the pulse current to erase a skyrmion fed to the magnet 10 to flow from the downstream electrode 14 to the upstream electrode 12 is turned off.

FIG. 10G shows the results of simulating the magnetic moments of the magnet 10 at the time t=1400 psec, at which the pulse current to erase a skyrmion fed to the magnet 10 to flow from the downstream electrode 14 to the upstream electrode 12 is turned off. The skyrmion 40 is absorbed into the bottom portion of the notch structure 16. At the time t=1400 psec, the current to erase a skyrmion is turned off. Although the current to erase a skyrmion is turned off, the skyrmion 40 still keeps moving due to its inertia.

Figure 10H:
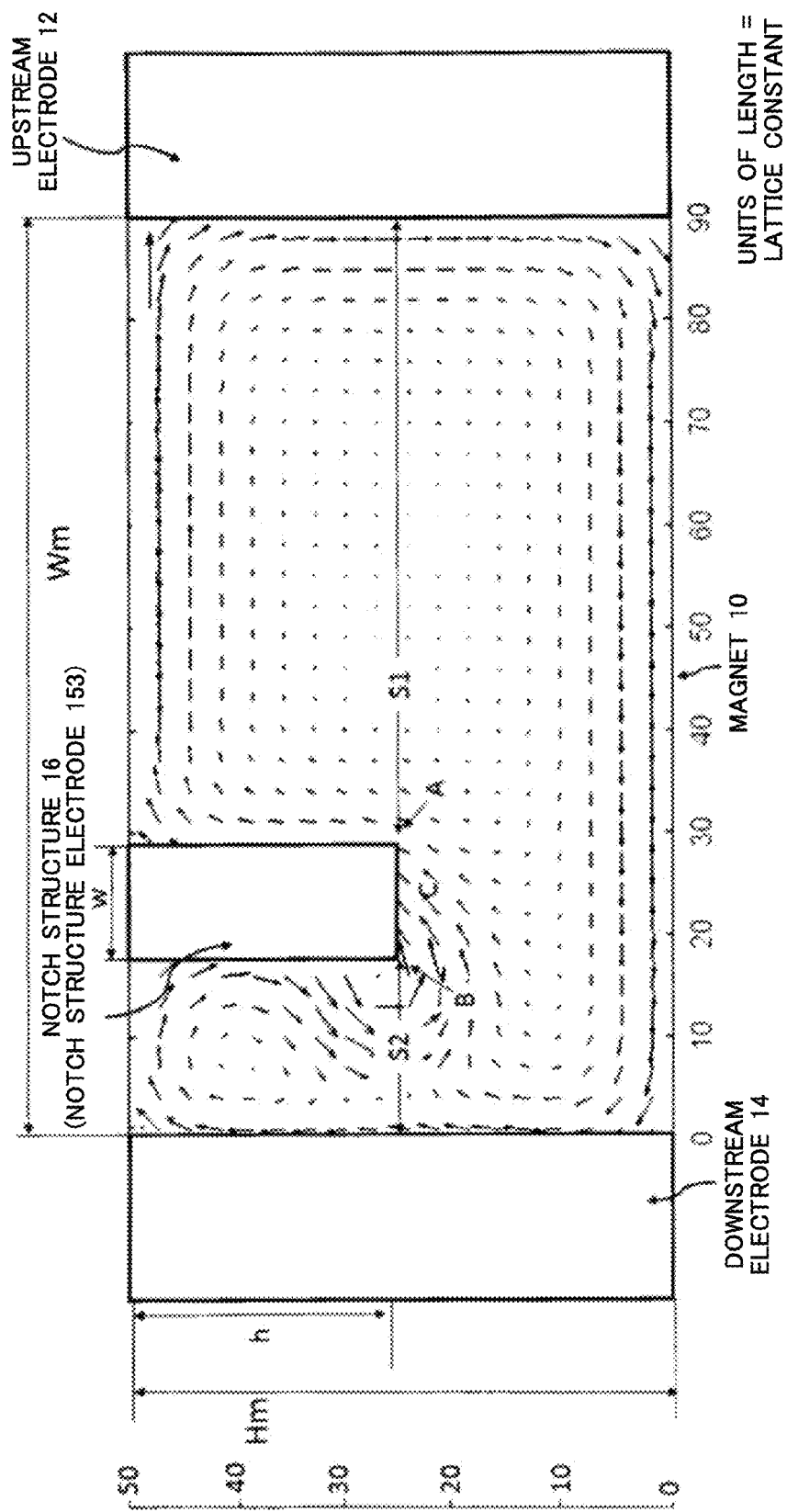
FIG. 10H shows the results of simulating the magnetic moments of the magnet 10 at the time t=1440 psec, or after the pulse current to erase a skyrmion fed to the magnet 10 to flow from the downstream electrode 14 to the upstream electrode 12 is turned off.
Figure 10I:
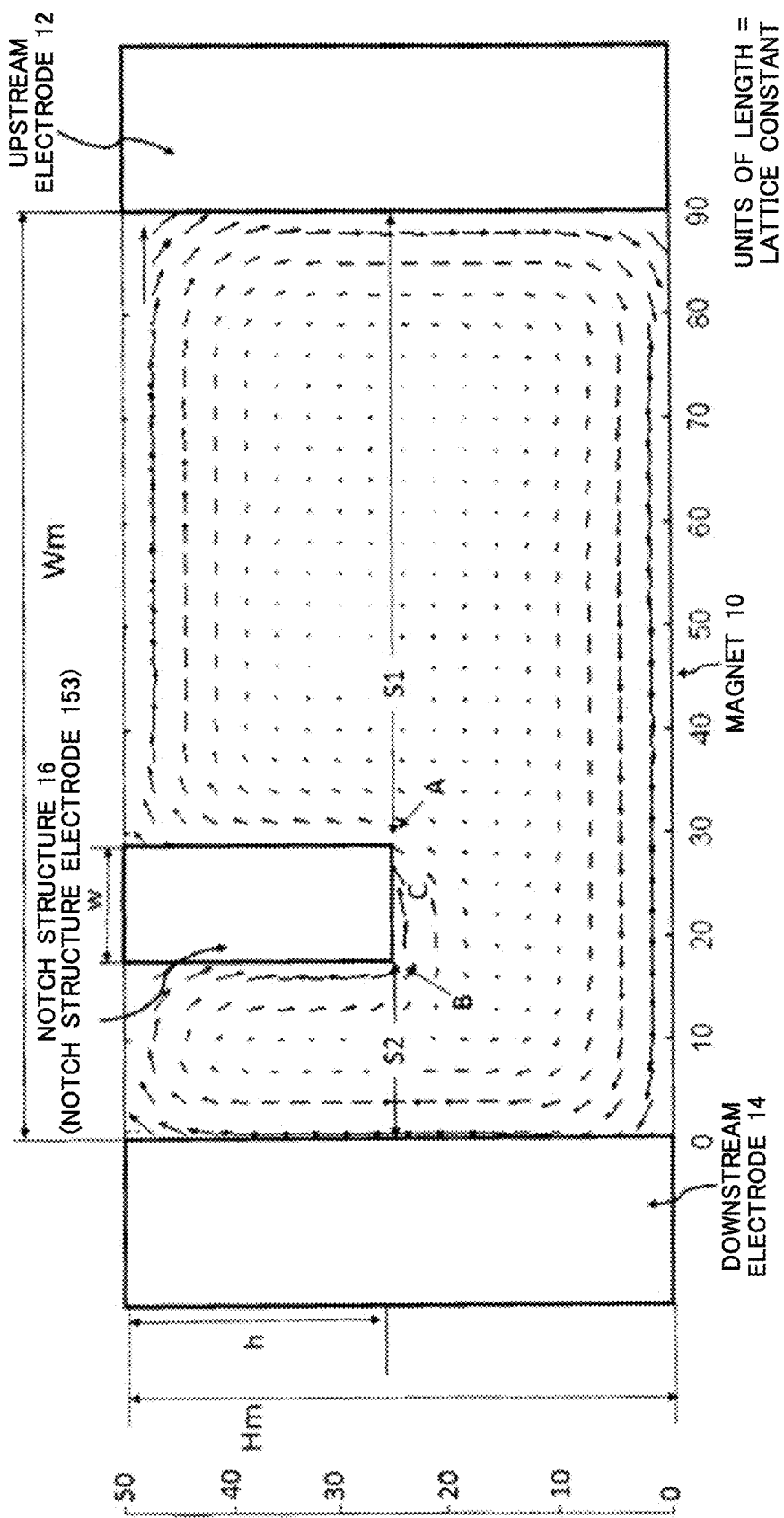
FIG. 10I shows the results of simulating the magnetic moments of the magnet 10 at the time t=1620 psec, or after the pulse current to erase a skyrmion fed to the magnet 10 to flow from the downstream electrode 14 to the upstream electrode 12 is turned off.

FIG. 10H shows the results of simulating the magnetic moments of the magnet 10 at the time t=1440 psec, or after the pulse current to erase a skyrmion fed to the magnet 10 to flow from the downstream electrode 14 to the upstream electrode 12 is turned off. As shown in FIG. 10H, the skyrmion 40 passes along the left side of the notch structure 16, but no skyrmions 40 are generated. Due to the spin transfer torque of the pulse electron flow, a force acts on the skyrmion 40 to confine the skyrmion 40 into the region between the notch structure 16 and the downstream electrode 14. The skyrmion 40 may attempt to move into this region due to its inertia even if the current to erase a skyrmion is turned off, but the size of this region does not allow the presence of the skyrmion 40. Thus, as shown in FIG. 10I, the skyrmion 40 completely disappears at the time t=1620 psec.

The time required to erase the skyrmion 40 after the pulse current to erase a skyrmion starts to flow is 260 psec. The required current density here is $2 \times 10^7$ A/cm$^2$, which indicates that the skyrmion 40 can be erased with a relatively low current density.

The above has described the results of the simulations of the generation and erasure of the skyrmion 40 using currents when the Gilbert damping constant $\alpha=0.04$. The pulse current to generate a skyrmion lasts for 60 psec and the pulse current to erase a skyrmion lasts for 260 psec, and both of them may be an extremely short pulse. When the Gilbert damping constant $\alpha=0.04$, the size of the magnet may be 90 or approximately 10% larger than the size of the magnet having a Gilbert damping constant $\alpha=0.08$, which is 80. If the Gilbert damping constant is small, the generated skyrmion 40 may disappear into the notch structure. Therefore, the distance S1 needs to exceed a predetermined size. The duration of the pulse current to generate a skyrmion is the same. The duration of the pulse current to erase a skyrmion slightly increases from 140 psec to 260 psec. The design rules are the same between the first embodiment and the second embodiment.

The above has described the results of the simulations of the generation and erasure of the skyrmion 40 using currents. The pulse current to generate a skyrmion may last for 60 psec and the pulse current to erase a skyrmion may last for 140 to 200 psec, and both of them may be an extremely short pulse. No currents are particularly needed for the skyrmion 40 to be stabilized after the application of the pulse current to generate a skyrmion and the pulse current to erase a skyrmion, and the skyrmion 40 moves on its own to the potential-stable position. Therefore, it is not necessary to take time for the stabilization. The writing or erasing period for the next magnetic medium may immediately start. The above-described periods of time required to generate and erase skyrmions in skyrmion sensors indicate that the skyrmion sensors can allow information to be written and erased at higher rates than SRAM, which currently has the highest rate of 2 nsec. Since DRAM requires approximately 20 nsec, the skyrmion memory may operate two orders of magnitude faster. Since SRAM and DRAM memories are volatile, the information stored on the SRAM and DRAM memories are instantly lost once the power is turned off. Skyrmion memories are non-volatile memories using magnetic moments. According to the above description, the feasibility of the dreamlike non-volatile high-speed memory becomes dramatically rises.

The above-described memory cell design rules do not need to be changed whether the memory cell is constituted by a dipole magnet, a frustrated magnet or a layered structure including a magnetic material and a non-magnetic material Once the materials of the memory cell are known, the skyrmion diameter $\lambda$ can be determined. If the value of the parameter $\lambda$ is determined, the above design rules can be applied.

As described above, the innovations herein can provide the best ways to generate and erase skyrmions using currents and thus provide high-speed memory of low power consumption. Accordingly, the innovations herein can be expected to significantly assist the application of skyrmion sensors, skyrmion memories using the skyrmion sensors, skyrmion-memory embedded CMOS-LSI devices, and, personal computers, data storage media, data storage apparatuses and data communication apparatuses having skyrmion memories embedded therein.

A skyrmion has a diameter of 1 to 500 nm and thus is an extremely small structure having a nanoscale size. The skyrmion can be used as a large-capacity memory magnetic element that can store an enormous amount of bit information at an extremely high density.

A skyrmion memory is a non-volatile magnetic memory that can be used as a memory capable of storing and erasing information at high speed and is expected to be used as a non-volatile memory in place of DRAM and high-speed SRAM memories, which are currently used to perform operations on information. The innovations herein can provide the best ways to generate and erase skyrmions using currents. This achievement particularly contributes greatly to the feasibility of these goals.

Figure 11:
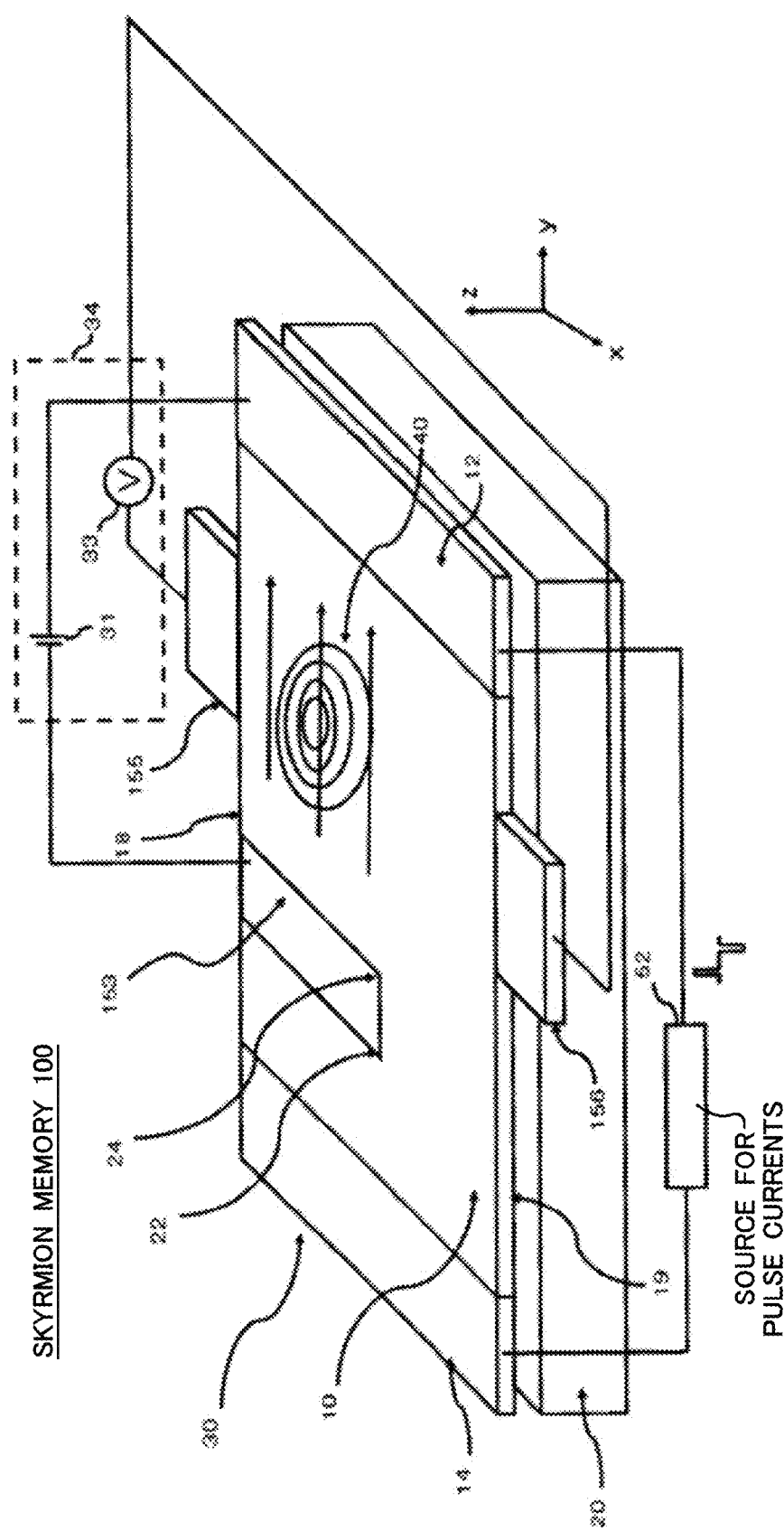
FIG. 11 shows another exemplary structure of the skyrmion memory 100.

FIG. 11 is a schematic view showing another exemplary structure of the skyrmion memory 100. In the present example, the skyrmion memory 100 detects whether the skyrmion 40 is present or absent by detecting the Hall voltage. In the present example, the skyrmion memory 100 has the same structure as the skyrmion memory 100 relating to the embodiments shown in FIGS. 3A and 3B, except for the skyrmion sensor 15 (the reference number is not shown in FIG. 11) and the measuring unit 34. In the present example, the skyrmion sensor 15 further includes a first electrode 155 and a second electrode 156, which are formed by electrodes, in addition to the constituents of the skyrmion sensor 15 shown in FIG. 3A or 3B (i.e., the notch structure electrode 153 and the upstream electrode 12). The first electrode 155 and the second electrode 156 may be made of the same material or different materials.

The first electrode 155 is formed by an electrode that is in contact with the magnet 10 in the spreading direction of the magnet 10 at the edge 18 of the magnet 10 between the upstream electrode 12 and the notch structure electrode 153. The first electrode 155 is spaced away from both of the notch structure electrode 153 and the upstream electrode 12. The second electrode 156 is formed by an electrode that is spaced away from the first electrode 155, in contact with the magnet 10 in the spreading direction of the magnet 10 at the edge 19 of the magnet 10 facing away from the first electrode 155. The second electrode 156 is spaced away from both of the upstream electrode 12 and the downstream electrode 14.

The first electrode 155 and the second electrode 156 are arranged adjacent to each other in a direction perpendicular to the direction in which the upstream electrode 12 and the notch structure electrode 153 are arranged adjacent to each other. In the present example, the upstream electrode 12 and the notch structure electrode 153 are arranged to be adjacent to each other in the y-axis direction, and the first electrode 155 and the second electrode 156 are arranged adjacent to each other in the x-axis direction. When currents are supplied between the upstream electrode 12 and the notch structure electrode 153 to generate and erase the skyrmion 40, the voltage value of the magnet 10 between the first electrode 155 and the second electrode 156 changes. Instead of measuring the voltage between the first electrode 155 and the second electrode 156, the second electrode 156 may not be used and the voltage between the first electrode 155 and the upstream electrode 12 may be measured.

In the present example, the measuring unit 34 includes the power supply 31 for measuring and a voltmeter 33. When currents are supplied between the notch structure electrode 153 and the upstream electrode 12, the Hall voltage is generated in the direction perpendicular to the current flow. The value of the Hall voltage is determined by whether the skyrmion 40 is present or absent. FIG. 11 uses the arrows to show the pulse electron flow observed when the currents are supplied between the notch structure electrode 153 and the upstream electrode 12. The voltmeter 33 measures the voltage value of the magnet 10 between the first electrode 155 and the second electrode 156. The measuring unit 34 detects the signal indicative of "1" or "0" by detecting the difference in Hall voltage value caused by whether the skyrmion 40 is present or absent and is a direct-type measuring unit. The method of detecting the skyrmion 40 relating to the present embodiment is highly sensitive since one of the Hall voltage levels that are compared against each other is low.

Figure 12:
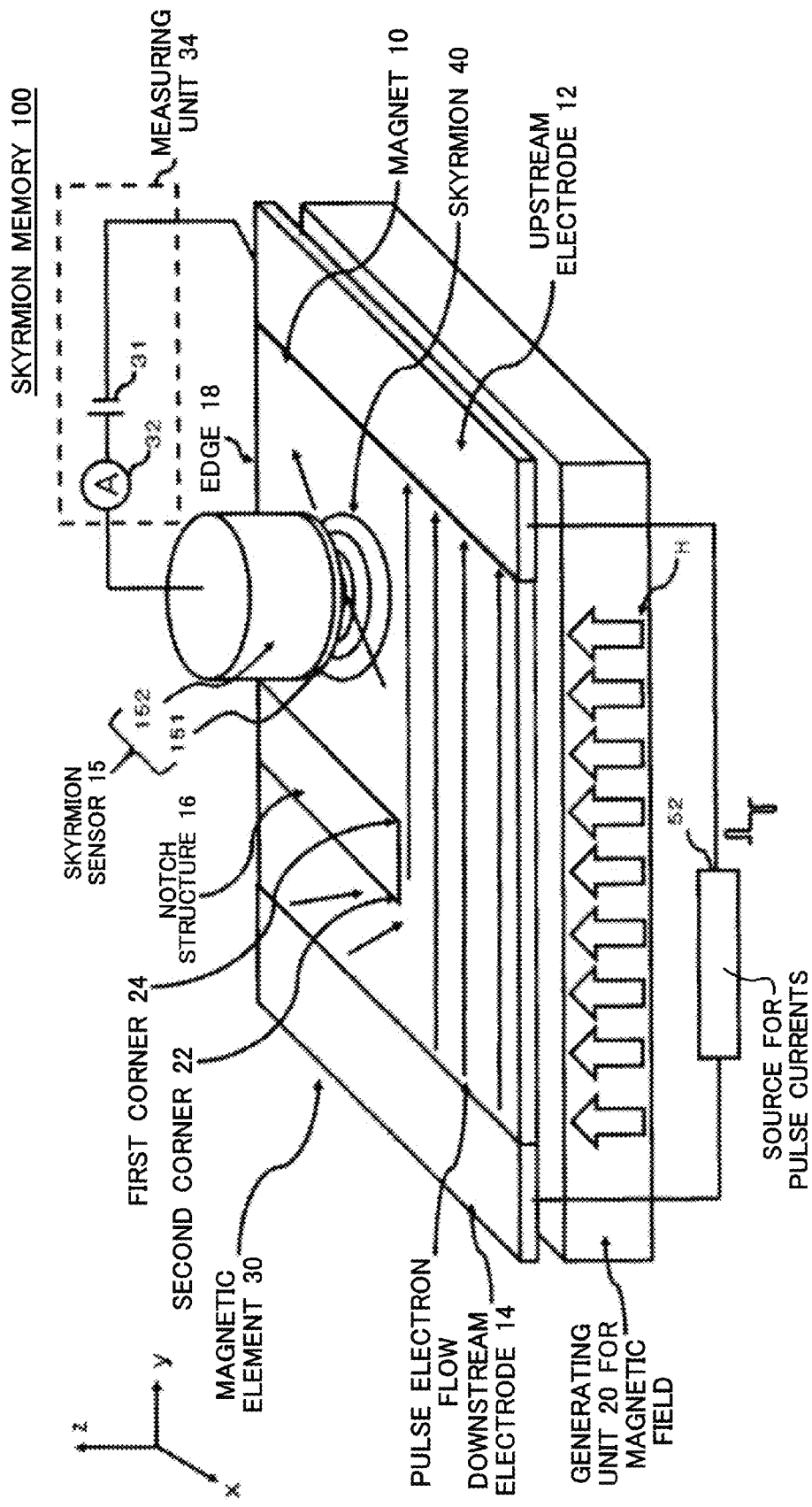
FIG. 12 shows another exemplary structure of the skyrmion memory 100.

FIG. 12 is a schematic view showing another exemplary structure of the skyrmion memory 100. In the present example, the skyrmion memory 100 has the same structure as the skyrmion memory 100 shown in FIG. 3A or 3B, except for the skyrmion sensor 15. In FIG. 12, the arrows are used to show the pulse electron flow observed when the skyrmion 40 is generated. In the present example, the skyrmion sensor 15 is a tunnel magnetoresistance element (TMR element). The skyrmion sensor 15 has a layered structure made up by a non-magnetic thin film 151 and a magnetic metal 152. The non-magnetic thin film 151 is in contact with the surface of the magnet 10 between the notch structure 16 and the upstream electrode 12.

The magnetic metal 152 exhibits the ferromagnetic phase, in which the magnetic moments are oriented in the positive z direction, when the magnet 10 applies magnetic field in the positive z direction to the magnetic metal 152. The measuring unit 34 is connected between the magnet 10 and the end of the magnetic metal 152 that faces away from the magnet 10. In this manner, the resistance value of the skyrmion sensor 15 can be detected. The resistance value of the skyrmion sensor 15 takes a minimum value when the skyrmion 40 is absent in the magnet 10 and takes an increased value when the skyrmion 40 is present. The resistance value of the skyrmion sensor 15 is determined since the probability of the tunneling current of the electrons in the non-magnetic thin film 151 depends on the orientations of the magnetic moments in the magnet 10 and the magnetic metal 152 exhibiting the ferromagnetic phase. The high resistance (H) and the low resistance (L) exhibited by the skyrmion sensor 15 correspond to whether the skyrmion 40 is present or absent, and also to whether the information stored on the memory cell is "1" or "0." Thus, the information stored on the skyrmion memory 100 can be read. Note that the notch structure 16 of the present example may also be formed to reach the edge of the magnet 10 that is in contact with the downstream electrode 14, like the notch structure 16 shown in FIG. 3B.

Figure 13:
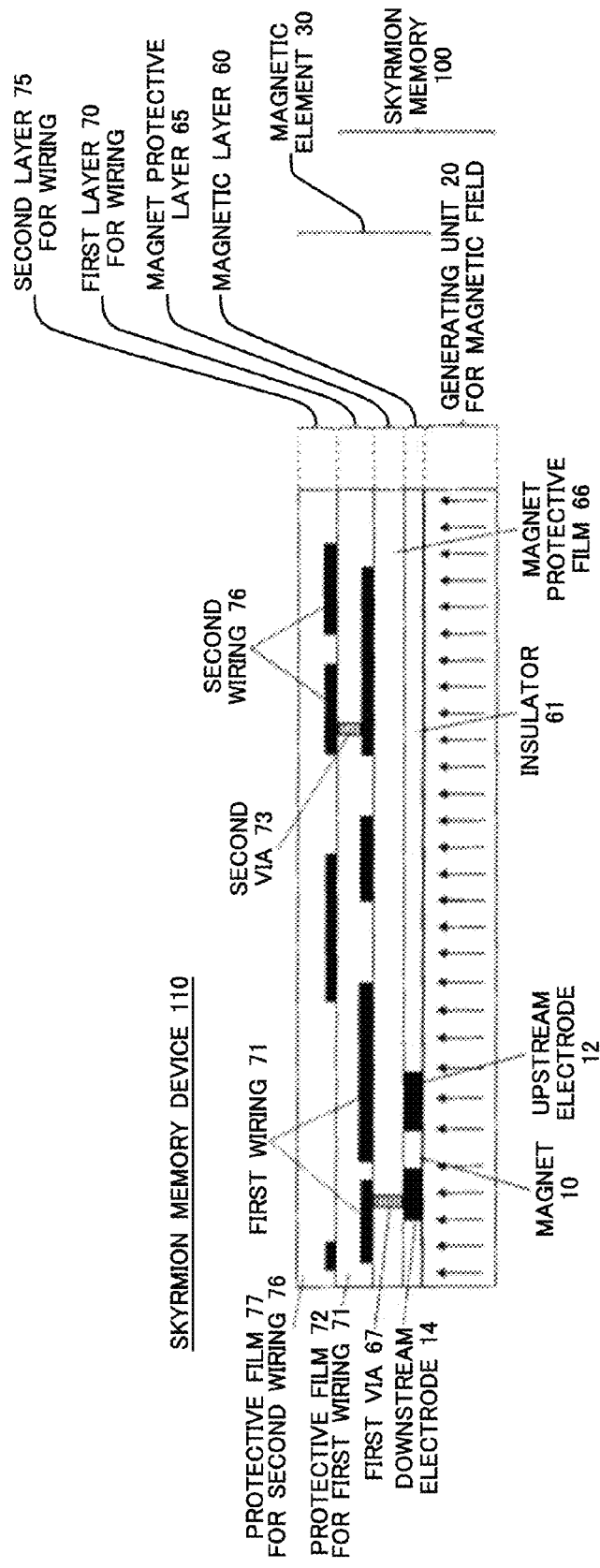
FIG. 13 is a schematic view showing a cross-section of a skyrmion memory.

FIG. 13 shows the cross-sectional structure of a skyrmion memory device 110. The skyrmion memory device 110 includes at least one skyrmion memory 100. The skyrmion memory device 110 includes a generating unit 20 of magnetic field, which is a ferromagnetic layer, and a magnetic element 30, which is formed above the generating unit 20 of magnetic field. A non-magnetic layer is provided between the magnetic element 30 and the generating unit 20 of magnetic field. In the present example, the magnetic element 30 has the same structure as the magnetic element 30 shown in FIG. 3A, 3B or 11. FIG. 13 only shows, from among the metal electrodes included in the magnetic element 30 shown in FIG. 3A, 3B or 11, the downstream electrode 14 and the upstream electrode 12 and does not show the other metal electrodes. FIG. 13 does not show the cross-sectional view of the measuring unit 34. The magnetic element 30 has a layered structure in which a magnetic layer 60, a magnet protective layer 65, a first layer 70 for wiring and a second layer 75 for wiring are stacked in the stated order.

The magnetic layer 60 includes the magnet 10, an insulator 61, the notch structure 16, the downstream electrode 14 and the upstream electrode 12. When the magnetic element 30 has the structure shown in FIG. 3A or 3B, the magnetic layer 60 further includes the notch structure electrode 153. When the magnetic element 30 has the structure shown in FIG. 11, the magnetic layer 60 further includes the notch structure electrode 153, the first electrode 155 and the second electrode 156. The magnet 10 generates and erases the skyrmion 40. The insulator 61 surrounds the magnet 10 and the metal electrodes. The magnet 10 and the metal electrodes such as the downstream electrode 14 and the upstream electrode 12 constitute a structure in which a non-magnetic metal, a magnetic material and a non-magnetic metal are coupled to each other, which is the fundamental structure of a skyrmion magnetic medium. This structure is referred to as the NMN structure, for short. The magnetic layer 60 may include a plurality of NMN structures in the same layer. In other words, the magnetic layer 60 may include in the same layer a plurality of magnetic elements 30, each of which is shown in FIG. 3A, 3B or 11.

The magnet protective layer 65 has a magnet protective film 66 and a first via 67. The magnet protective film 66 protects the magnetic layer 60. The first via 67 supplies to the respective metal electrodes the currents to generate, erase and detect skyrmions. FIG. 13 shows only one first via 67, but the first via 67 is provided for each of the metal electrodes.

The first layer 70 for wiring includes a first wiring 71, a protective film 72 for the first wiring 71, and a second via 73. The first wiring 71 constitutes the path through which the voltages or currents are supplied to generate, erase and detect skyrmions. The protective film 72 for the first wiring 71 serves as an interlayer insulating film to have the first wiring 71 and the second via 73 formed therein. When it is difficult to form in the same layer the paths for skyrmion generation, erasure and detection, a second layer 75 for wiring may be formed on the first layer 70 for wiring as shown in FIG. 13.

The second layer 75 for wiring includes a second wiring 76 and a protective film 77 for the second wiring 76. The second wiring 76 is connected to the second via 73. The protective film 77 for the second wiring 76 serves as an interlayer insulating film to insulate the second wiring 76. For example, the second via 73 is connected to at least one of the two different types of current paths for magnetic field generation and skyrmion detection. The second wiring 76 constitutes the path through which the voltages or currents are supplied to generate, erase and detect skyrmions, like the first wiring 71. These paths may be connected through external terminals to a source for pulse currents and the like external to the skyrmion memory device 110.

Figure 14B:
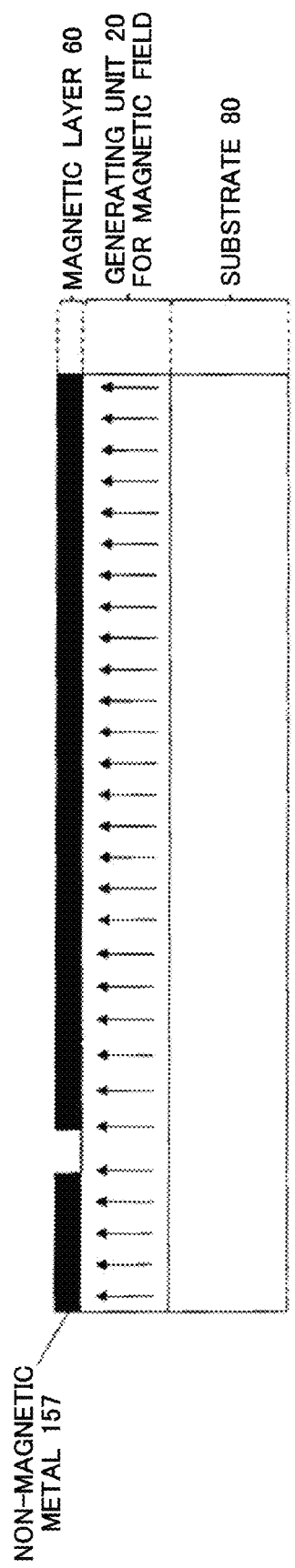
FIG. 14B shows the step of removing a resist 85.

FIGS. 14A to 14H show the process of manufacturing the skyrmion memory device 110 shown in FIG. 13. FIG. 14A shows the step of forming the generating unit 20 of magnetic field and the electrode 157. In the present example, the generating unit 20 of magnetic field is formed on a substrate 80 made of silicon. The generating unit 20 of magnetic field is formed by a ferromagnetic film and generates a uniform perpendicular magnetic field directed from the substrate 80 to the magnetic layer 60. For example, the generating unit 20 of magnetic field is formed using sputtering equipment and has a thickness of 3000 angstroms. The materials and thickness of the generating unit 20 of magnetic field are selected so that the generating unit 20 of magnetic field has such retention characteristics that the generating unit 20 of magnetic field can apply the magnetic field strength H=0.03 J to the magnet 10. The generating unit 20 of magnetic field is formed by a rare-earth metal magnet or ferrite magnet made of ferroxidase. Between the generating unit 20 of magnetic field and the substrate 80, an insulating film such as a silicon oxide film may be provided.

On the generating unit 20 of magnetic field, a resist 85 is patterned into the shape of the magnet 10. For example, the resist 85 is formed by spin coating to have a thickness of several thousand angstroms. The region of the resist 85 in which the magnet 10 is to be formed is exposed using the EUV technique. The region of the resist 85 excluding the EUV-exposed region is removed by development. The resist 85 may be made of materials that are commonly used in the semiconductor manufacturing processes.

The electrode 157 is formed on the generating unit 20 of magnetic field and the resist 85. As a result of patterning to be performed later, the electrode 157 will be formed into the metal electrodes of the magnetic element 30. For example, the electrode 157 is formed using sputtering equipment and has a thickness of 500 angstroms. The electrode 157 is made of copper (Cu), aluminum (Al) or the like.

FIG. 14B shows the step of removing the resist 85. The resist 85 is removed by a dry or wet process. For example, in the case of the dry process, the resist 85 is removed using an oxygen gas asher. As a result of removing the resist 85, a notch structure can be formed in the electrode 157 at a position where the magnet 10 is to be formed. In the present example, the electrode 157 is formed using the lift-off process but may be alternatively formed using the etching process.

Figure 14C:
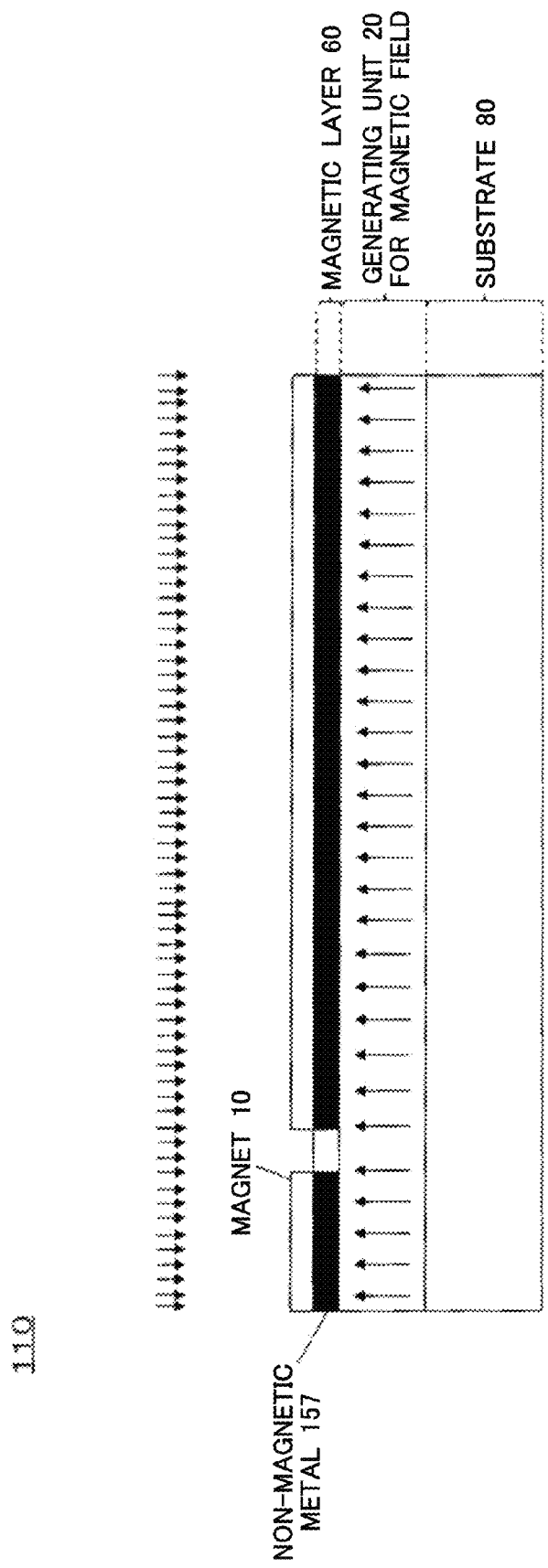
FIG. 14C shows the step of forming the magnet 10.

FIG. 14C shows the step of forming the magnet 10. In the present example, the magnet 10 is formed using an MBE apparatus and has a thickness of 500 angstroms. Note that the magnet 10 is formed in the notch structure in the electrode 157 and to also cover the entire surface of the magnetic layer 60. In the present example, the magnet 10 has the same thickness as the electrode 157. The thickness of the magnet 10 deposited in this step, however, may be larger or smaller than the thickness of the electrode 157.

Figure 14D:
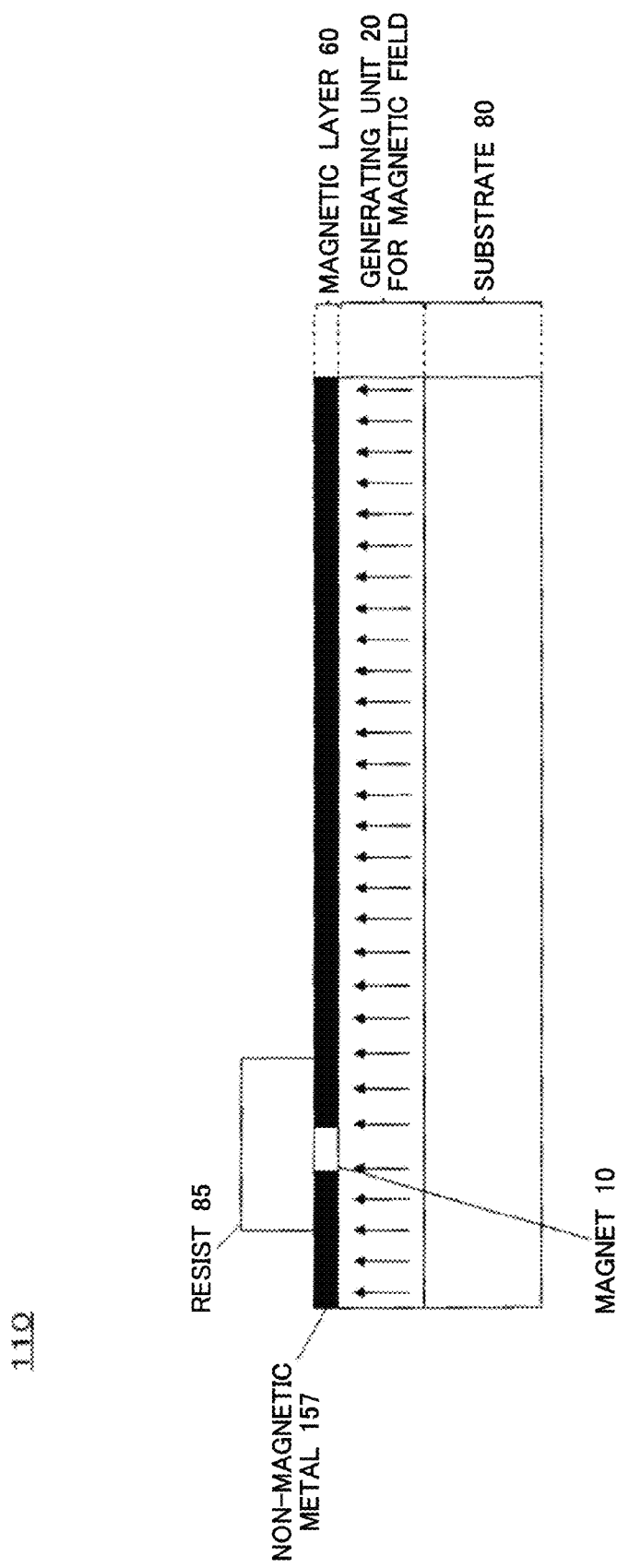
FIG. 14D shows the step of removing the magnet 10 and the step of applying the resist 85.

FIG. 14D shows the step of removing the magnet 10 and the step of applying the resist 85. The step of removing the magnet 10 uses chemical mechanical process (CMP) to remove the magnet 10 that is formed on the electrode 157. Subsequently, the resist 85 is applied in order to form the metal electrodes. The resist 85 is patterned in accordance with the shapes of the magnet 10 and the metal electrodes by performing EUV and developing steps.

Figure 14E:
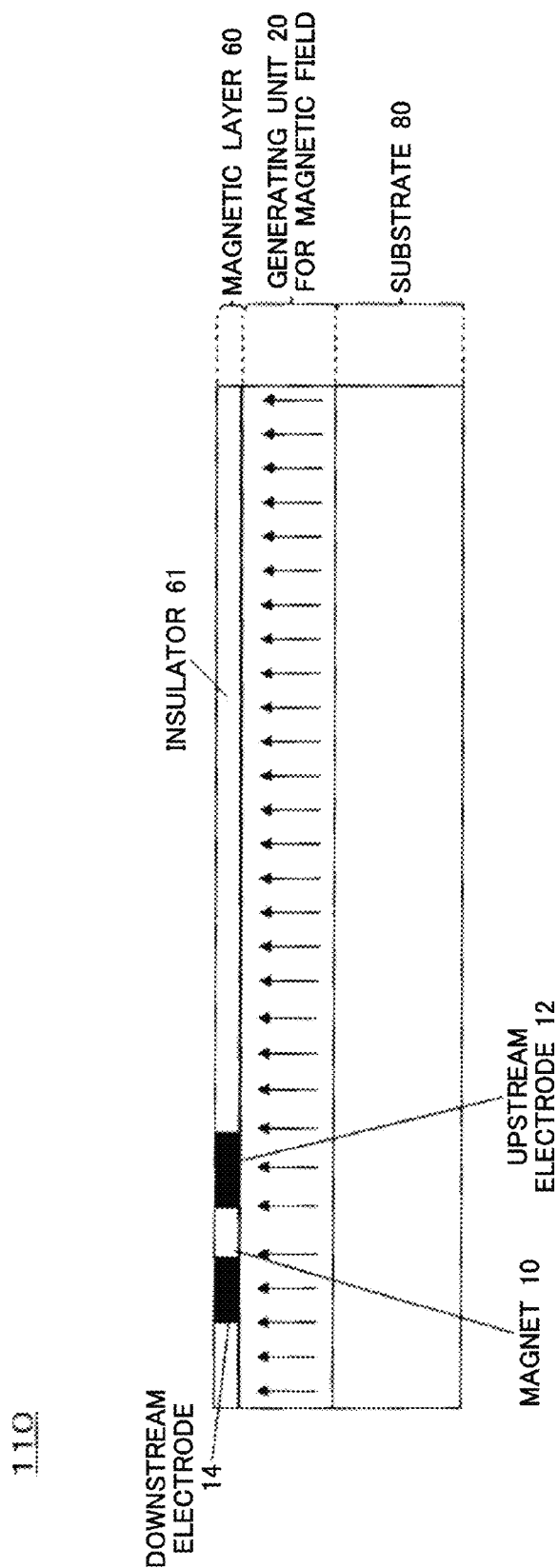
FIG. 14E shows the step of etching for the electrodes and the step of forming an insulator 61.

FIG. 14E shows the step of etching the electrodes and the step of forming the insulator 61. The metal electrodes are formed using dry etching. As a result of this step, the fundamental structure of the skyrmion memory 100, that is to say, the NMN structure is completed. The subsequent steps are the same as the common interconnecting steps for LSIs. The insulator 61 is formed to surround the NMN structure in the magnetic layer 60.

Figure 14F:
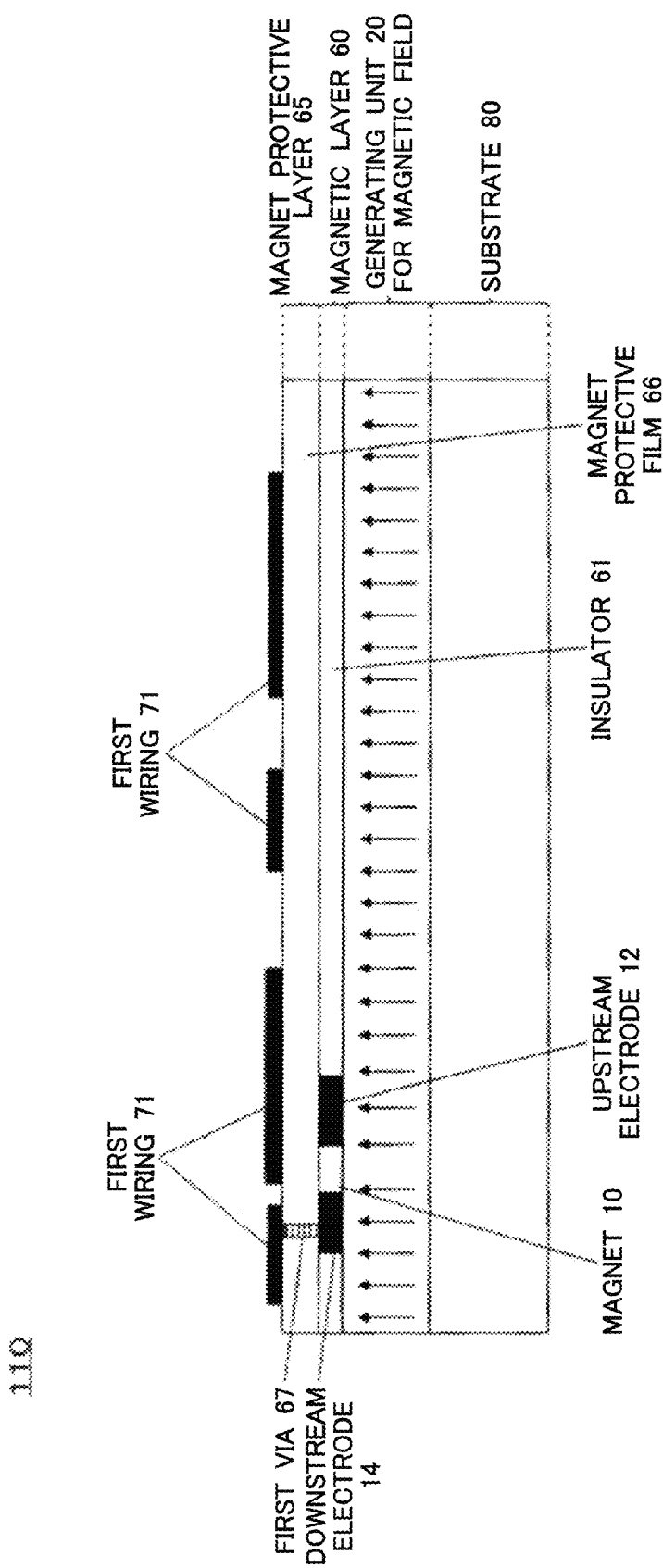
FIG. 14F shows the step of forming a magnet protective layer 65 and a first wiring 71.

FIG. 14F shows the step of forming the magnet protective layer 65 and the first wiring 71. The magnet protective film 66 is formed on the magnetic layer 60. The first via 67 can be formed by depositing a metal for the wirings in the opening formed in the magnet protective film 66. Stated differently, the magnet protective film 66 and the first via 67 can be formed in similar manners as in the common semiconductor manufacturing process.

The first wiring 71 is formed on the magnet protective layer 65. The first wiring 71 can be patterned using common photo processes and etching steps. The first wiring 71 may be formed by either one of the etching and lift-off processes.

Figure 14G:
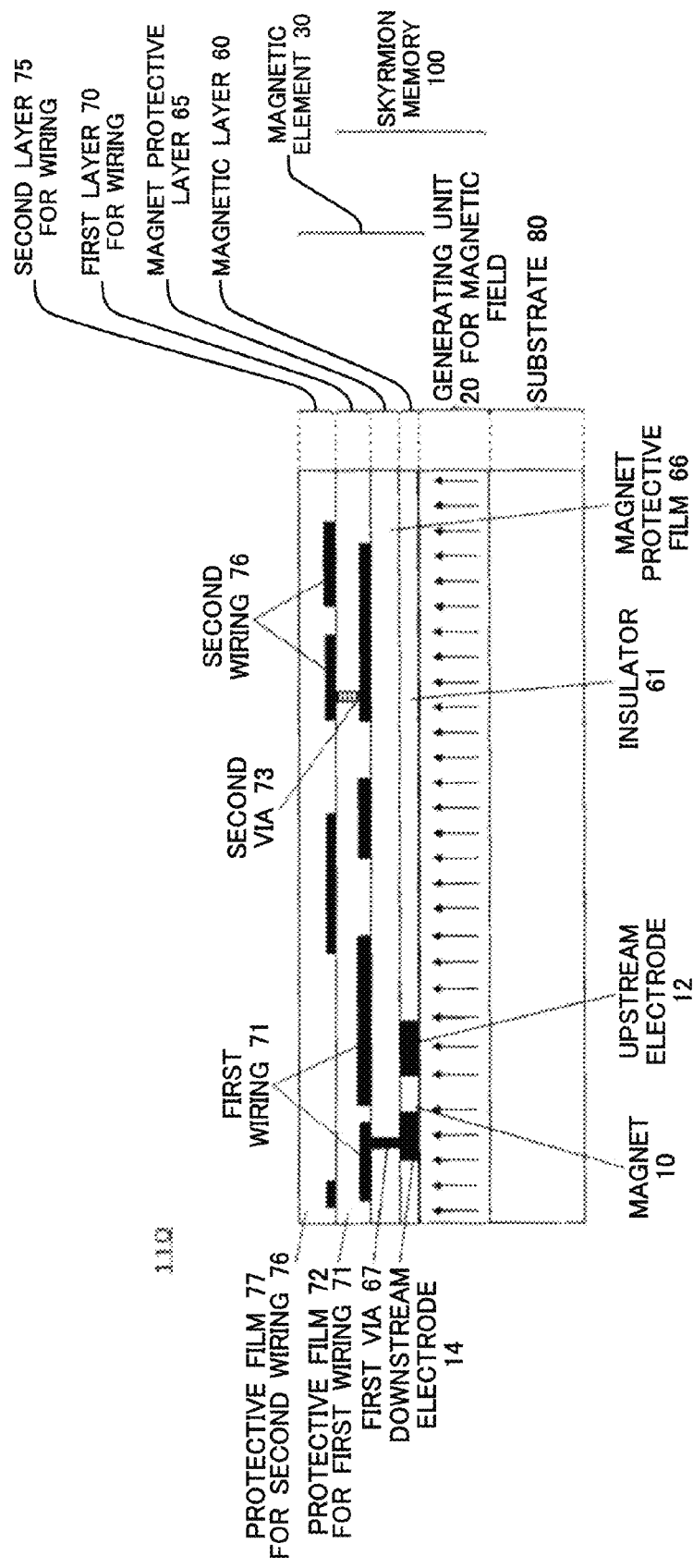
FIG. 14G shows the step of forming a first layer 70 for wiring and a second layer 75 for wiring.

FIG. 14G shows the step of forming the first layer 70 for wiring and the second layer 75 for wiring. The protective film 72 for the first wiring 71 is formed on the magnet protective layer 65 and the first wiring 71. The second via 73 can be formed by depositing a metal for the wirings in the opening formed in the protective film 72 for the first wiring 71.

The second wiring 76 is formed on the first layer 70 for wiring. The second wiring 76 can be patterned using common photo processes and etching steps. The second wiring 76 may be formed by either one of the etching and lift-off processes. The protective film 77 for the second wiring 76 is formed on the first layer 70 for wiring and the second wiring 76. The second wiring 76 and the protective film 77 for the second wiring 76 can be formed in similar manners as in the common semiconductor manufacturing process.

The above has described the manufacturing process to form the magnetic element 30 on the generating unit 20 of magnetic field, which is configured to generate magnetic field. In order to manufacture the skyrmion memory device 110, six photomasks are necessary in total. To be specific, two photomasks are used to form the NMN structure (the magnet 10 and the metal electrodes, one photomask is used to form the first via 67, one photomask is used to form the first wiring 71, one photomask is used to form the second via 73, and one photomask is used to form the second wiring 76. The number of photo processes to manufacture the magnetic element can be reduced to one third or less of the number of photo processes to form a common CMOS device having two layers of wirings. In addition, the manufacturing process of the present example makes use of the existing LSI manufacturing process and thus can achieve reduced process development and manufacturing costs. The switches to control the magnetic element 30 and the CMOS-FET structure for sensor amplification are necessarily mounted on the same chip. The same photo process can manufacture the CMOS-FET structure and the skyrmion memory. Accordingly, the increase in number of photomasks can be reduced to one, which may be used to form the generating unit 20 of magnetic field. The increase in manufacturing cost can be significantly cut.

Figure 14H:
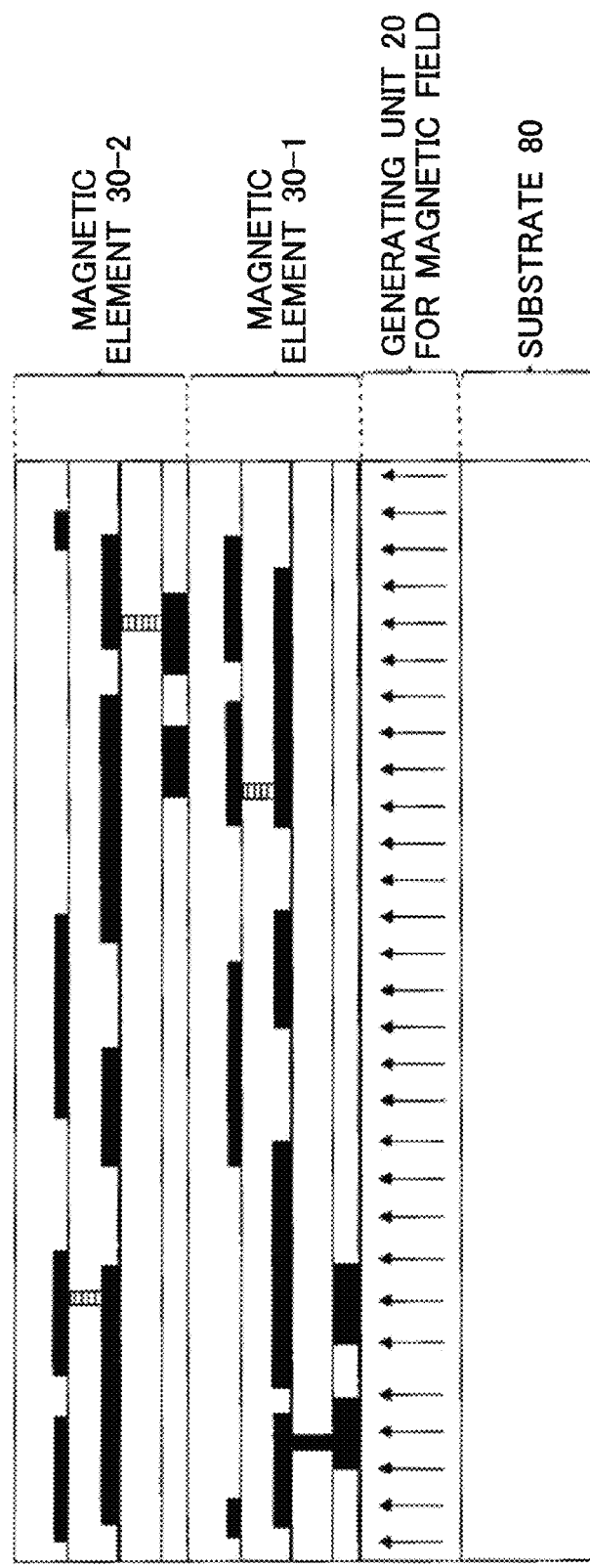
FIG. 14H shows a skyrmion memory device 110 in which magnetic elements 30 are stacked.

FIG. 14H shows the skyrmion memory device 110 in which magnetic elements 30 are stacked. In the present example, the skyrmion memory device 110 includes a magnetic element 30-1 and a magnetic element 30-2. The skyrmion memory device 110 can be manufactured by repeatedly performing the manufacturing process shown in FIGS. 14A to 14G. The skyrmion memory device 110 of the present example can accomplish higher integration density since a plurality of magnetic elements 30 are stacked on the common generating unit 20 of magnetic field. The skyrmion memory device 110 of the present example can achieve the integration density twice as high as the integration density of the skyrmion memory device 110 shown in FIG. 14G. In the present example, the magnets 10 included in the magnetic elements 30 of adjacent layers may be arranged not to overlap each other.

Figure 15:
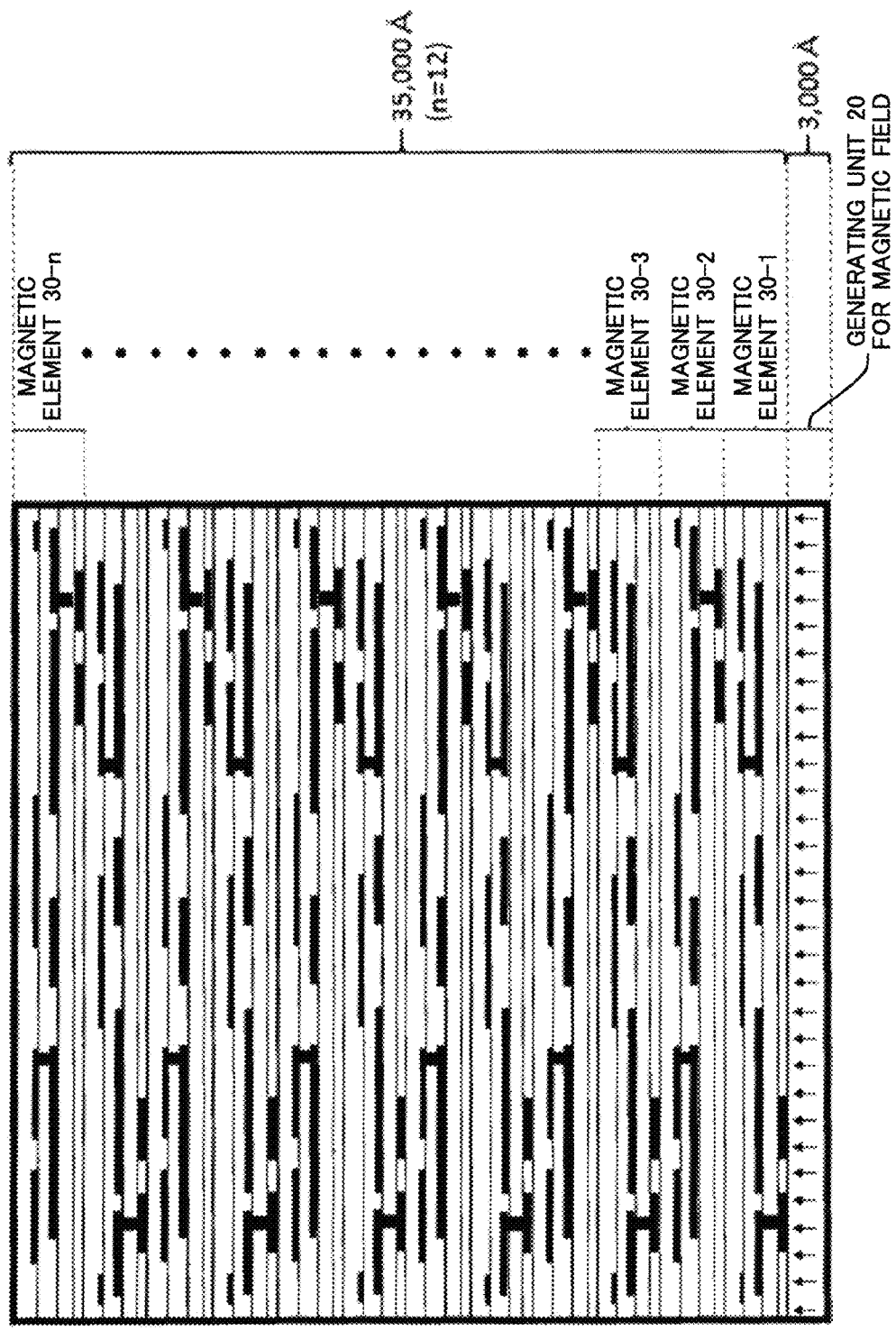
FIG. 15 shows a skyrmion memory device 110 in which n magnetic elements 30 are stacked.

FIG. 15 shows the skyrmion memory device 110 in which n magnetic elements 30 are stacked. Regarding the skyrmion memory device 110 of the present example, n=12. The generating unit 20 of magnetic field has a thickness of 3000 angstroms. The magnetic elements 30-1 to 30-n are stacked. In the present example, the magnetic elements 30 have a total thickness of 35000 angstroms.

Figure 16:
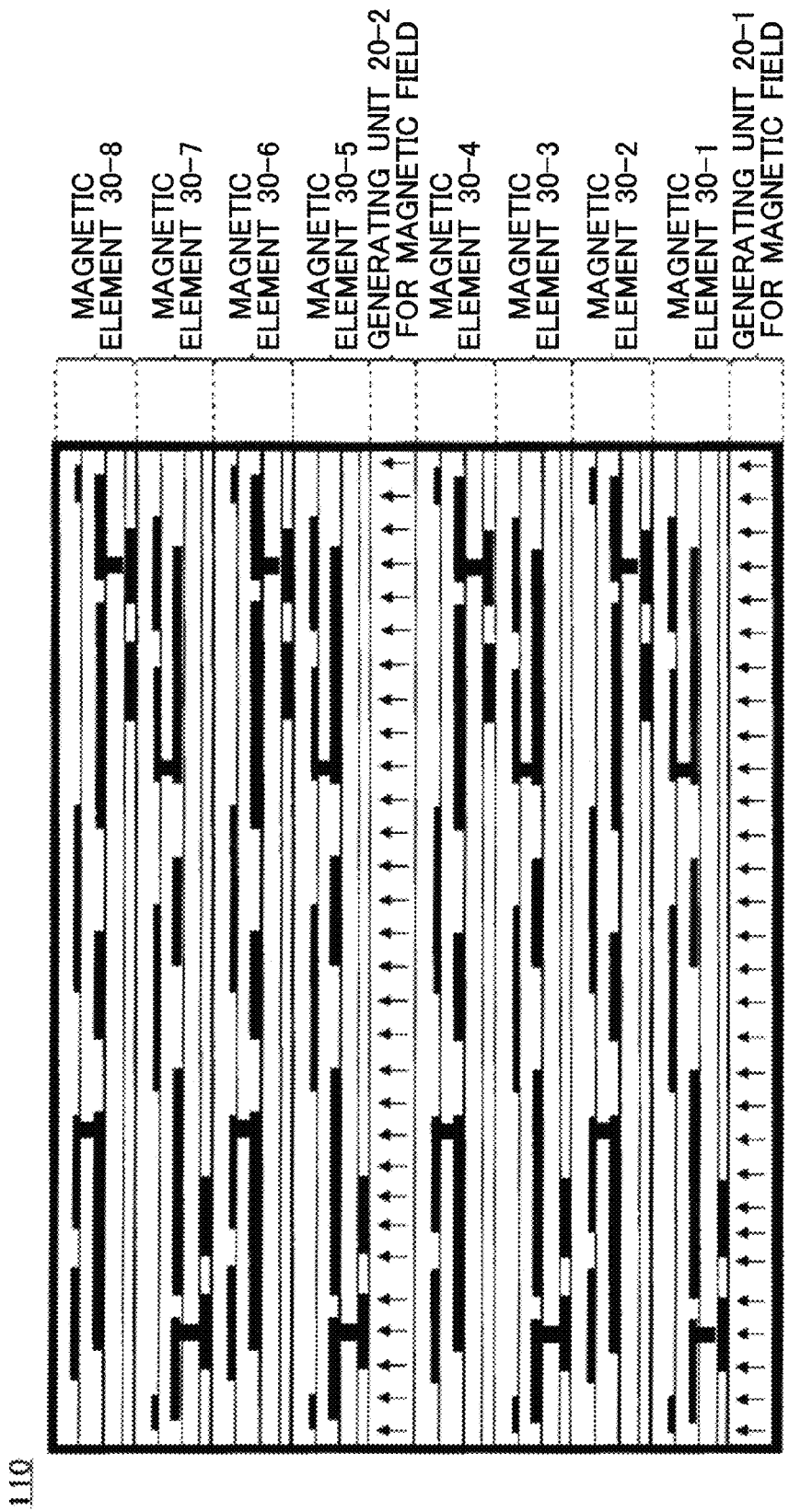
FIG. 16 shows a skyrmion memory device 110 including a plurality of generating units 20 of magnetic field.

FIG. 16 shows the skyrmion memory device 110 including a plurality of generating units 20 of magnetic field that are arranged in the stacking direction. The skyrmion memory device 110 of the present example has, in total, eight layers of magnetic elements 30, i.e., the magnetic elements 30-1 to 30-8. The skyrmion memory device 110 has magnetic elements 30 of four layers on a generating unit 20 of magnetic field-1. The skyrmion memory device 110 further includes a generating unit 20 of magnetic field-2 between the magnetic element 30-4 and the magnetic element 30-5. With such a configuration, the magnetic elements 30 can receive magnetic field of a constant strength from the generating units 20 of magnetic field. The generating units 20 of magnetic field may be arranged at appropriate intervals that are determined by the material of the magnetic elements 30 and other factors.

Figure 17:
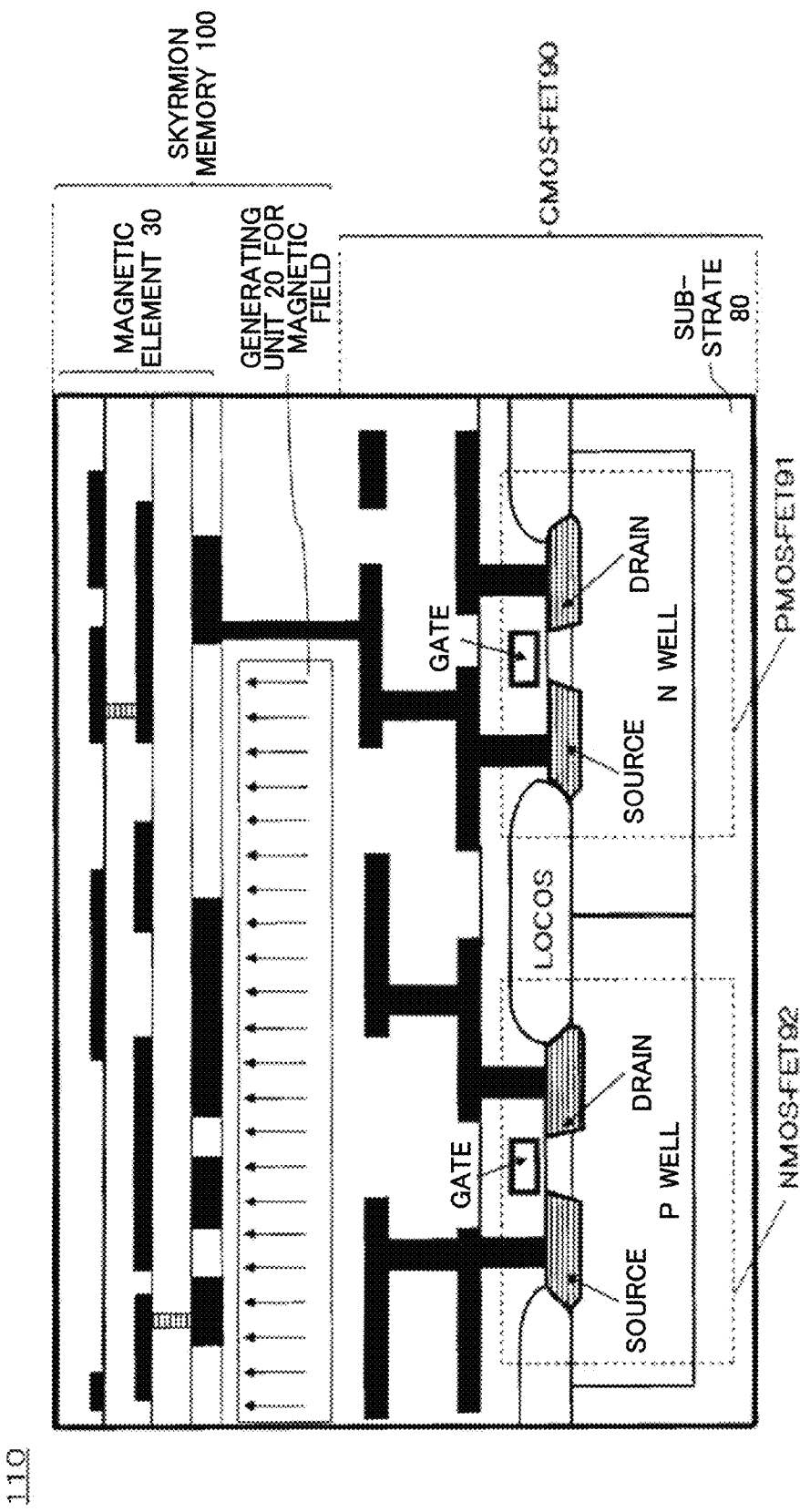
FIG. 17 shows an exemplary structure of the skyrmion memory device 110.

FIG. 17 shows an exemplary structure of the skyrmion memory device 110. The skyrmion memory device 110 includes the skyrmion memory 100 and a CMOS-FET 90 that provides the CPU functionality. The skyrmion memory 100 is formed on the CMOS-FET 90. In the present example, the CMOS-FET 90 includes a PMOS-FET 91 and a NMOS-FET 92.

According to the skyrmion memory device 110, the CMOS-FET 90 providing the CPU functionality and the skyrmion memory 100, which is an overlaid large-scale non-volatile memory, can be included in the same chip. This can result in a shorter CPU processing time and faster CPU processing and accordingly in a significant cut in the CPU power consumption. In other words, the processing time to call basic OSes from the HD at the start-up of the PC and to write and read into/from the external SRAM and DRAM can be significantly reduced. This contributes to the reduction in the CPU processing time (or, this makes the CPU significantly faster). As a consequence, the CPU can realize significantly lower power consumption. In addition, note that the skyrmion memory 100, which is a large-scale non-volatile memory, consumes no power to maintain the information stored on the memory. Since the orientations of the magnetic moments of the skyrmion 40 are topologically stable, no power needs to be supplied from the outside. On the other hand, DRAM memory requires data refresh, and SRAM memory also requires constant power supply since it is volatile. Flash memory has long data access time and thus cannot directly exchange data with the CPU.

Figure 18:
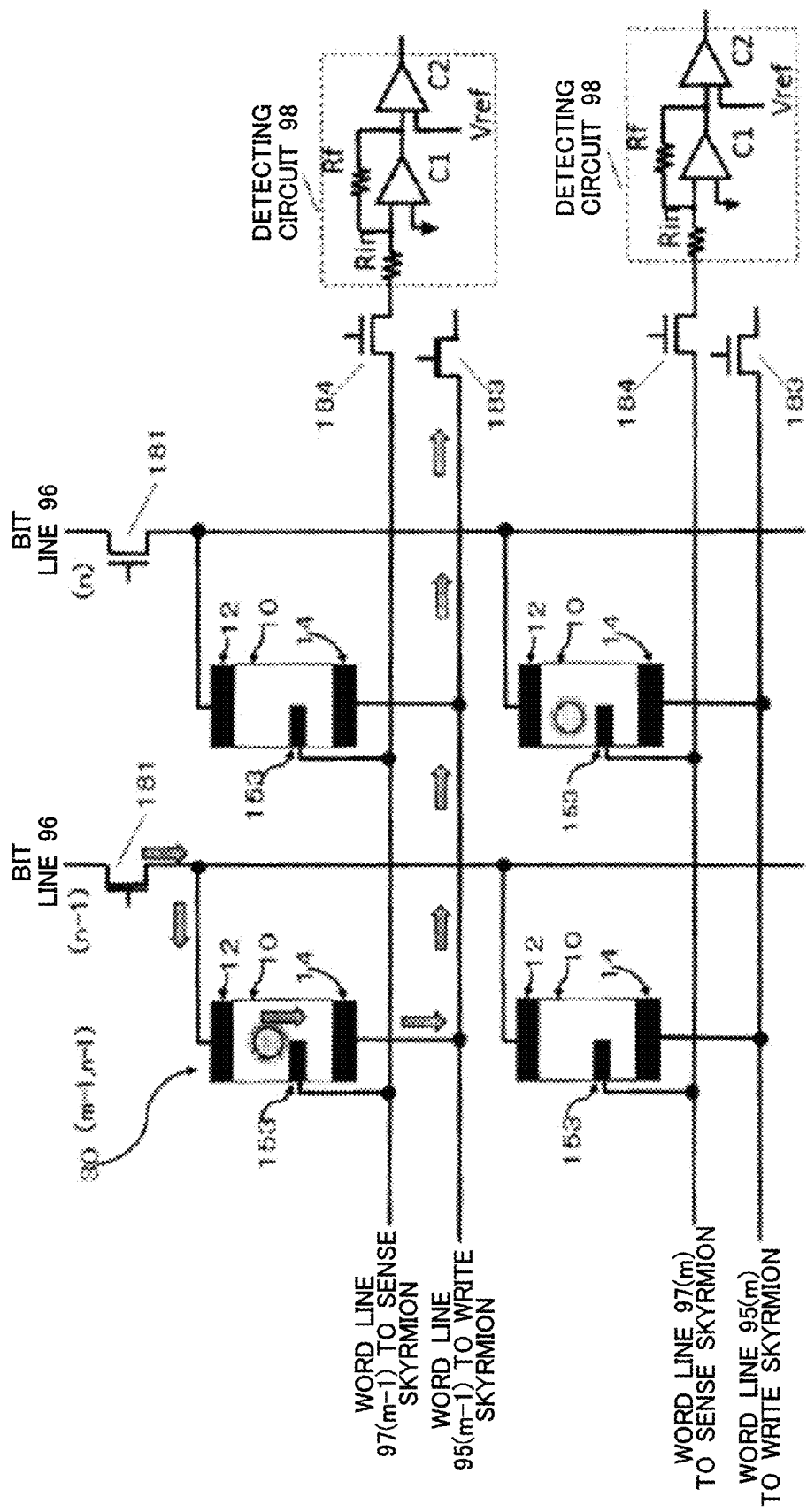
FIG. 18 shows the circuit structure of the skyrmion memory device 110 and a writing operation.

FIG. 18 shows an exemplary circuit structure of the skyrmion memory device 110. In the present example, the skyrmion memory device 110 includes a plurality of magnetic elements 30, each of which is shown in FIG. 3A or 3B, in a matrix. FIG. 18 only shows, from among the columns and rows of the matrix, a (n−1)-th column, a n-th column, a (m−1)-th row and a m-th row.

The skyrmion memory device 110 includes a plurality of magnetic elements 30, a plurality of bit lines 96, a plurality of word lines 95 to write a skyrmion, a plurality of word lines 97 to sense a skyrmion, a plurality of switches 181, a plurality of switches 183, a plurality of switches 184, and a plurality of detecting circuits 98. The bit lines 96 are connected to the magnetic elements 30. Each bit line 96 serves as an electric line to generate a skyrmion configured to supply currents to generate the skyrmion 40 in the corresponding magnetic elements 30. The word lines 95 to write a skyrmion are connected to the magnetic elements 30. Each word line 95 to write a skyrmion serves as an electric line to erase a skyrmion configured to supply currents to erase the skyrmion 40 in the corresponding magnetic elements 30. The word lines 97 to sense a skyrmion are connected to the magnetic elements 30. Each word line 97 to sense a skyrmion transmits the voltage or current determined by whether the skyrmion 40 is present or absent in the corresponding magnetic elements 30. The switches 181 are provided in the bit lines 96 in a one-to-one correspondence. The switches 183 are provided in the word lines 95 to write a skyrmion in a one-to-one correspondence. The switches 184 are provided in the word lines 97 to sense a skyrmion in a one-to-one correspondence. The switches 181, 183 and 184 are, for example, FETs.

The bit lines 96 and word lines 95 to write a skyrmion are connected to an external source for pulse currents via the corresponding switches. The external source for pulse currents is, for example, the source 52 for pulse currents or power supply 31 for measuring. The source 52 for pulse currents and the power supply 31 for measuring may be implemented by a common source for pulse currents. Alternatively, the external source for pulse currents may be provided for each one or more of the bit lines 96.

The detecting circuits 98 are connected to the word lines 97 to sense a skyrmion. Each detecting circuit 98 is configured to detect the current flowing through the corresponding word line 97 to sense a skyrmion or the voltage on the corresponding word line 97 to sense a skyrmion. Each detecting circuit 98 serves as the ammeter 32 or voltmeter 33 in the measuring unit 34. The detecting circuits 98 may be provided for the word lines 97 to sense a skyrmion in a one-to-one correspondence, or each detecting circuit 98 may be shared by more than one of the word lines 97 to sense a skyrmion.

The upstream electrode 12 of each magnetic element 30 is connected to the corresponding bit line 96. The downstream electrode 14 is connected to the corresponding word line 95 to write a skyrmion. The notch structure electrode 153 is connected to the corresponding word line 97 to sense a skyrmion.

When data is to be written into one of the magnetic elements 30 (that is to say, a skyrmion is to be generated), the corresponding switches 181 and 183 are turned on and the corresponding bit line 96 and word line 95 to write a skyrmion are thus selected. For example, when data is to be written into the magnetic element 30 (m−1, n−1), the switch 183 corresponding to the word line 95(m−1) to write a skyrmion and the switch 181 corresponding to the bit line 96(n−1) are turned on. Subsequently, as shown by the arrows in FIG. 18, a current to write a skyrmion is supplied to flow from the bit line 96(n−1) to the word line to write a skyrmion, the skyrmion 40 can be generated in the magnetic element 30(m−1, n−1). Note that the arrows shown in FIG. 18 are oppositely directed to the pulse electron flow shown in the plane of the magnet 10 in FIG. 3A or 3B.

Figure 19:
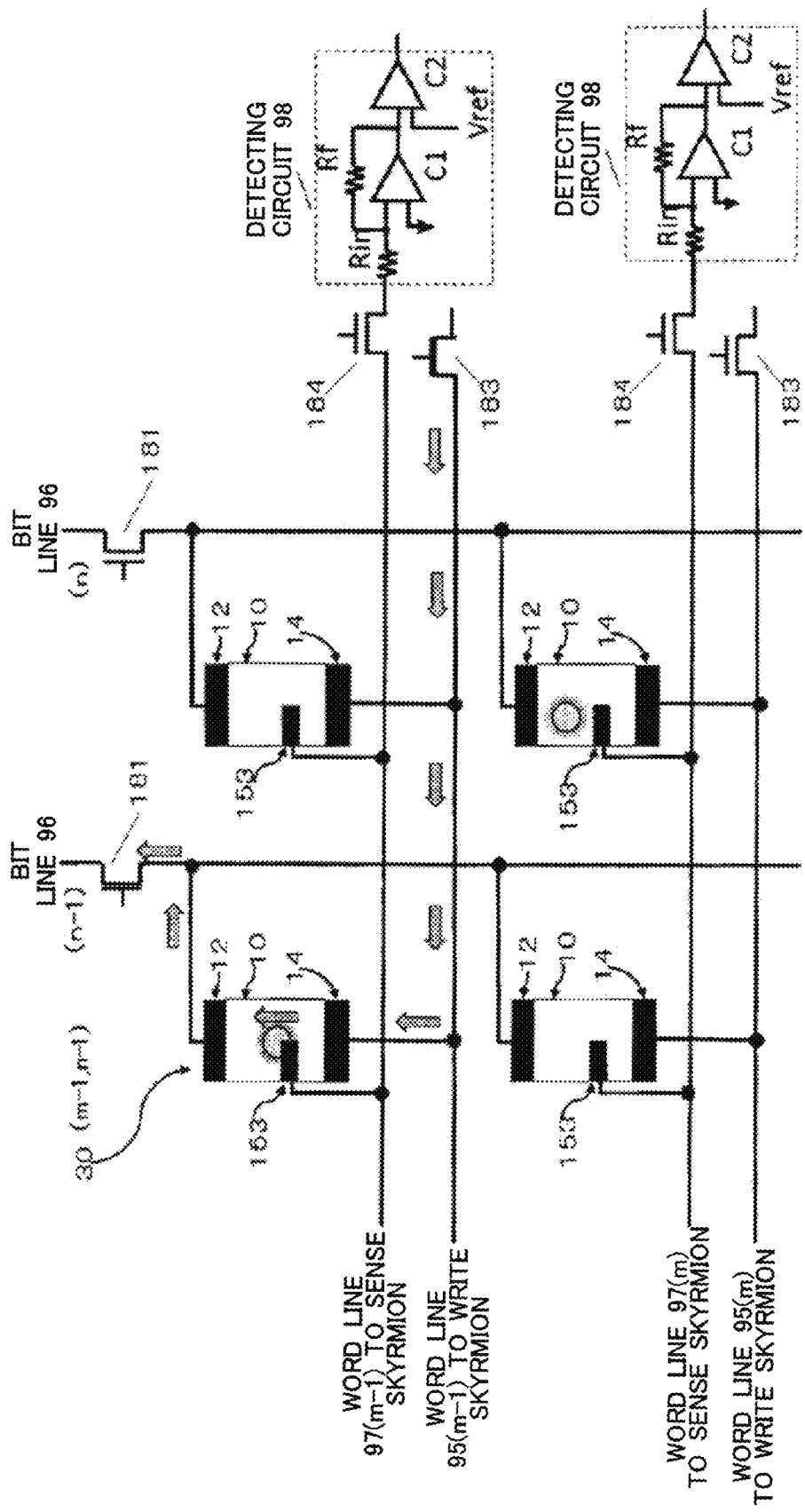
FIG. 19 shows the erasing operation for the skyrmion memory device 110.

FIG. 19 shows an exemplary erasing operation for the skyrmion memory device 110. The erasing operation for the skyrmion memory device 110 means the operation to erase the skyrmion 40. As in the case of the writing operation, the switches 181 and 183 are used to select the bit line 96 and the word line 95 to write a skyrmion that correspond to the magnetic element 30 in which the skyrmion 40 is to be erased. In the case of the erasing operation, however, the current is supplied to the magnetic element 30 in the direction from the word line 95 to write a skyrmion to the bit line 96. In this manner, the skyrmion 40 in the magnetic element 30 can be erased.

For example, when the data on the magnetic element 30(m−1, n−1) is to be erased, the switch 183 corresponding to the word line 95(m−1) to write a skyrmion and the switch 181 corresponding to the bit line 96(n−1) are turned on. Subsequently, as shown by the arrows in FIG. 19, a current to erase a skyrmion is supplied to flow from the word line 95(m−1) to write a skyrmion to the bit line 96(n−1), the skyrmion 40 in the magnetic element 30(m−1, n−1) can be erased.

Figure 20:
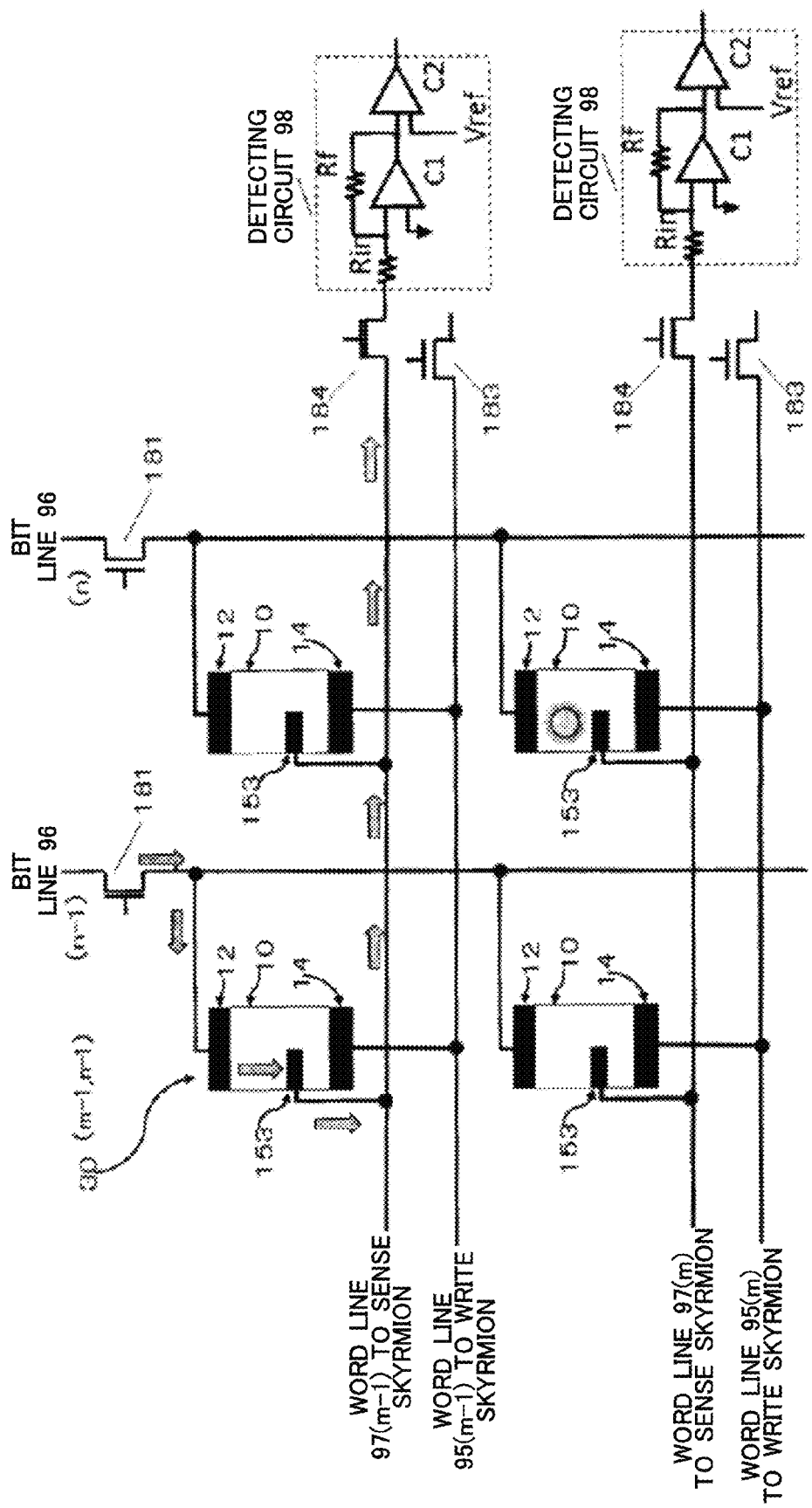
FIG. 20 shows the reading operation for the skyrmion memory device 110.

FIG. 20 shows an exemplary reading operation for the skyrmion memory device 110. The reading operation for the skyrmion memory device 110 means the detection of whether the skyrmion 40 is present or absent in each magnetic element 30. To select a given one of the magnetic elements 30 for the reading operation, the switches 181 and 184 are used to select the corresponding bit line 96 and word line 9 to sense a skyrmion.

In the case of the reading operation, the switches 181 and 184 are turned on and the switch 183 is turned off. In this manner, no currents flow from the upstream electrode 12 to the downstream electrode 14, and the currents flowing from the upstream electrode 12 to the notch structure electrode 153 flow into the word line 97 to sense a skyrmion.

For example, when data is to be read from the magnetic element 30(m−1, n−1), the switch 184 corresponding to the word line 97(m−1) to sense a skyrmion and the switch 181 corresponding to the bit line 96(n−1) are turned on. Subsequently, as shown by the arrows in FIG. 20, when a predetermined voltage is applied between the bit line 96(n−1) and the word line 97(m−1) to sense a skyrmion, currents flow into the word line 97 to sense a skyrmion with the resistance value being determined by whether the skyrmion 40 is present or absent in the magnetic element 30 (m−1, n−1).

Each detecting circuit 98 amplifies the voltage or currents flowing through the corresponding word line 97 to detect whether the skyrmion 40 is present or absent. In the present example, each detecting circuit 98 includes an input resistance Rin, a feedback resistance Rf, an amplification circuit C1 and a voltage comparator circuit C2, and is configured to detect currents. The currents flowing from the word line 97 to sense a skyrmion to the detecting circuit 98 flow into the amplification circuit C1 through the input resistance Rin. The feedback resistance Rf is arranged in parallel with the amplification circuit C1. The amplification circuit C1 converts the currents from the word line 97 to sense a skyrmion into a voltage and amplifies the resulting voltage. The voltage comparator circuit C2 receives the output voltage from the amplification circuit C1 and a reference voltage Vref. The voltage comparator circuit C2 outputs "1" when the output voltage from the amplification circuit C1 is higher than the reference voltage Vref. On the other hand, the voltage comparator circuit C2 outputs "0" when the output voltage from the amplification circuit C1 is lower than the reference voltage Vref. In this way, the data stored on the magnetic element 30 can be read.

Figure 21:
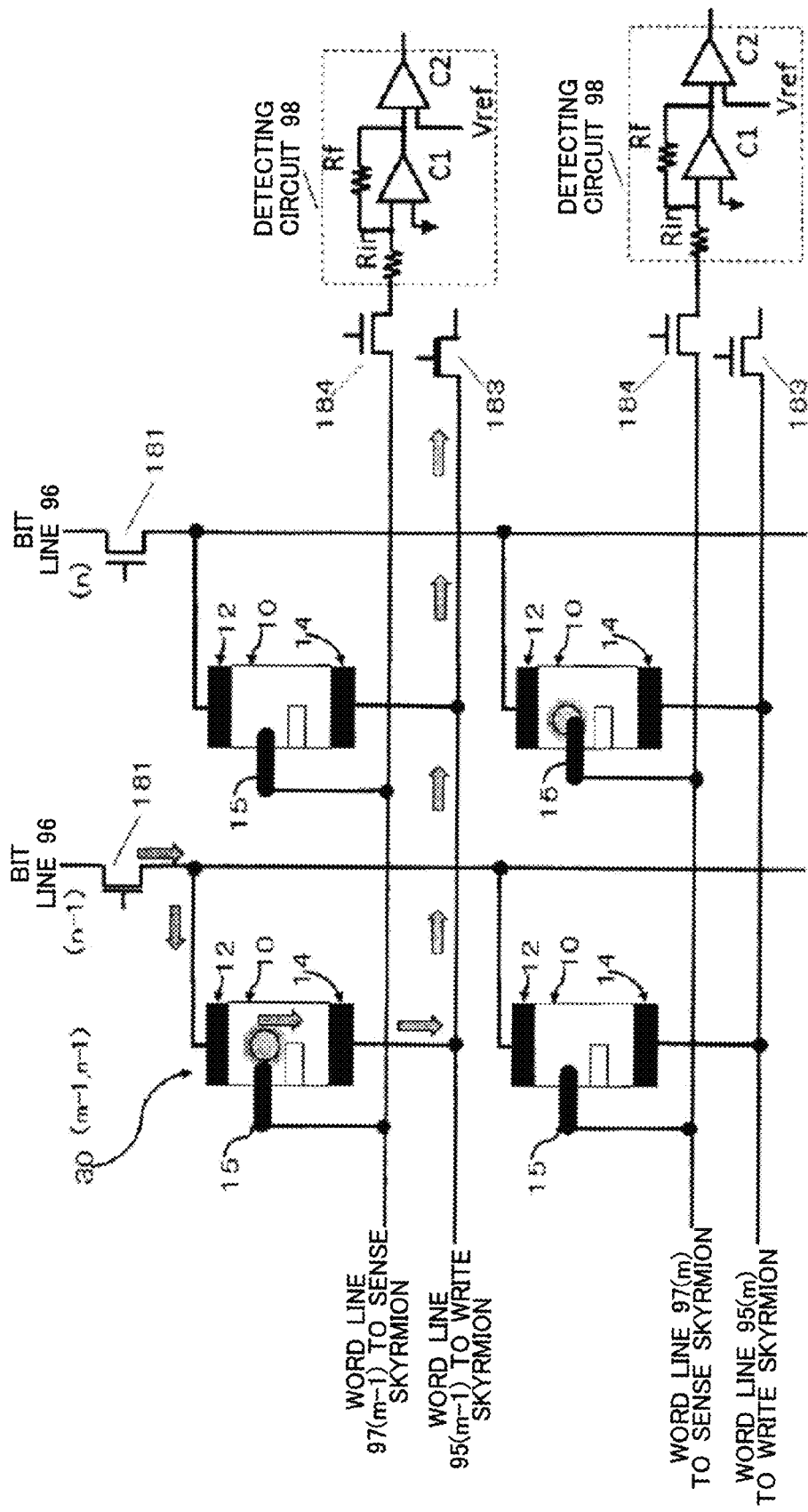
FIG. 21 shows another circuit structure of the skyrmion memory device 110 and a writing operation.

FIG. 21 shows another exemplary circuit structure of the skyrmion memory device 110. In the present example, the skyrmion memory device 110 includes a plurality of magnetic elements 30, each of which is shown in FIG. 12, in a matrix. In the present example, the ends of the skyrmion sensors 15 are connected to the word lines 97 to sense a skyrmion. FIG. 21 shows how skyrmions are generated. To generate skyrmions, the respective types of switches operate and the currents flow in the same manner as in the example shown in FIG. 18. It should be noted that, in the present example, the upstream electrode 12 serves also as one of the electrodes of the skyrmion sensor 15.

Figure 22:
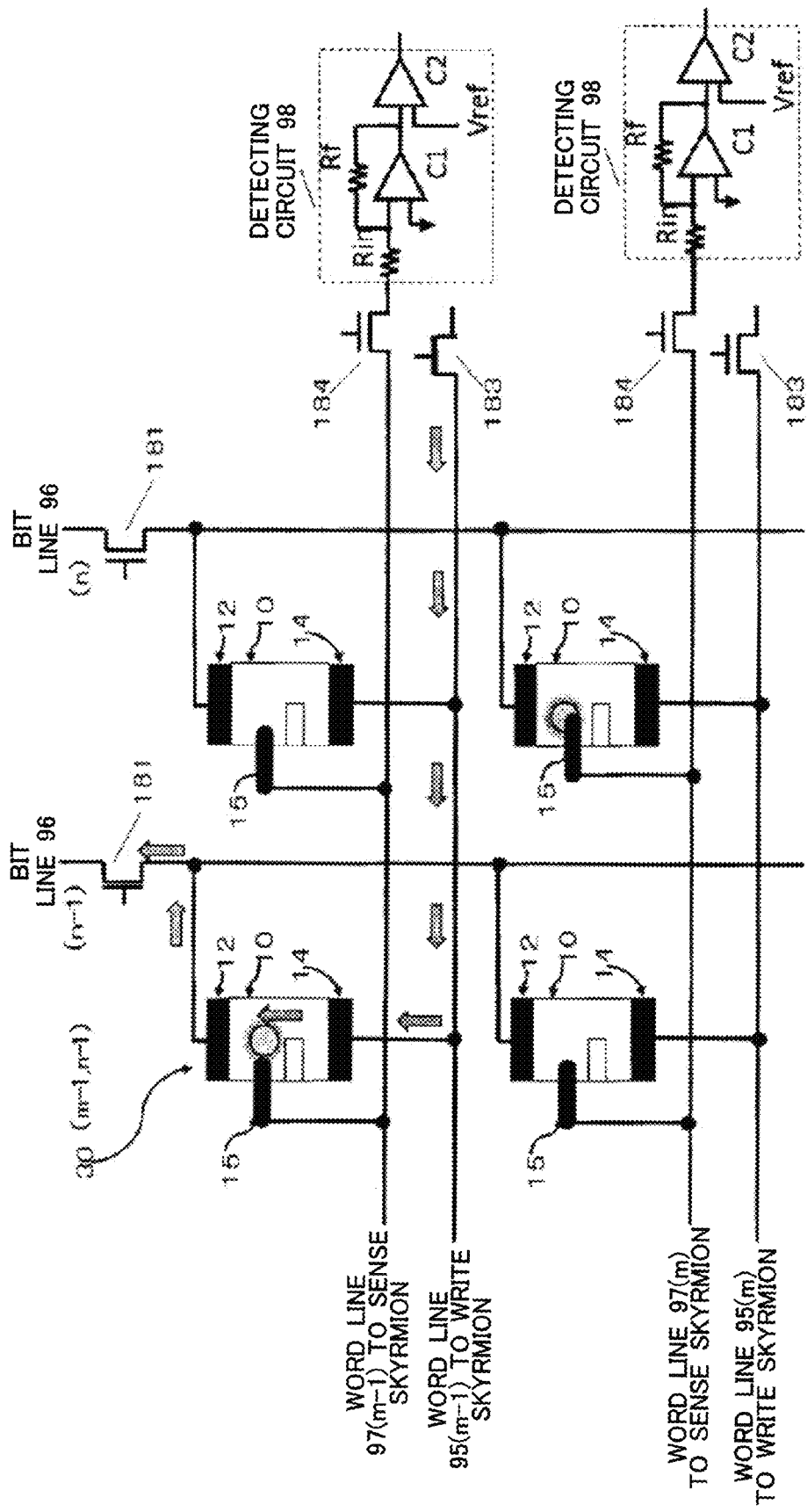
FIG. 22 shows the erasing operation for the skyrmion memory device 110.

FIG. 22 shows an exemplary erasing operation for the skyrmion memory device 110. To erase skyrmions, the respective types of switches operate and the currents flow in the same manner as in the example shown in FIG. 19.

Figure 23:
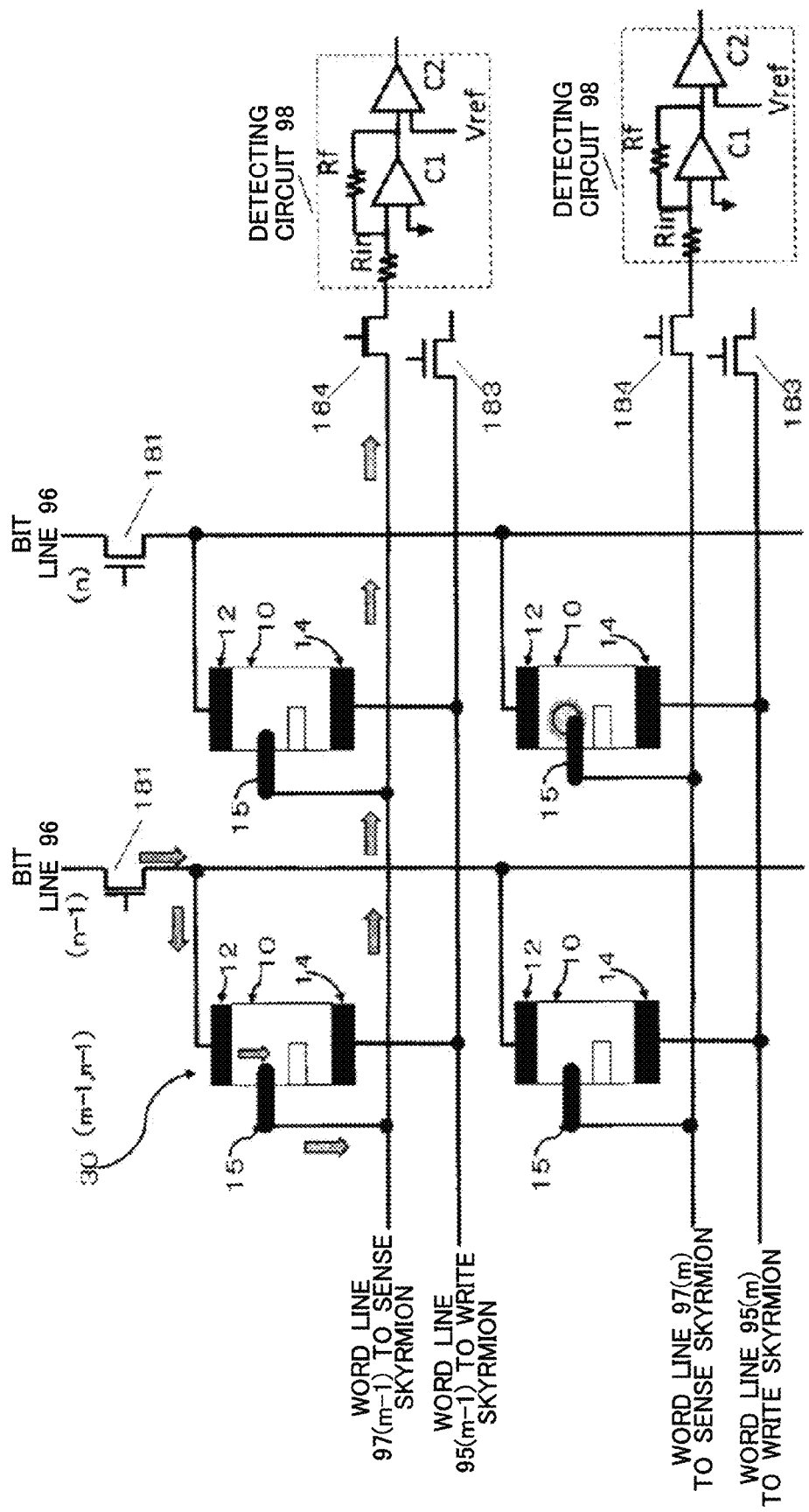
FIG. 23 shows the reading operation for the skyrmion memory device 110.

FIG. 23 shows an exemplary reading operation for the skyrmion memory device 110. To read skyrmions, the respective types of switches operate in the same manner as in the example shown in FIG. 20. In the present example, the voltage supplied through the bit line 96 causes the currents determined by the resistance between the upstream electrode 12 and the skyrmion sensor 15 to flow into the word line 97 to sense a skyrmion. The detecting circuit 98 detects the currents flowing into the word line 97 to sense a skyrmion. While high voltage is applied to the upstream electrode 12 and low voltage is applied to the skyrmion sensor 15 in the present example, the high and low voltages may be reversed as shown in FIG. 12.

Note that, when the magnetic element 30 shown in FIG. 11 is used, the skyrmion 40 can be also generated, erased and read by using the same matrix circuit structure as the circuit structures shown in FIGS. 18 to 23. For example, the skyrmion 40 can be generated, erased and read by providing a bit or word line for each of the upstream electrode 12, the downstream electrode 14, the notch structure electrode 153, the first electrode 155 and the second electrode 156, and using switches to select an appropriate pair of electrodes, from among the above-described electrodes, between which currents are to be supplied.

In the manner described above with reference to FIGS. 18 to 23, the skyrmion memory device 110 can select any magnetic element 30 to generate, erase and read the skyrmion 40 therein. The FET arranged around the magnetic element 30, and the amplification circuit C1 and the voltage comparator circuit C2 in the detecting circuit 98 each include a CMOS device. The magnetic elements 30 are arranged within the same plane. Alternatively, the magnetic elements 30 arranged in a plane may be stacked on the magnetic elements 30 arranged in a different plane. The magnetic elements 30 can be stacked using the manufacturing process using a smaller number of photomasks, as described with reference to FIGS. 14A to 14H. The magnetic elements 30 can achieve a significantly higher integration density as they are capable of being stacked on each other.

Figure 24:
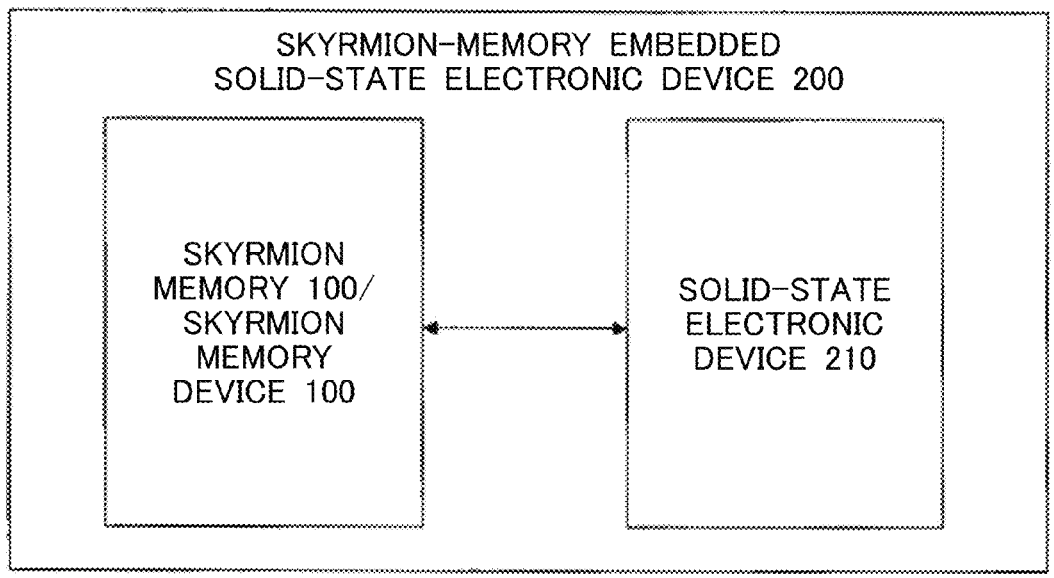
FIG. 24 is a schematic view showing an exemplary structure of a skyrmion-memory embedded solid-state electronic device 200.

FIG. 24 is a schematic view showing an exemplary structure of a skyrmion-memory embedded solid-state electronic device 200. The skyrmion-memory embedded solid-state electronic device 200 includes one of the skyrmion memory 100 and the skyrmion memory device 110, and a solid-state electronic device 210. The skyrmion memory 100 or skyrmion memory device 110 is the skyrmion memory 100 or skyrmion memory device 110 described with reference to FIGS. 1 to 23. The solid-state electronic device 210 is, for example, a CMOS-LSI device. The solid-state electronic device 210 is capable of at least one of writing data into the skyrmion memory 100 or skyrmion memory device 110 and reading data from the skyrmion memory 100 or skyrmion memory device 110.

Figure 25:
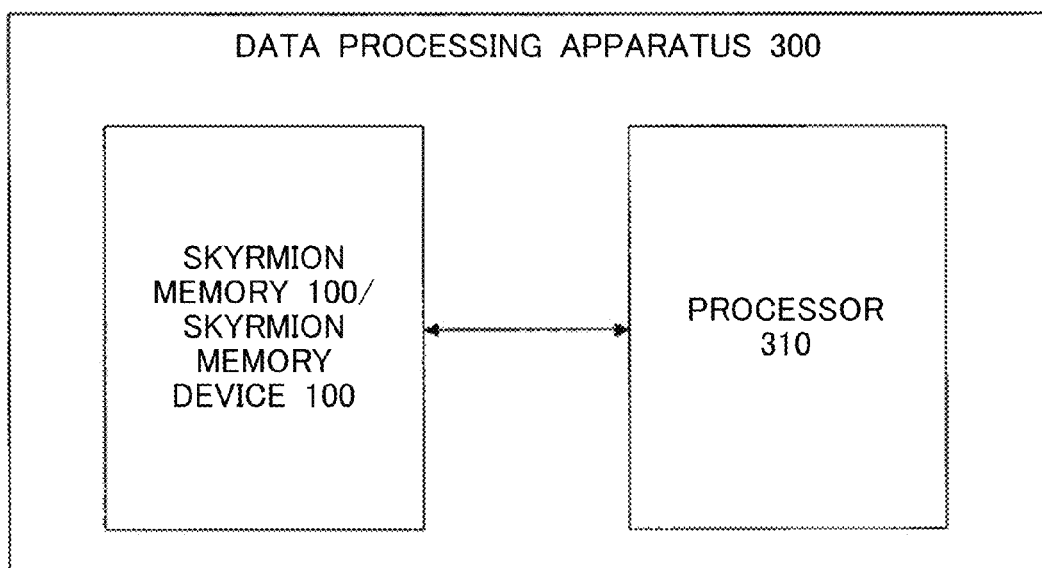
FIG. 25 is a schematic view showing an exemplary structure of a data processing apparatus 300.

FIG. 25 is a schematic view showing an exemplary structure of a data processing apparatus 300. The data processing apparatus 300 includes one of the skyrmion memory 100 and the skyrmion memory device 110, and a processor 310. The skyrmion memory 100 or skyrmion memory device 110 is the skyrmion memory 100 or skyrmion memory device 110 described with reference to FIGS. 1 to 23. The processor 310 includes, for example, a digital circuit designed to process digital signals. The processor 310 is capable of at least one of writing data into the skyrmion memory 100 or skyrmion memory device 110 and reading data from the skyrmion memory 100 or skyrmion memory device 110.

Figure 26:
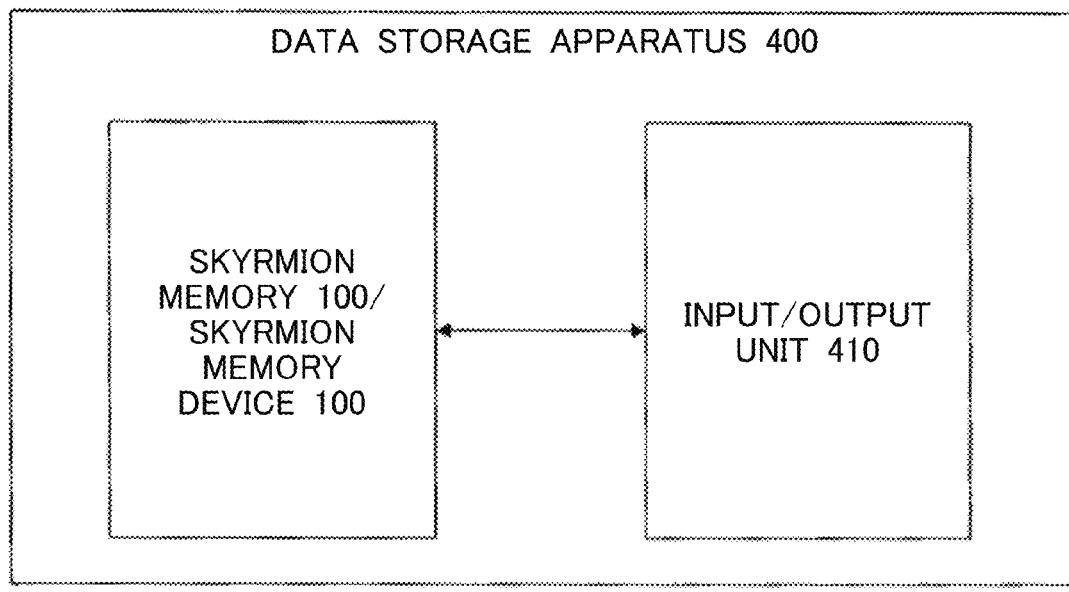
FIG. 26 is a schematic view showing an exemplary structure of a data storage apparatus 400.

FIG. 26 is a schematic view showing an exemplary structure of a data storage apparatus 400. The data storage apparatus 400 includes one of the skyrmion memory 100 and the skyrmion memory device 110, and an input/output unit 410. The data storage apparatus 400 is, for example, a memory device such as a hard disk or USB memory. The skyrmion memory 100 or skyrmion memory device 110 is the skyrmion memory 100 or skyrmion memory device 110 described with reference to FIGS. 1 to 23. The input/output unit 410 is capable of at least one of writing data into the skyrmion memory 100 or skyrmion memory device 110 from outside and reading data from the skyrmion memory 100 or skyrmion memory device 110 to output the read data to outside.

Figure 27:
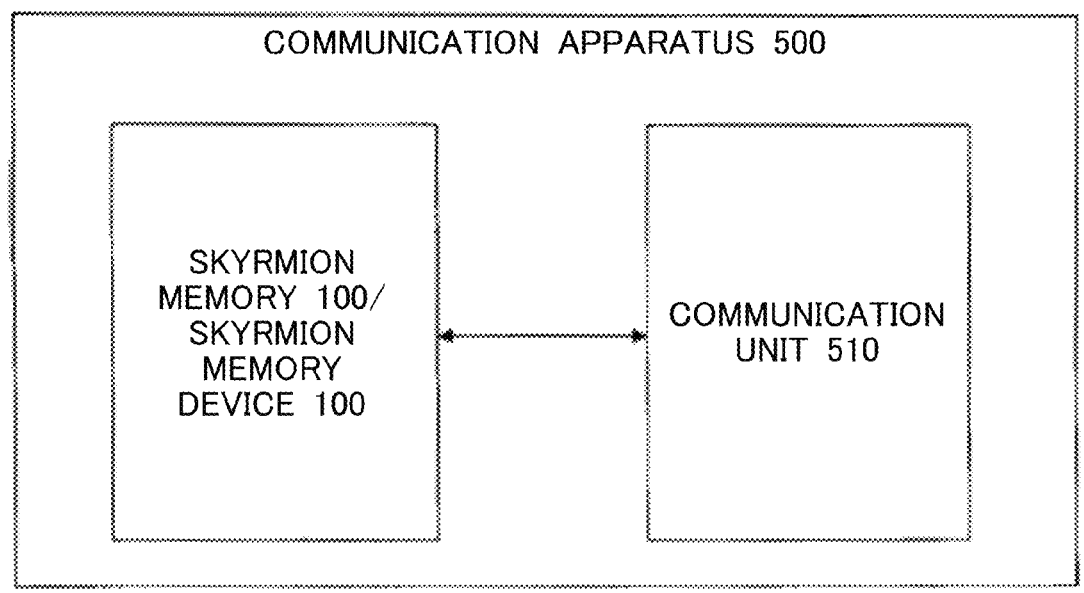
FIG. 27 is a schematic view showing an exemplary structure of a communication apparatus 500.
Figure 28:
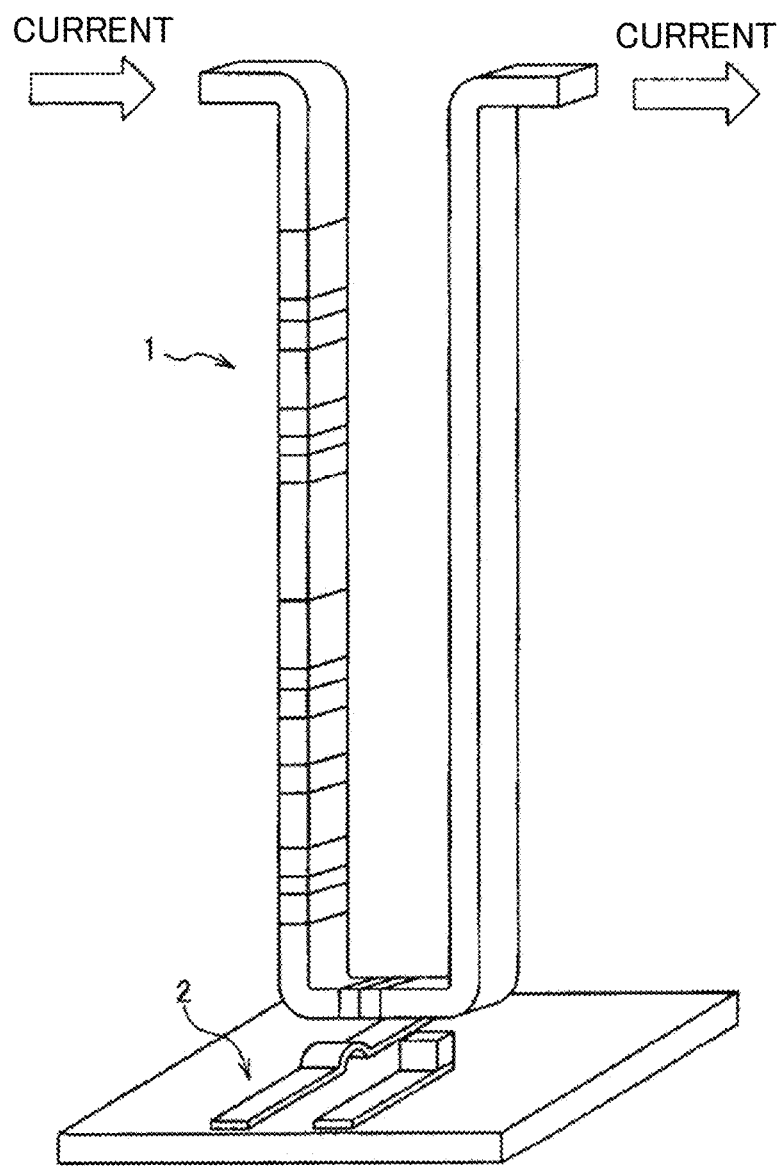
FIG. 28 shows the principle of how to drive magnetic domains using current.

FIG. 27 is a schematic view showing an exemplary structure of a communication apparatus 500. The communication apparatus 500 is a general apparatus capable of communicating with outside, such as a mobile phone, a smart phone and a tablet terminal. The communication apparatus 500 may or may not be portable. The communication apparatus 500 includes one of the skyrmion memory 100 and the skyrmion memory device 110, and a communication unit 510. The skyrmion memory 100 or skyrmion memory device 110 is the skyrmion memory 100 or skyrmion memory device 110 described with reference to FIGS. 1 to 23. The communication unit 510 is capable of communicating with outside the communication apparatus 500. The communication unit 510 may be capable of performing wireless communication, wired communication or both of wireless and wired communications. The communication unit 510 is capable of at least one of writing the data received from outside into the skyrmion memory 100 or skyrmion memory device 110, sending to outside the data read from the skyrmion memory 100 or skyrmion memory device 110, and operating based on the control information stored on the skyrmion memory 100 or skyrmion memory device 110.

In the electronic devices using the skyrmion memory 100 or skyrmion memory device 110, power saving can be also realized. Accordingly, the batteries provided in the electronic devices can achieve a longer lifetime. This enables mobile electronic devices using the skyrmion memory 100 or skyrmion memory device 110 to offer even more revolutionary functions to users. The electronic devices can be any devices including personal computers, image recording apparatuses and the like.

When the skyrmion memory 100 or skyrmion memory device 110 is used in communication apparatuses equipped with CPU (mobile phones, smart phones, tablet terminals and the like), image information can be loaded at higher speed and a wide variety of large-scale application programs can operate at higher speed, and fast response can be realized. As a result, the communication apparatuses can be assured to be comfortably used by users. In addition, the usages of the communication apparatuses can be even further improved since the images can be displayed on the screen at higher speed.

When the skyrmion memory 100 or skyrmion memory device 110 is used in electronic devices such as digital cameras, the electronic devices can store a great deal of moving images. When the skyrmion memory 100 or skyrmion memory device 110 is used in electronic devices such as 4K television receivers, the electronic devices can be configured to store a great deal of images. As a result, the television receivers no longer need to be connected to external hard disks. The skyrmion memory 100 or skyrmion memory device 110 may be embodied as a data storage medium, in addition to the cases where the skyrmion memory 100 or skyrmion memory device 110 is used in data storage apparatuses such as hard disks.

In addition, electronic devices such as vehicle navigation systems can become even more sophisticated by using the skyrmion memory 100 or skyrmion memory device 110 therein and can easily store thereon a great deal of map information.

Additionally, the skyrmion memory 100 or skyrmion memory device 110 can be expected to considerably influence the efforts to realize self-propelled apparatuses and flying apparatus. To be specific, the skyrmion memory 100 or skyrmion memory device 110 is capable of performing complicated controls of the flying apparatuses, processing weather information, and providing better services to the passengers by providing them with high-definition images, and also even capable of controlling space travel apparatuses and storing an enormous amount of information such as captured images. Thus, the skyrmion memory 100 or skyrmion memory device 110 can help us or the human being to acquire a lot of knowledge.

In addition, since the skyrmion memory 100 or skyrmion memory device 110 is a magnetic memory, they are highly resistant against the high-energy elementary particles in the space. The skyrmion memory 100 or skyrmion memory device 110 has very different advantages from flash memories, which use as the memory or storage media the charges of the electrons. For these reasons, the skyrmion memory 100 or skyrmion memory device 110 is important as storage media of space travel apparatus and the like.

DESCRIPTION OF REFERENCE NUMERALS

10 . . . magnet, 12 . . . upstream electrode, 14 . . . downstream electrode, 15 . . . skyrmion sensor, 16 . . . notch structure, 18 . . . edge, 19 . . . edge, 20 . . . generating unit of magnetic field, 22 . . . second corner, 24 . . . first corner, 30 . . . magnetic element, 31 . . . power supply for measuring, 32 . . . ammeter, 33 . . . voltmeter, 34 . . . measuring unit, 40 . . . skyrmion, 52 . . . source for pulse currents, 60 . . . magnetic layer, 61 . . . insulator, 65 . . . magnet protective layer, 66 . . . magnet protective film, 67 . . . first via, 70 . . . first layer for wiring, 71 . . . first wiring, 72 . . . protective film for the first wiring 71, 73 . . . second via, 75 . . . second layer for wiring, 76 . . . second wiring, 77 . . . protective film for the second wiring 76, 80 . . .

substrate, 85 . . . resist, 90 . . . CMOS-FET, 91 . . . PMOS-FET, 92 . . . NMOS-FET, 95 . . . word line to write a skyrmion, 96 . . . bit line, 97 . . . word line to sense a skyrmion, 98 . . . detecting circuit, 100 . . . skyrmion memory, 110 . . . skyrmion memory device, 151 . . . non-magnetic thin film, 152 . . . magnetic metal, 153 . . . notch structure electrode, 155 . . . first electrode, 156 . . . second electrode, 157 . . . electrode, 181 . . . switch, 183 . . . switch, 184 . . . switch, 200 . . . skyrmion-memory embedded solid-state electronic device, 210 . . . solid-state electronic device, 300 . . . data processing apparatus, 310 . . . processor, 400 . . . data storage apparatus, 410 . . . input/output unit, 500 . . . communication apparatus, 510 . . . communication unit

What is claimed is:

1. A magnetic element capable of generating one skyrmion and erasing the one skyrmion, comprising:
   a magnet shaped like a substantially rectangular flat plate;
   an upstream electrode connected to the magnet in a width Wm direction of the magnet and made of a non-magnetic metal;
   a downstream electrode connected to the magnet in the width Wm direction to oppose the upstream electrode and made of a non-magnetic metal; and
   a skyrmion sensor configured to detect the skyrmion, wherein a width Wm of the substantially rectangular magnet is such that $3\cdot\lambda>Wm>\lambda$, where $\lambda$ denotes a diameter of the skyrmion, a length Hm of the substantially rectangular magnet is such that $2\cdot\lambda>Hm>\lambda$, and the magnet has a notch structure at an edge of the magnet between the upstream electrode and the downstream electrode.

2. The magnetic element as set forth in claim 1, wherein
   a first corner of the notch structure that opposes the upstream electrode has an interior angle of 180 degrees or larger, and
   the first corner is positioned closer to the downstream electrode with respect to a center of the magnet in the width Wm.

3. The magnetic element as set forth in claim 2, wherein
   a distance S1 between the first corner of the notch structure of the magnet and the upstream electrode is such that $2\cdot\lambda>S1\geq0.5\cdot\lambda$, where $\lambda$ denotes a diameter of the skyrmion to be generated in the magnet.

4. The magnetic element as set forth in claim 2, wherein, a width w of the notch structure of the magnet is such that $0.5\cdot\lambda>w>0.2\cdot\lambda$, where $\lambda$ denotes a diameter of the skyrmion to be generated in the magnet.

5. The magnetic element as set forth in claim 2, wherein
   a length h of a side of the notch structure of the magnet that opposes the upstream electrode is such that $0.8\cdot\lambda\geq h\geq0.2\cdot\lambda$, where $\lambda$ denotes a diameter of the skyrmion to be generated.

6. The magnetic element as set forth in claim 2, wherein
   a distance S2 between a second corner of the notch structure of the magnet that opposes the first corner and the downstream electrode is such that $0.5\cdot\lambda\geq S2$, where $\lambda$ denotes a diameter of the skyrmion to be generated.

7. The magnetic element as set forth in claim 1, wherein
   the magnet at least exhibits a skyrmion crystal phase in which the skyrmion appears and a ferromagnetic phase, according to a magnetic field applied thereto.

8. The magnetic element as set forth in claim 1, wherein the magnet is formed by one of a chiral magnet, a dipole magnet, a frustrated magnet and a layered structure made up by a magnetic material and a non-magnetic material.

9. The magnetic element as set forth in claim 1, wherein
   the skyrmion sensor includes, on one surface of the magnet, a layered structure of a nonmagnetic insulating thin film contacting a front surface of the magnet and a magnetic metal film provided on the nonmagnetic insulating thin film, and
   the layered structure has a resistance value that changes according to the generation and erasing of the skyrmion.

10. The magnetic element as set forth in claim 9, wherein
    the layered structure of the skyrmion sensor is positioned between the upstream electrode and the notch structure of the magnet.

11. A skyrmion memory comprising:
    the magnetic element as set forth in claim 1;
    a generating unit of magnetic field that is provided facing the one surface of the magnet and configured to apply a magnetic field to the magnet;
    a current path connected to the upstream electrode and the downstream electrode and configured to apply pulse currents to the magnet between the upstream electrode and the downstream electrode; and
    a measuring unit connected to the skyrmion sensor and configured to measure whether the skyrmion is generated or erased based on a result of the detection performed by the skyrmion sensor.

12. The skyrmion memory as set forth in claim 11, wherein
    the skyrmion is generated or erased by applying a pulse current to the magnet between the upstream electrode and the downstream electrode.

13. The skyrmion memory as set forth in claim 12, wherein
    a direction of the pulse current applied to the magnet to generate the skyrmion differs from a direction of the pulse current applied to the magnet to erase the skyrmion.

14. The skyrmion memory as set forth in claim 12, wherein
    the measuring unit measures whether the skyrmion is present or absent by measuring a change in a resistance value detected by the skyrmion sensor.

15. The skyrmion memory as set forth in claim 12, comprising a plurality of the magnetic elements stacked in a thickness direction.

16. A skyrmion memory device comprising:
    a plurality of the magnetic elements used in the skyrmion memory as set forth in claim 12;
    a plurality of electric lines to generate a skyrmion connected to the magnetic elements, each electric line to generate a skyrmion configured to supply a current to generate a skyrmion in a corresponding one of the magnetic elements;
    a plurality of electric lines to erase a skyrmion connected to the magnetic elements, each electric line to erase a skyrmion configured to supply a current to erase a skyrmion in a corresponding one of the magnetic elements;
    a plurality of word lines to sense a skyrmion connected to the magnetic elements, each word line to sense a skyrmion configured to transmit a voltage or current determined depending on whether a skyrmion is present or absent in a corresponding one of the magnetic elements;
    a plurality of switches provided in the electric lines to generate a skyrmion, the electric lines to erase a skyrmion and the word lines to sense a skyrmion, the switches configured to select one of the magnetic elements; and a detecting circuit configured to detect whether the skyrmion is present or absent in the magnetic element selected by the switches, based on a voltage or current flowing through a corresponding one of the word lines to sense a skyrmion.

17. The skyrmion memory device as set forth in claim 16, wherein each of the electric lines to generate a skyrmion is connected to the upstream electrode of a corresponding one of the magnetic elements, each of the electric lines to erase a skyrmion is connected to the downstream electrode of a corresponding one of the magnetic elements;

each of the word lines to sense a skyrmion is connected to the skyrmion sensor of a corresponding one of the magnetic elements;

when the skyrmion is generated or erased in a given one of the magnetic elements, the switches select a corresponding one of the electric lines to generate a skyrmion and a corresponding one of the electric lines to erase a skyrmion, and when presence or absence of the skyrmion is detected in a given one of the magnetic elements, the switches select a corresponding one of the lines to generate a skyrmion and a corresponding one of the word lines to sense a skyrmion.

18. A data storage apparatus comprising the skyrmion memory device as set forth in claim 16 embedded therein.

19. A data processing apparatus comprising the skyrmion memory device as set forth in claim 16 embedded therein.

20. A communication apparatus comprising the skyrmion memory device as set forth in claim 16 embedded therein.

* * * * *